(12) United States Patent
Kim et al.

(10) Patent No.: US 7,733,345 B2
(45) Date of Patent: Jun. 8, 2010

(54) METHOD AND APPARATUS FOR ENCODING AND DECODING POSITION INTERPOLATOR

(75) Inventors: Do-kyoon Kim, Kyungki-do (KR); Seok-yoon Jung, Seoul (KR); Euee-seon Jang, Seoul (KR); Sang-oak Woo, Kyungki-do (KR); Shin-jun Lee, Seoul (KR); Mahn-jin Han, Kyungki-do (KR); Gyeong-ja Jang, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1754 days.

(21) Appl. No.: 10/305,164

(22) Filed: Nov. 27, 2002

(65) Prior Publication Data

US 2003/0128215 A1 Jul. 10, 2003

Related U.S. Application Data

(60) Provisional application No. 60/333,130, filed on Nov. 27, 2001, provisional application No. 60/334,541, filed on Dec. 3, 2001, provisional application No. 60/342,101, filed on Dec. 26, 2001, provisional application No. 60/369,597, filed on Apr. 4, 2002.

(30) Foreign Application Priority Data

Nov. 14, 2002 (KR) .................. 10-2002-0070659

(51) Int. Cl.
*G06T 15/70* (2006.01)
*G06T 13/00* (2006.01)

(52) U.S. Cl. .................. 345/473; 345/474; 345/475

(58) Field of Classification Search ............... 345/473, 345/474, 475, 672, 950, 951, 673; 341/143; 375/244

See application file for complete search history.

(56) References Cited

U.S. PATENT DOCUMENTS 4,189,744 A * 2/1980 Stern ..................... 348/577

(Continued)

FOREIGN PATENT DOCUMENTS

JP 9182082 7/1997

(Continued)

OTHER PUBLICATIONS

Aaron E. Walsh, Mikael Bourges-Sevenier, "Core Web3D", Pub Sep. 14, 2000, eBook through Safari Tech Books Online, chapters 17-19, ISBN 0-13-085728-9.*

(Continued)

*Primary Examiner*—Daniel F Hajnik
(74) *Attorney, Agent, or Firm*—Staas & Halsey LLP

(57) ABSTRACT

A method and an apparatus for encoding and decoding a position interpolator including key data and key value data are provided. The method for encoding a position interpolator includes (b) generating key data and key value data to be encoded by extracting, from a first animation path constituted by the position interpolator, a minimum number of break points, which can bring about an error of no greater than a predetermined allowable error limit between the first animation path and a second animation to be generated by the extracted break points, (d) encoding the key data generated in step (b), and (e) encoding the key value data generated in step (b).

78 Claims, 70 Drawing Sheets

U.S. PATENT DOCUMENTS

| | | | |
|---|---|---|---|
| 4,685,115 A | | 8/1987 | Akagiri et al. |
| 4,734,768 A | | 3/1988 | Pexa |
| 5,757,668 A | * | 5/1998 | Zhu ..................... 375/240.16 |
| 5,818,463 A | * | 10/1998 | Tao et al. .................... 345/473 |
| 5,933,549 A | * | 8/1999 | Ide et al. ..................... 382/309 |
| 6,075,901 A | | 6/2000 | Signes et al. |
| 6,151,033 A | * | 11/2000 | Mihara et al. ............... 345/475 |
| 6,559,848 B2 | * | 5/2003 | O'Rourke .................. 345/473 |
| 2001/0012324 A1 | * | 8/2001 | Normile ............... 375/240.05 |
| 2001/0036230 A1 | * | 11/2001 | Sugiyama ............. 375/240.13 |
| 2002/0036639 A1 | * | 3/2002 | Bourges-Sevenier ........ 345/474 |
| 2002/0070939 A1 | * | 6/2002 | O'Rourke .................. 345/473 |
| 2003/0103572 A1 | | 6/2003 | Lee et al. |
| 2003/0103573 A1 | | 6/2003 | Woo et al. |
| 2003/0108107 A1 | | 6/2003 | Kim et al. |
| 2003/0128215 A1 | | 7/2003 | Kim et al. |
| 2003/0128884 A1 | | 7/2003 | Lee et al. |
| 2003/0147470 A1 | | 8/2003 | Lee et al. |

FOREIGN PATENT DOCUMENTS

| | | |
|---|---|---|
| JP | 9326990 | 12/1997 |
| KR | P2002-000-52205 | 8/2000 |
| KR | 1020020031029 A | 4/2002 |
| WO | WO 01/41156 A1 | 6/2001 |
| WO | WO01/41156 A1 | 6/2001 |

OTHER PUBLICATIONS

Ravi Ramamoorthi, Cindy Ball, Alan H. Barr- "Dynamic Splines with Constraints for Animation", Source Technical Report: 00000158, Pub: 1997, Published by California Institute of Technology, Pasadena, CA, USA.*

G. Bell, R. Carey, and C. Marrin: "The Virtual Reality Modeling Language (VRML) Specification", Pub Aug. 1996, Version 2.0, WD ISO/IEC 14772, section 4.9.3 Interpolators.*

James Steward, "Calculus Concepts and Contexts", Brooks/Cole Publishing 1998, pp. 416 and 417.*

Ahn, Jeong-Hwan et al., "Motion-compensated compression of 3D animation models", Electronic Letters, Nov. 22, 2001, pp. 1445-1446, vol. 37, No. 24, IEE Stevenage, GB.

Han, Mahnjin et al., "Interpolator Compression Core Experiments Description", ISO/IEC JTC 1/SC 29/WG 11 N4364, Jul. 2001, Sydney.

Jang, Euee S., "3D Animation Coding: its History and Framework", Multimedia and Expo, 2000, ICME 2000, 2000 IEEE Int'l. Conference in NY, Jul. 30, 2000, pp. 1119-1122, vol. 2, Piscataway, NJ, USA.

"Information technology—Coding of audio-visual objects—Part 1: Systems," ISO/IEC 14496-1, 1999, pp. 137 & 245.

Kim, James D.K. et al., "Animation Data Compression in MPEG-4: Interpolators," Proceedings 2002 Int'l. Conference on Image Processing, IEEE, US, Sep. 2002, pp. 33-36, vol. 2, New York, NY.

"Call for Proposals for Interpolator Compression," MPEG, ISO/IEC JTC1/SC29/WG11 N4098, Mar. 2001, Singapore.

Signes, Julien, "Binary Format for Scene (BIFS): Combining MPEG-4 media to build rich multimedia services," Proceedings of the SPIE, Jan. 25, 1999, pp. 1506-1517, vol. 3653, Bellingham, VA, USA.

Varakliotis, Socrates et al., "Coding of Animated 3-D Wireframe Models for Internet Streaming Applications," 2001 IEEE Int'l. Conf. on Multimedia and Expo, Aug. 2001, pp. 353-356, Piscataway, NJ, USA.

Yang et al., "Compression of 3-D Triangle Mesh Sequences Based on Vertex-Wise Motion vector Prediction," IEEE Transactions on Circuits and Systems for Video Technology, Dec. 2002, vol. 12, No. 12, pp. 1178-1184, New York.

Lu, Chang H. et al., "A DPCM System With Modulo Limiters," Communications for he Information Age, Proceedings of the Global Telecommunications Conference and Exhibition (Globecom), IEEE, Nov. 28, 1988, pp. 581-585, vol. 1, New York.

Prabhu, K.A., "A Predictor Switching Scheme for DPCM Coding of Video Signals," IEEE Transactions on Communications, Apr. 1985, pp. 373-379, vol. Com-33, No. 4, New York, US.

Han et al., "InterpolatorCompression Core Experiments Description", International Organisation for Standardisation, Organisation Internationale de Normalisation ISO/IEC JTC29/WG11, Coding of Moving Pictures and Audio, 6 pages, Jul. 2001, Sydney, Australia.

Jang, Euee S, "3D Animation Coding: its History and Framework," Multimedia and Expo, 2000, ICME 2000, 2000 IEEE Int'l. Conference on NY, Jul. 30, 2000, pp. 1119-1122, vol. 2, Piscataway, NJ, USA.

"Information technology—coding of audio-visual objects—Part 1: Systems," ISO/IEC 14496-1, 1999, pp. 137 & 245.

Kim, James D.K. et al., "Animation Data Compression in MPEG-4:Interpolators," Proceedings 2002 Int'l. Conference on Image Processing, IEEE, US, Sep. 2002, pp. 33-36, vol. 2, New York, NY.

European Search Report.

* cited by examiner

FOLD

DIVIDE

DIVIDE-UP

DIVIDE-DOWN

SHIFT-UP

FINAL

The Output of Quantizer $(2^{nQBits-1}-1)$ $-(2^{nQBits-1}-1)$

The Result of DPCM $(2^{nQBits}-2)$ $-(2^{nQBits}-2)$

FIG. 28A

```
class CompressedPositionInterpolator {
    KeyHeader klHeader;
    PosIKeyValueHeader posIKVHeader;
    qf_start();
    aligned(8) KeySelectionFlag ksFlag(kHeader,
posIKVHeader.bPreserveKey);
    Key k(klHeader);
    PosIKeyValue posIKV(posIKVHeader, ksFlags.nNumberOfKeyValue);
}
```

FIG. 28B

```
class KeyHeader {
    int i;
    unsigned int(5) nKeyQBit;
    unsigned int(5) nNumKeyCodingBit;
    unsigned int(nNumKeyCodingBit) nNumberOfKey;
    unsigned int(4) nKeyDigit;
    bit(1) bIsLinearKeySubRegion;
    if(bIsLinearKeySubRegion == 1)
            LinearKey lKey(nKeyDigit);
    bit(1) bRangeFlag;
    if(bRangeFlag == 1)
            KeyMinMax keyMinMax(nKeyDigit);
    unsigned int(5) nBitSize;
    unsigned int(2) nKDPCMOrder;
    for(i = 0; i < nKDPCMOrder + 1; i++) {
            bit(1) nQIntraKeySign[[i]];
            if(i == 0 && nQIntraKeySign[i] == 1)
                    continue;
            unsigned int(nBitSize) nQIntraKey[[i]];
    }
    bit(1) bShiftFlag;
    if(bShiftFlag == 1) {
            bit(1) nKeyShiftSign;
            unsigned int(nBitSize) nKeyShift;
    }
    unsigned int(3) nDNDOrder;
    if(nDNDOrder == 7) {
            bit(1) bNoDND;
            if(bNoDND == 1)
                    nDNDOrder = -1;
    }
    int nMaxQBit = nBitSize;
    for(i = 0; i < nDNDOrder; i++) {
            bit(1) nKeyMaxSign[[i]];
            unsigned int(nMaxQBit) nKeyMax[[i]];
            nMaxQBit = (int)(log10(abs(nKeyMax[i]))/log10(2))+1;
            if(nMaxQBit+1 < nBitSize)
                    nMaxQBit += 1;
            else
                    nMaxQBit = nBitSize;
    }
    int bSignedAACFlag;
    int nKeyCodingBitQBit = (int)(log10(nKeyQBit))/log10(2))+1;
    unsigned int(nKeyCodingBitQBit) nKeyCodingBit;
    if(nDNDOrder != -1 && nDNDOrder != 0) {
            bit(1) bKeyInvertDownFlag;
            if(bKeyInvertDownFlag == 1) {
                    unsigned int(nKeyCodingBit) nKeyInvertDown;
                    bSignedAACFlag = 0;
            } else {
                    bSignedAACFlag = 1;
            }
    } else {
            bSignedAACFlag = 0;
    }
}
```

FIG. 28C

```
class LinearKey (int nKeyDigit) {
    unsigned int(5) nNumLinearKeyCodingBit;
    unsigned int(nNumLinearKeyCodingBit) nNumberOfLinearKey    ;
    KeyMinMax kMinMax(nKeyDigit);
}
```

FIG. 28D

```
class KeyMinMax (int nKeyDigit) {
        bit(1) bMinKeyDigitSame;
        if((bMinKeyDigitSame == 0)
                unsigned int(4) nMinKeyDigit;
        else
                nMinKeyDigit = nKeyDigit;
        if(nMinKeyDigit != 0) {
                if(nMinKeyDigit < 8) {
                        int count = (int)(log10(10^nMinKeyDigit-1)/log10(2)) + 1;
                        bit(1) nMinKeyMantissaSign;
                        unsigned int(count) nMinKeyMantissa;
                        bit(1) nMinKeyExponentSign;
                        unsigned int(6) nMinKeyExponent,
                } else
                        float(32) fKeyMin;
        }
        bit(1) bMaxKeyDigitSame;
        if(bMaxKeyDigitSame == 0)
                unsigned int(4) nMaxKeyDigit;
        else
                nMaxKeyDigit = nKeyDigit;
        if(nMaxKeyDigit != 0) {
                if(nMaxKeyDigit < 8) {
                        int count = (int)(log10(10^nMaxKeyDigit)-1)/log10(2)) + 1;
                        bit(1) nMaxKeyMantissaSign;
                        unsigned int(count) nMaxKeyMantissa;
                        bit(1) bSameExponent;
                        if(bSameExponent == 0) {
                                bit(1) nMaxKeyExponentSign;
                                unsigned int(6) nMaxKeyExponent;
                        }
                        else
                                nMaxKeyExponent = nMinKeyExponent;
                } else
                        float(32) fKeyMax;
        }
}
```

FIG. 28E

```
class PosIKeyValueHeader() {
        bit(1) bPreserveKey;
        unsigned int(5) nKVQBit;
        bit(1) x_keyvalue_flag,
        bit(1) y_keyvalue_flag,
        bit(1) z_keyvalue_flag,
        unsigned int(4) nKVDigit,
        int nBits = (int)(log10(nKVQBit)/log10(2)) + 1;
if(x_keyvalue_flag == 1) {
                bit(1) nKVDPCMOrder_X,
                bit(1) bIsUnaryAAC_X,
                if(bIsUnaryAAC_X != 1) {
                        unsigned int(nBits) nKVCodingBit_X,
                        unsigned int(1) nStartIndex_X;
                }
        }
        if(y_keyvalue_flag == 1) {
                bit(1) nKVDPCMOrder_Y;
                bit(1) bIsUnaryAAC_Y,
                if(bIsUnaryAAC_Y != 1) {
                        unsigned int(nBits) nKVCodingBit_Y;
                        unsigned int(1) nStartIndex_Y,
                }
        }
        if(z_keyvalue_flag == 1) {
                bit(1) nKVDPCMOrder_Z,
                bit(1) bIsUnaryAAC_Z,
                if(bIsUnaryAAC_Z != 1) {
                        unsigned int(nBits) nKVCodingBit_Z,
                        unsigned int(1) nStartIndex_Z;
                }
        }
        if((nStartIndex_X == 1) && (x_keyvalue_flag == 1))
                        unsigned int(nKVQBit) firstKV_X;
        if((nStartIndex_Y == 1) && (y_keyvalue_flag == 1))
                        unsigned int(nKVQBit) firstKV_Y;
        if((nStartIndex_X == 1) && (z_keyvalue_flag == 1))
                        unsigned int(nKVQBit) firstKV_Z;
        KeyValueMinMax kvMinMax(nKVDigit);
```

FIG. 28F

```
class KeyValueMinMax(int nKeyValueDigit) {
        bit(1) bUse32Float;
        if(bUse32Float == 0) {
                bit(2) nWhichAxis;
                bit(1) bAllSameMantissaDigitFlag;
                if(bAllSameMantissaDigitFlag == 0) {
                        unsigned int(4) nMantissaDigit_X;
                        unsigned int(4) nMantissaDigit_Y;
                        unsigned int(4) nMantissaDigit_Z;
                } else {
                        bit(1) bSameKVDigitFlag;
                        if(bSameKVDigitFlag == 0)
                                unsigned int(4) nMantissaDigit_X;
                        else
                                nMantissaDigit_X = nKeyValueDigit;
                        nMantissaDigit_Y = nMantissaDigit_X;
                        nMantissaDigit_Z = nMantissaDigit_X;
                }
                bit(1) bMaxDigitFlag;
                if(bMaxDigitFlag == 1)
                        unsigned int(4) nMantissaDigit_M;
                else {
                        switch(nWhichAxis){
                        case 0:
                                nMantissaDigit_M = nMantissaDigit_X;
                                break;
                        case 1:
                                nMantissaDigit_M = nMantissaDigit_Y;
                                break;
                        case 2:
                                nMantissaDigit_M = nMantissaDigit_Z;
                                break;
                        }
                }
                unsigned int(6) nExponentBits;
                nExponentBits = (int)(log10(nExponentBits)/log10(2)) + 1;
                bit(1) bAllSameExponentSign;
                if(bAllSameExponentSign == 1)
                        bit(1) nExponentSign;
                FloatingPointNumber fpnMin_X(nMantissaDigit_X, nExponentBits,
bAllSameExponentSign, nExponentSign);
                FloatingPointNumber fpnMin_Y(nMantissaDigit_Y, nExponentBits,
bAllSameExponentSign, nExponentSign);
                FloatingPointNumber fpnMin_Z(nMantissaDigit_Z, nExponentBits,
bAllSameExponentSign, nExponentSign);
                FloatingPointNumber fpnMax(nMantissaDigit_M, nExponentBits,
bAllSameExponentSign, nExponentSign);
        } else {
                float(32) fMin_X;
                float(32) fMin_Y;
                float(32) fMin_Z;
                float(32) fMax;
        }
}
```

FIG. 28G

```
class FloatingPointNumber(unsigned int nDigit, unsigned int nExponentBits,
unsigned int bAllSameExponentSign, int nSameExponentSign) {
    if(nDigit != 0) {
        bit(1) nSign;
        int nBits = (int)(log10(10^nDigit - 1)/log10(2)) + 1;
        unsigned int(nBits) nMantissa;
        unsigned int(nExpoentBits) nExponent;
        if(bAllSameExponentSign == 0)
            bit(1) nExponentSign;
        else
            nExponentSign = nSameExponentSign;
    }
}
```

FIG. 28H

```
class KeySelectionFlag(KeyHeader kHeader, int bPreserveKey) {
    int i;
    int nNumOfKeyValue = 0;
    if(bPreserveKey == 1) {
        for(i=0; i<kHeader.nNumberOfKey; i++) {
            qf_decode(&keyFlag[i], keyFlagContext);
            if(keyFlag[i] == 1)
                nNumOfKeyValue++;
        }
    } else
        nNumOfKeyValue = kHeader.nNumberOfKey;
}
```

FIG. 28I

```
class Key (KeyHeader kHeader) {
   int nQKey[kHeader.nNumberOfKey];
   int i;
   int nNumberOfRemainingKey;
   if(kHeader.bIsLinearKeySubRegion == 1)
      nNumberOfRemainingKey = kHeader.nNumberOfKey
kHeader.lKey.nNumberOfLinearKey;
   else
      nNumberOfRemainingKey = kHeader.nNumberOfKey;
   for(i = kHeader.nKDPCMOrder+1; i < nNumberOfRemainingKey; i++) {
      if(kHeader.bSignedAACFlag == 0)
         decodeUnsignedAAC(nQKey[i], kHeader.nKeyCodingBit, keyContext);
      else
         decodeSignedAAC(nQKey[i], kHeader.nKeyCodingBit+1,
keySignContext, keyContext);
   }
}
```

FIG. 28J

```
class PosIKeyValue (PosIKeyValueHeader kVHeader, int nNumberOfKeyValue) {
        if(kVHeader.x_keyvalue_flag == 1) {
                if(kVHeader.bIsUnaryAAC_X == 1)
                        for(i=kVHeader.nStartIndex_X; i<nNumberOfKeyValue; i++)
                                decodeUnaryAAC(&keyValue_X[i], kVXSignContext,
kVXUContext),
                else
                        decodeSQAAC(keyValue_X, kVHeader.nKVCodingBit_X,
kVXSignContext, kVXMaxValueContext, kVXFoundContext, kVXNotFoundContext,
nNumberOfKeyValue, kVHeader.nStartIndex_X);
        }
        if(kVHeader.y_keyvalue_flag == 1) {
                if(kVHeader.bIsUnaryAAC_Y == 1) {
                        for(i= kVHeader.nStartIndex_Y; i<nNumberOfKeyValue; i++)
                                decodeUnaryAAC(&keyValue_Y[i], kVYSignContext,
kVYUContext);
                else
                        decodeSQAAC(keyValue_Y, kVHeader.nKVCodingBit_Y,
kVYSignContext, kVYMaxValueContext, kVYFoundContext, kVYNotFoundContext,
nNumberOfKeyValue, kVHeader.nStartIndex_Y);
        }
        if(kVHeader.z_keyvalue_flag == 1) {
                if(kVHeader.bIsUnaryAAC_Z == 1)
                        for(i= kVHeader.nStartIndex_Z; i<nNumberOfKeyValue; i++)
                                decodeUnaryAAC(&keyValue_Z[i], kVZSignContext,
kVZUContext);
                else
                        decodeSQAAC(keyValue_Z, kVHeader.nKVCodingBit_Z,
kVZSignContext, kVZMaxValueContext, kVZFoundContext, kVZNotFoundContext,
nNumberOfKeyValue, kVHeader.nStartIndex_Z);
        }
}
```

METHOD AND APPARATUS FOR ENCODING AND DECODING POSITION INTERPOLATOR

This application claims the priority of Korean Patent Application No. 2002-70659, filed Nov. 14, 2002, in the Korean Intellectual Property Office. This application also claims the benefit of U.S. Provisional Application No. 60/333,130, filed Nov. 27, 2001; U.S. Provisional Application No. 60/334,541, filed Dec. 3, 2001; U.S. Provisional Application No. 60/342,101, filed Dec. 26, 2001; and U.S. Provisional Application No. 60/369,597, filed Apr. 4, 2002. The entire contents of these applications are incorporated herein by reference.

BACKGROUND OF THE INVENTION

1. Field of the Invention

The present embodiment relates to a method for encoding and decoding three-dimensional animation data, and more particularly, to a method and an apparatus for encoding and decoding a position interpolator representing the location of an object in an animation path.

2. Description of the Related Art

Three-dimensional (3D) animation techniques have been widely adopted in 3D computer games or virtual reality computer applications. Virtual reality modeling language (VRML) is a representative example of such 3D animation techniques.

International multimedia standards, such as MPEG-4 binary format for scene (BIFS) and virtual reality modeling language (VRML), support a keyframe-based 3D animation using an interpolator node. In MPEG-4 BIFS and VRML, there are various kinds of interpolators including a scalar interpolator, a position interpolator, a coordinate interpolator, an orientation interpolator, a normal line interpolator, and a color interpolator, and these interpolators and their functions and characteristics are shown in Table 1.

TABLE 1

| Interpolator | Characteristics | Function |
| --- | --- | --- |
| Scalar interpolator | Linear interpolation of scalar variations | Capable of representing area, diameter, and intensity |
| Position interpolator | Linear interpolation on 3D coordinates | Parallel movement in 3D space |
| Orientation interpolator | Linear interpolation of 3D coordinate axis and amount of rotation | Rotation in 3D space |
| Coordinate interpolator | Linear interpolation of variations in 3D coordinates | 3D morphing |
| Normal interpolator | Linear interpolation of 3D coordinates of normal | Capable of representing variations in 3D vector of normal |
| Color interpolator | Linear interpolation of color information | Capable of representing variations in color |

Among the interpolators shown in Table 1, the position interpolator is used to represent information on the location of an animation path and consists of keys and key value fields. Key fields represent the position of each keyframe on a temporal axis using discontinuous numbers in a range between $-\infty$ and $\infty$. Each of the Key value fields specifies information on the position of an object at a certain moment represented by each of the keys and consists of three components x, y, and z. Each of the key value fields includes as many key values as each of the key fields has.

Examples of the position interpolator are shown in FIGS. 1A and 1B. Specifically, FIG. 1 is a diagram illustrating key data, and FIG. 1B is a diagram illustrating key value data. MPEG-4 BIFS provides a method for encoding and decoding interpolator node, which is called predictive MF coding (PMFC).

FIG. 2 is a block diagram of a conventional PMFC encoder and a conventional PMFC decoder. In PMFC, key data and key value data of a position interpolator are encoded using a quantizer, a differential pulse code modulation (DPCM) operator, and an entropy encoder, as shown in FIG. 2. Referring to FIG. 2, the quantizer and the DPCM operator removes redundancy in the key data and the key value data, and the DPCM operator outputs the results of its operation to the entropy encoder. However, PMFC is not sufficiently effective in encoding key data and key value data because it entropy-encodes only differential data obtained from a general DPCM operation. In addition, due to the limitations the entropy-encoder has, it is almost impossible to provide high-quality animation.

SUMMARY OF THE INVENTION

To solve the above as well as other problems, it is an aspect of the present embodiment to provide a method and an apparatus for encoding and decoding a position interpolator, which are capable of providing high-quality animation with a high compression rate.

It is another aspect of the present embodiment to provide a method of measuring an error between an original position interpolator and a decoded position interpolator and a method of extracting break points of an input position interpolator using the method of measuring an error between an original position interpolator and a decoded position interpolator.

Accordingly, to achieve the above as well as other aspects of the present embodiment, there is provided an apparatus for encoding a position interpolator, which includes key data indicating the locations of keyframes on a temporal axis and key value data indicating the location of an object. The apparatus includes an break point extractor which extracts, from a first animation path constituted by a position interpolator input thereinto, a minimum number of break points, which can bring about an error of no greater than a predetermined allowable error limit between the first animation path and a second animation to be generated by the extracted break points, a key data encoder which encodes key data input from the break point extractor, and a key value data encoder which encodes key value data input from the break point extractor.

To achieve the above as well as other aspects of the present embodiment, there is provided an apparatus for encoding a position interpolator, which includes key data indicating the locations of keyframes on a temporal axis and key value data indicating the location of an object. The apparatus includes a resampler which samples an animation path constituted by key data and key value data into a predetermined number of sections having an interval of a predetermined amount of time and outputs a position interpolator including resampled key data and resampled key value data, a key data encoder which encodes key data input from the resampler, and a key value data encoder which encodes key value data input from the resampler.

To achieve the above as well as other aspects of the present embodiment, there is provided an apparatus for decoding a bitstream, into which a position interpolator, including key data indicating the locations of keyframes on a temporal axis and key value data indicating the location of an object, is encoded. The apparatus includes a key data decoder which decodes key data from an input bitstream, a key value data decoder which decodes key value data from the input bitstream, and a position interpolator synthesizer which generates a position interpolator by synthesizing decoded key value data and key value data linearly interpolated using the decoded key value data.

To achieve the above as well as other aspects of the present embodiment, there is provided a method for encoding a position interpolator, which includes key data indicating the locations of keyframes on a temporal axis and key value data indicating the location of an object. The method includes (b) generating key data and key value data to be encoded by extracting, from a first animation path constituted by the position interpolator, a minimum number of break points, which can bring about an error of no greater than a predetermined allowable error limit between the first animation path and a second animation to be generated by the extracted break points, (d) encoding the key data generated in step (b), and (e) encoding the key value data generated in step (b).

To achieve the above as well as other aspects of the present embodiment, there is provided a method for encoding a position interpolator, which includes key data indicating the locations of keyframes on a temporal axis and key value data indicating the location of an object. The method includes (b) sampling an animation path constituted by the position interpolator into a predetermined number of sections having an interval of a predetermined amount of time and thus generating a position interpolator including resampled key data and resampled key value data, (d) encoding the key data generated in step (b), and (e) encoding the key value data generated in step (b).

To achieve the above as well as other aspects of the present embodiment, there is provided a method for decoding a bitstream, into which a position interpolator, including key data indicating the locations of keyframes on a temporal axis and key value data indicating the location of an object, is encoded. The method includes (a) decoding key data from an input bitstream, (b) decoding key value data from the input bitstream, and (c) generating a position interpolator by synthesizing decoded key value data and key value data linearly interpolated using the decoded key value data with decoded key data.

To achieve the above as well as other aspects of the present embodiment, there is provided a method of calculating an error between a first path constituted by a plurality of first path points each consisting of a plurality of data components and a second path constituted by a plurality of second path points each consisting of a plurality of data components. The method includes (a) interpolating path points into the first and second animation paths so that the first and second animation paths have the same path points in terms of reference data component included in each of the path points, (b) dividing each of the first and second animation paths into a predetermined number of sections in consideration of the reference data component so that the predetermined number of sections respectively correspond to the path points, (c) calculating an error between the first and second animation paths in each of the sections, and (d) checking if step (c) has been performed on all the predetermined number of sections and then normalizing the errors obtained in step (c).

To achieve the above as well as other aspects of the present embodiment, there is provided a method of extracting break points from a path constituted by path points including a plurality of component data by using linear approximation. The method includes (a) extracting a beginning point and an ending point of an original path, (b) selecting one out of non-extracted path points and linearly interpolating the other non-selected path points using the selected path points, (c) calculating an error between the original path and an interpolated animation path generated using the interpolated path points, (d) performing steps (b) and (c) on all the non-selected path points and extracting a path point leading to a minimum error between the original animation path and the interpolated path, and (e) comparing an error between the original path and a path generated using all the extracted path points including the path points extracted in step (d) with a predetermined allowable error limit, check if the calculated error is smaller than the allowable error limit then the process of extracting break point is completed, if not repeatedly performing steps (b) through (d).

BRIEF DESCRIPTION OF THE DRAWINGS

The above as well as other aspects and advantages of the present embodiment will become more apparent by describing in detail preferred embodiments thereof with reference to the attached drawings in which:

Hereinafter, FIGS. 28A through 28J are diagrams illustrating examples of SDL program codes by which an apparatus for decoding a position interpolator according to a preferred embodiment of the present embodiment is realized.

DETAILED DESCRIPTION OF THE INVENTION

Hereinafter, the present embodiment will be described more fully with reference to the accompanying drawings, in which preferred embodiments of the invention are shown.

Figure 1A:
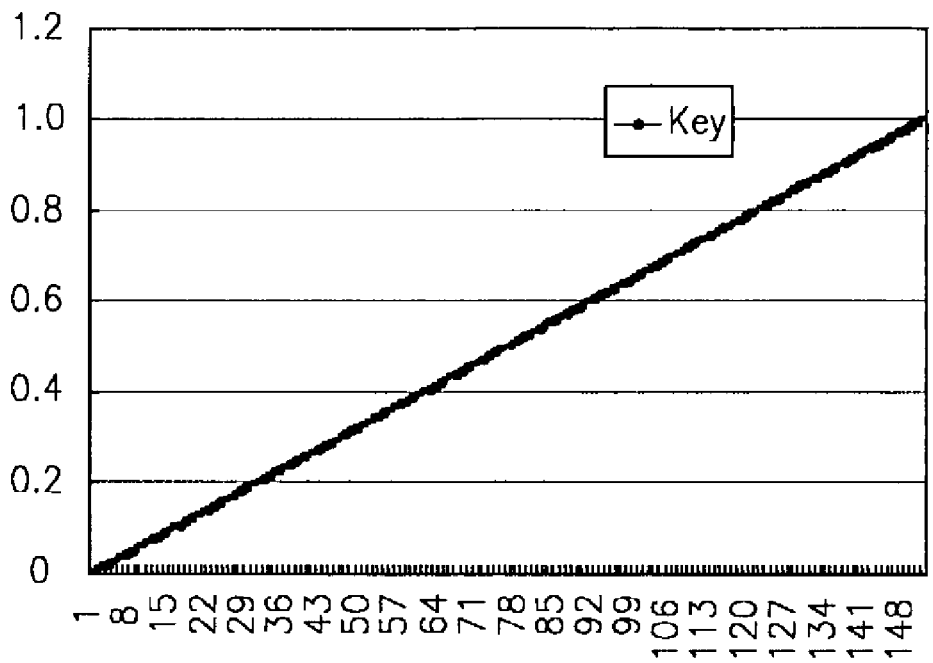
FIG. 1A is a diagram illustrating key data of a position interpolator.
Figure 1B:
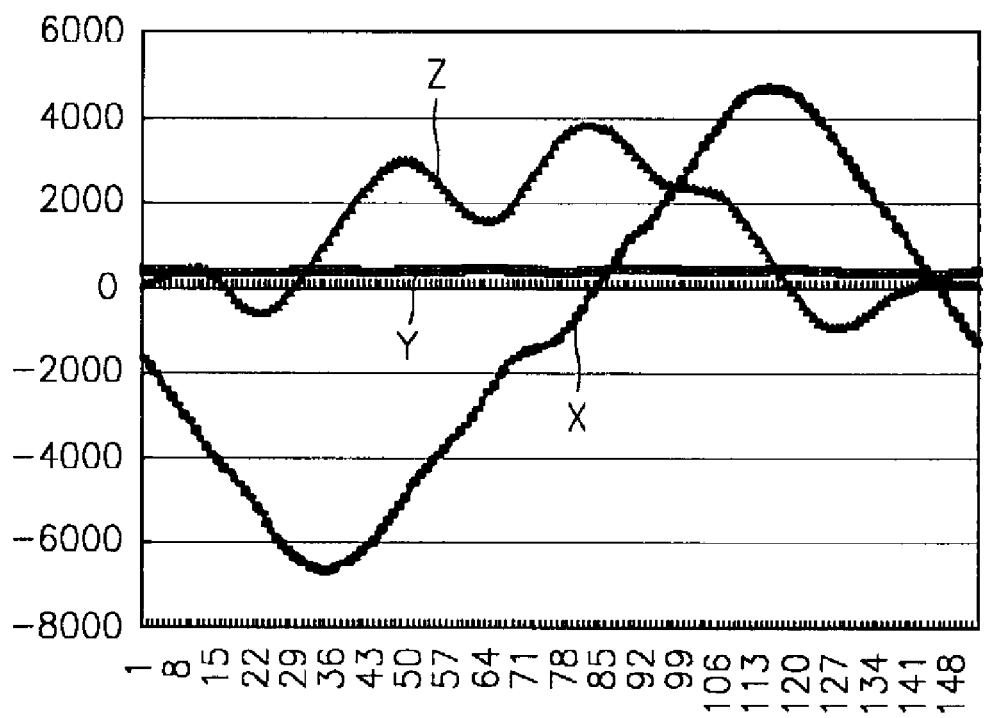
FIG. 1B is a diagram illustrating key value data of x, y, and z components of a position interpolator.
Figure 2:
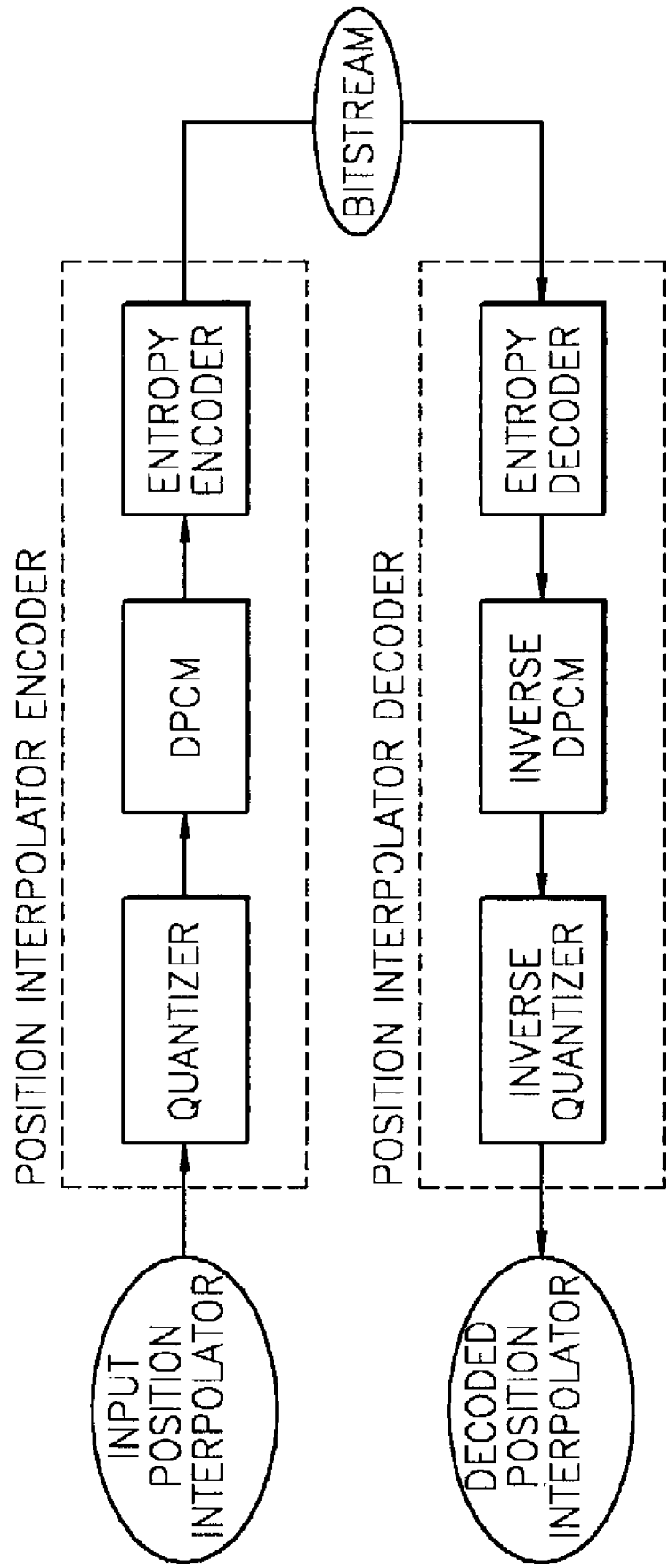
FIG. 2 is a block diagram of a MPEG-4 BIFS PMFC encoder and a MPEG-4 BIFS PMFC decoder.
Figure 3A:
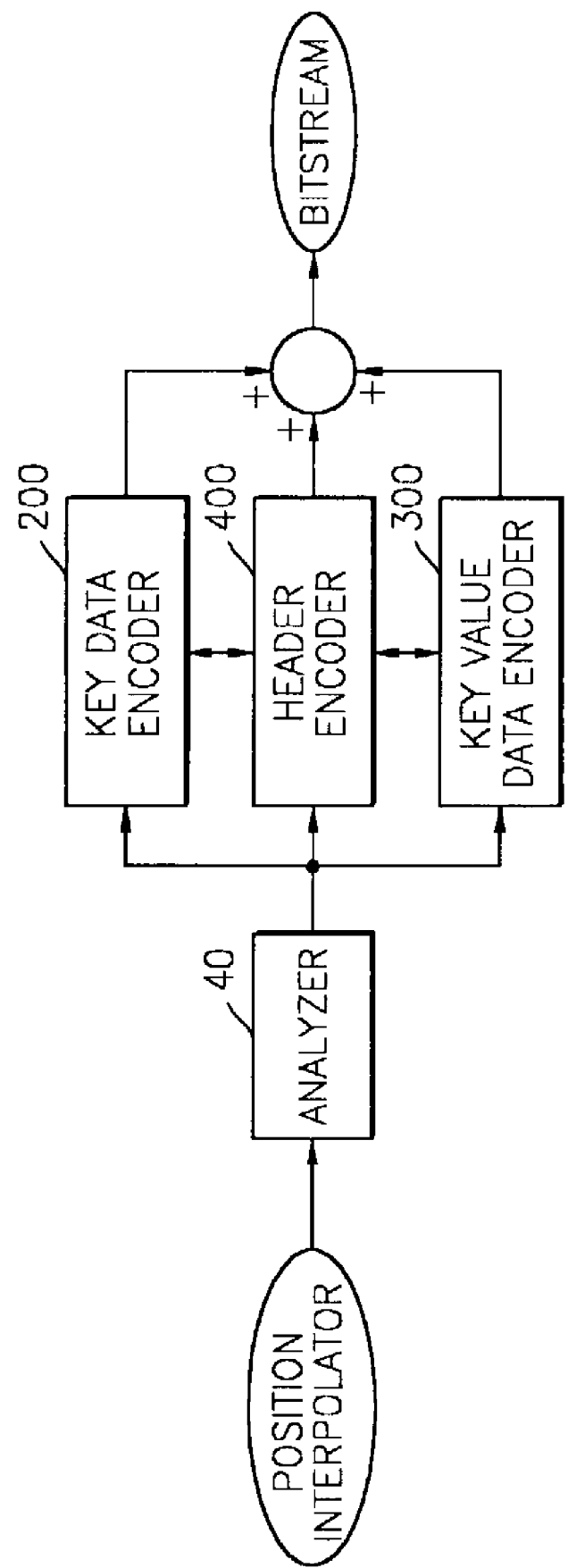
FIG. 3A is a block diagram of an apparatus for encoding a position interpolator according to a preferred embodiment of the present embodiment.

FIG. 3A is a block diagram of an apparatus for encoding a position interpolator according to a preferred embodiment of the present embodiment. Referring to FIG. 3A, the apparatus for encoding a position interpolator includes an analyzer 40, a key data encoder 200, a key value data encoder 300, and a header encoder 400.

Figure 3B:
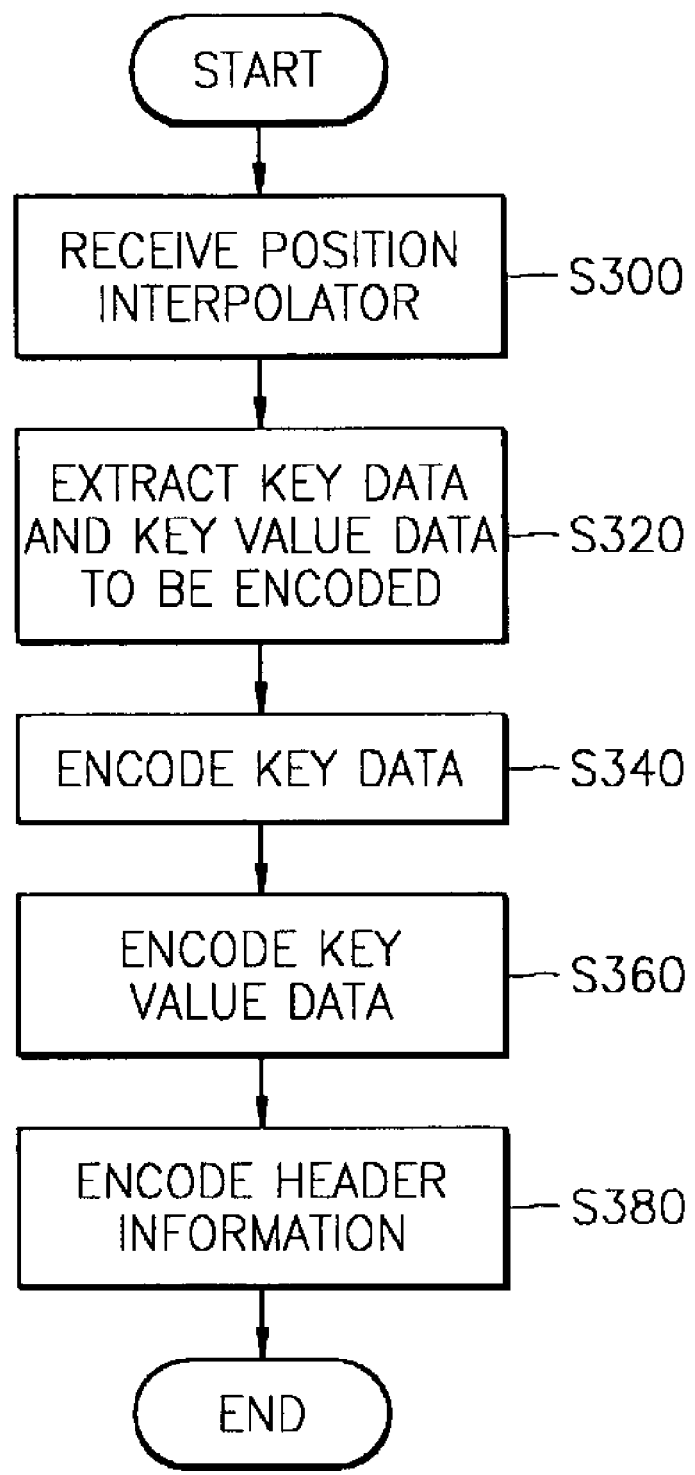
FIG. 3B is a flowchart of a method for encoding a position interpolator according to a preferred embodiment of the present embodiment.

FIG. 3B is a flowchart of a method for encoding a position interpolator according to a preferred embodiment of the present embodiment. Referring to FIG. 3B, a position interpolator to be encoded is input into the analyzer 40 in step S300. In step S320, the analyzer 40 extracts key data and key value data to be encoded from a first animation path comprised of key value data of x, y, and z components of the position interpolator, outputs the extracted key data to the key data encoder 200, and outputs the extracted key value data to the key value data encoder 300.

The key data encoder 200 quantizes the key data input from the analyzer 40 using a predetermined number of quantization bits, generates differential data by performing a predetermined DPCM operation on the quantized key data, and entropy-encodes the differential data in step S340.

The key value data encoder 300 quantizes the key value data input from the analyzer 40 using a predetermined number of quantization bits, generates differential data by performing a predetermined DPCM operation on the quantized data, and encodes the differential data in step S360.

The header encoder 400 receives information necessary to decode the key data and key value data from the key data encoder 200 and the key value data encoder 300 and encodes the information in step S380.

Hereinafter, the structures and operations of the analyzer 40, the key data encoder 200, and the key value data encoder 300 will be described in greater detail with the accompanying drawings.

Figure 4A:
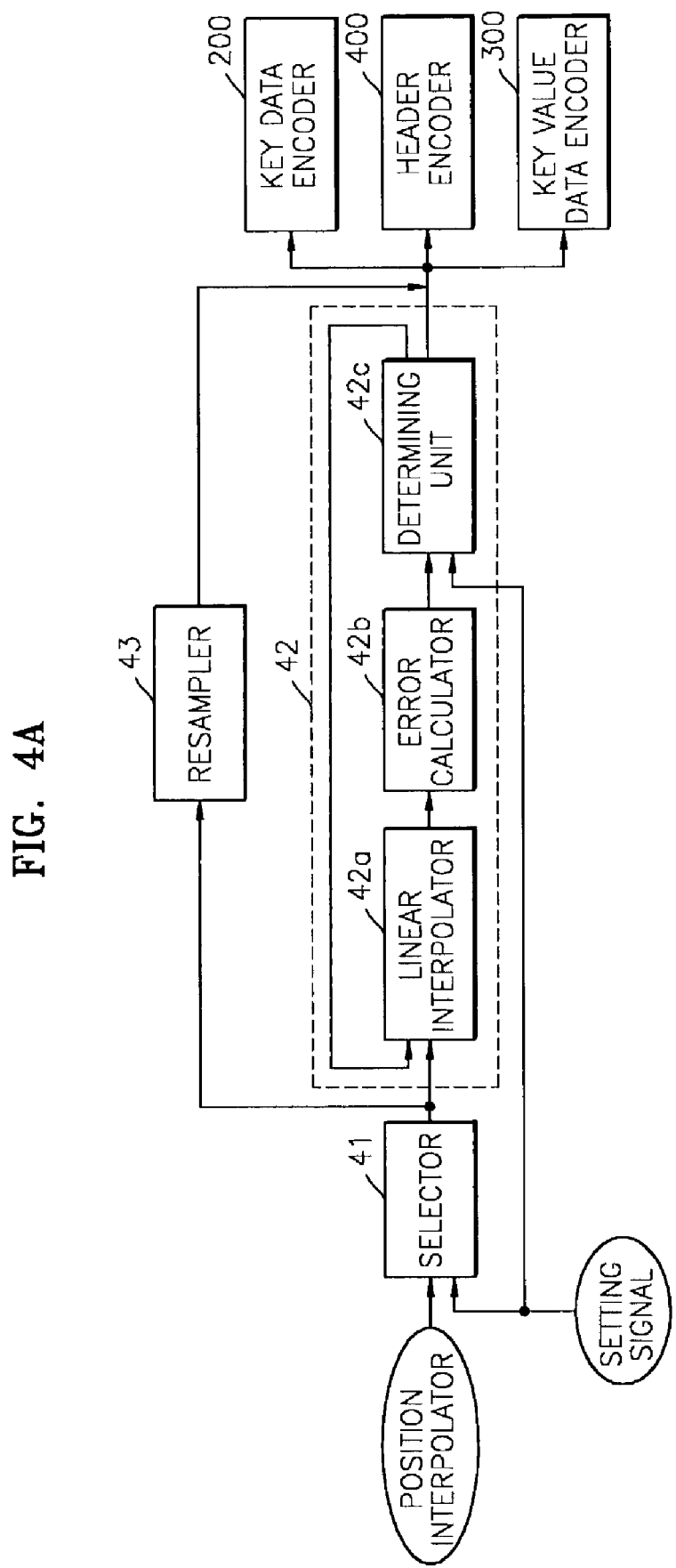
FIGS. 4A through 4C are block diagrams of examples of an analyzer according to preferred embodiments of the present embodiment.

FIG. 4A is a block diagram of an example of the analyzer 40 according to a first embodiment of the present embodiment. Even though a process of extracting key data and key value data to be encoded using the analyzer 40 can be performed on all the components (x, y, and z) of key value data, this process will be described in the following paragraphs, taking only one of the components of the key value data into consideration for the convenience of explanation.

Referring to FIG. 4A, the analyzer according to the first embodiment of the present embodiment includes a resampler 43, which samples a first animation path based on an input position interpolator into a predetermined number of sections having intervals of a predetermined amount of time with one another and outputs the sampled first animation path to a key encoder 200, a key value encoder 300, and a header encoder 400, a break point extractor 42, which extracts a minimum number of break points by which an error between the first animation path and a second animation path generated based on break points extracted from the first animation path can be prevented from exceeding a predetermined allowable error limit and outputs the extracted break points to the key data encoder 200, the key value data encoder 300, and the header encoder 400, and a selector 41, which outputs the input position interpolator to the resampler 43 or the break point extractor 42 in responses to an external input signal. The break point extractor 42 includes a linear interpolator 42a, an error calculator 42b, and a determining unit 42c.

Figure 5A:
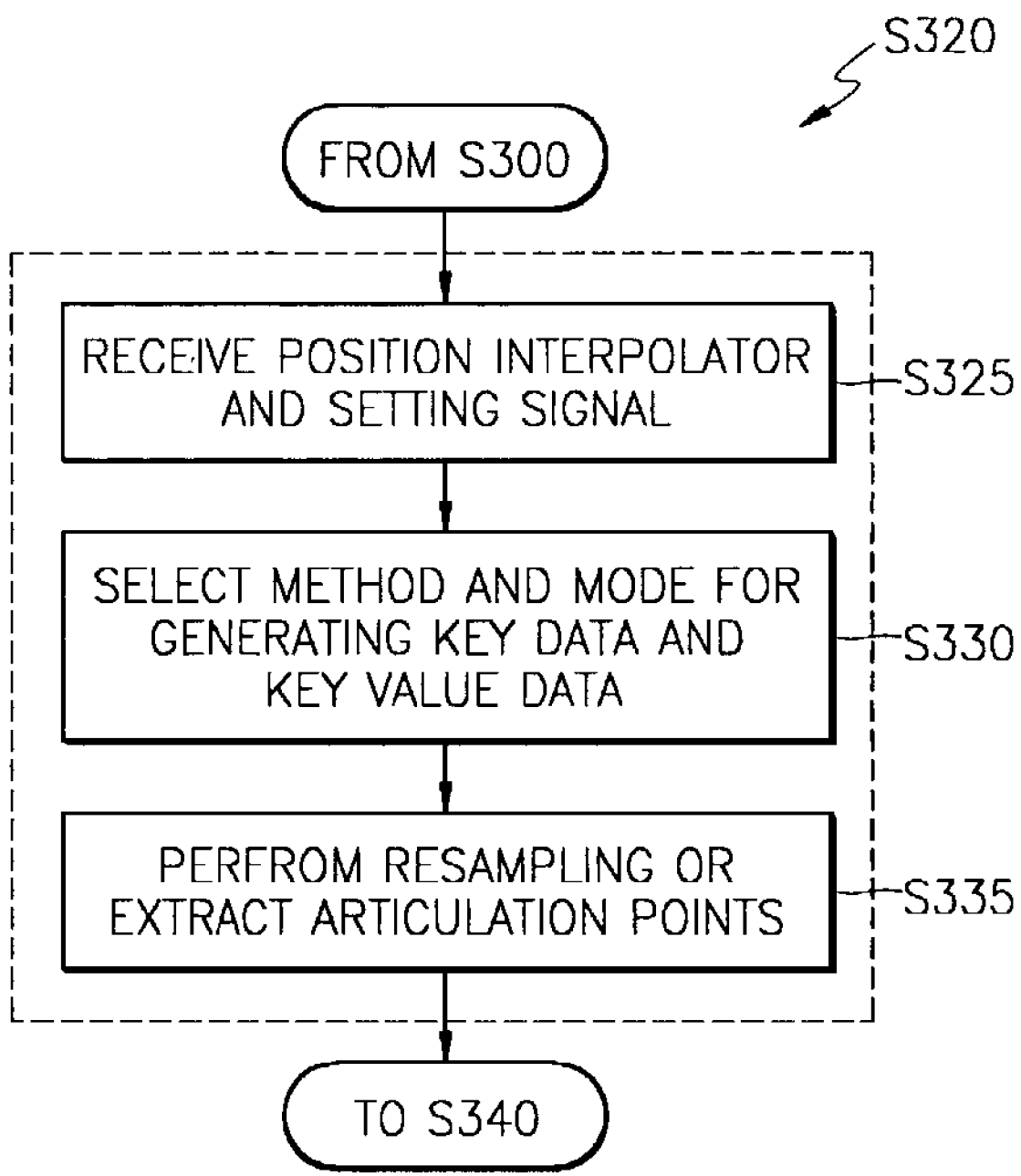
FIG. 5A is a detailed flowchart of step S320 shown in FIG. 3B.

FIG. 5A is a flowchart of the operation of the analyzer 40 according to the first embodiment of the present embodiment. Referring to FIG. 5A, the selector 41 receives a position interpolator and a setting signal from the outside in step S325. The setting signal includes a generation method setting signal used to determine a method of generating key data and key value data to be encoded and a generation mode setting signal used to determine a mode for generating key data and key value data to be encoded.

The mode for generating key data and key value data will be described first in the following paragraphs.

The analyzer 40 reduces the amount of key data and key value data to be encoded by decreasing the number of keyframes of a position interpolator input thereto. The analyzer 40 is supposed to have either an animation path-preserving mode or an animation key-preserving mode, depending on a mode setting signal input thereinto from the outside.

In an animation path-preserving mode, a position interpolator is only used to describe interpolation of an animation path, and random access to keyframes is not necessary. In order to effectively encode a position interpolator in the animation path-preserving mode, within a predetermined error range, key data of a position interpolator and key value data corresponding to the key data can be removed.

On the other hand, in an animation key-preserving mode, it is necessary to have random access to keyframes using MPEG-4 BIFS commands, such as 'replace', 'delete', or 'insert'. In the animation key-preserving mode, the number of key data of a position interpolator does not change. The animation path-preserving mode and the animation key-preserving mode will be described more fully later.

Referring to FIG. 5A again, the selector 41 selects a mode for generating key data and key value data to be encoded, following a generation mode input from the outside. In step S330, the selector 41 outputs the input position interpolator to the break point extractor 42, if the input generation mode is an animation key-preserving mode. If the input generation mode is an animation path-preserving mode, the selector 41 outputs the input position interpolator to the resampler 43 or the break point extractor 42 together with information necessary to generate key data and key value data in step S330, in response to a generation method setting signal input from the outside.

Specifically, in the case of generating key data and key value data to be encoded by resampling, the selector 41 outputs the number of key data (i.e., time intervals) and a generation mode together with the position interpolator to the resampler 43. In the case of generating key data and key value data to be encoded by extracting break points, the selector 41 outputs allowable error limit between an original animation path and a path to be generated by the extracted break points and the generation mode to the break point extractor 42.

The resampler 43 generates sampled key data and sampled key value data by sampling an animation path generated by the position interpolator input from the selector 41 at intervals of a predetermined amount of time, and the break point extractor 42 extracts a minimum number of break points, by which an error between the animation path generated by the input position interpolator and an animation path to be generated by the extracted break points can be prevented from exceeding a predetermined allowable error limit, in step S335.

Figure 5B:
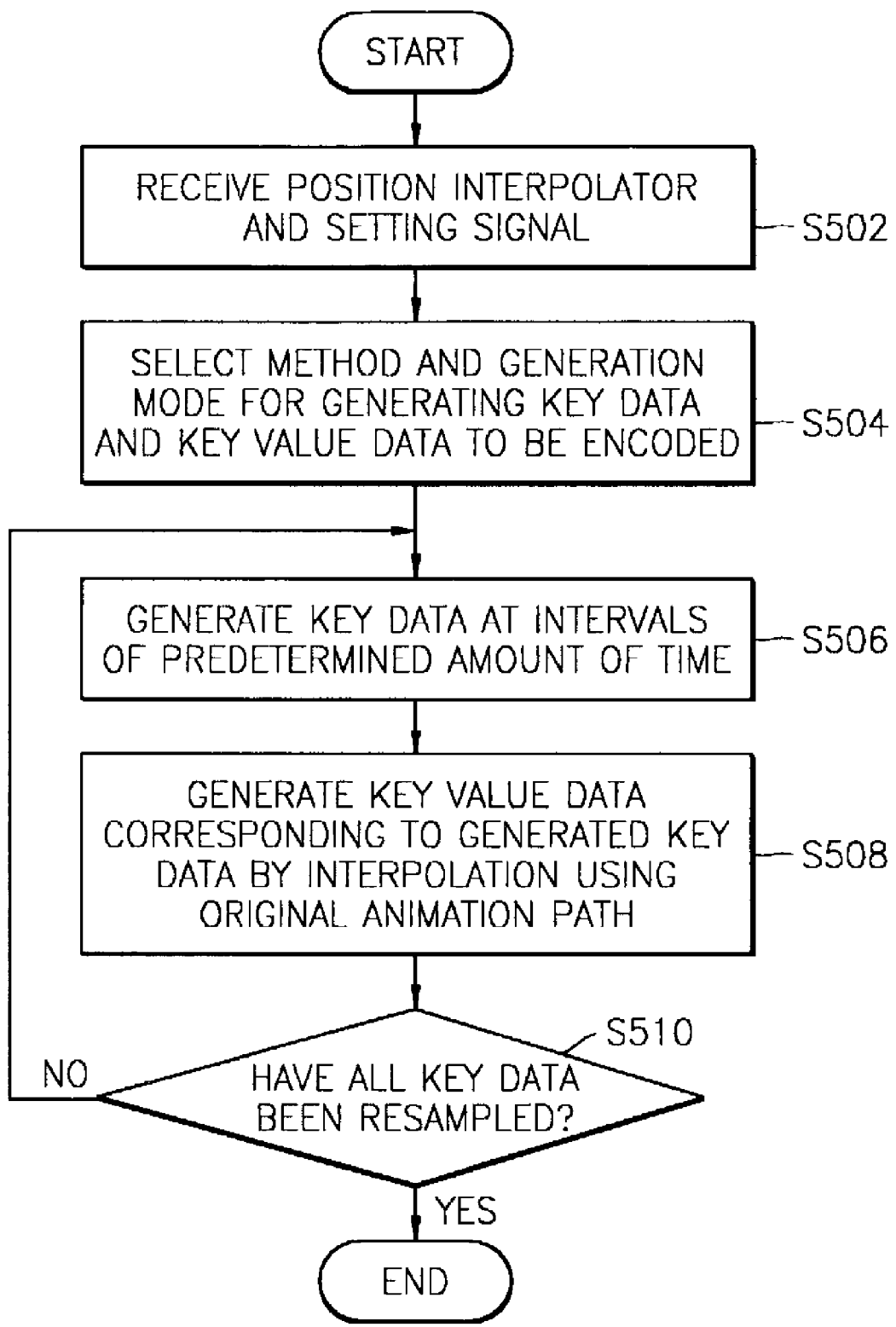
FIG. 5B is a flowchart of a resampling method according to a preferred embodiment of the present embodiment.

FIG. 5B is a flowchart of the operation of the resampler 43 according to a preferred embodiment of the present embodiment. Referring to FIG. 5B, the resampler 43 receives a position interpolator and the number (m) of key data to be resampled from the selector 41 in step S502. The number (m) of key data to be resampled may be arbitrarily set up by a user or may be set up at a predetermined value in advance.

The resampler 43 selects a first path point and a final path point of an original animation path generated by the input position interpolator and sets up an initial value (i) of the key data to be resampled at 1 in step S504.

Thereafter, the resampler 43 generates i-th key data at intervals of a predetermined amount of time in step S506.

Figure 6A:
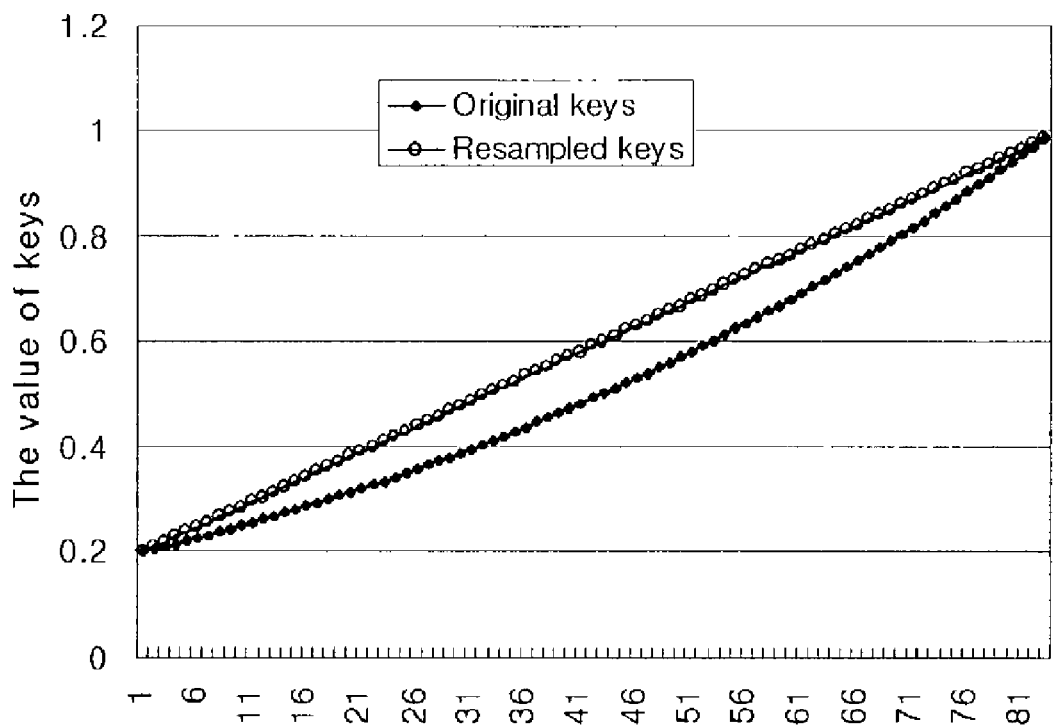
FIG. 6A is a diagram illustrating original key data and resampled key data.
Figure 6B:
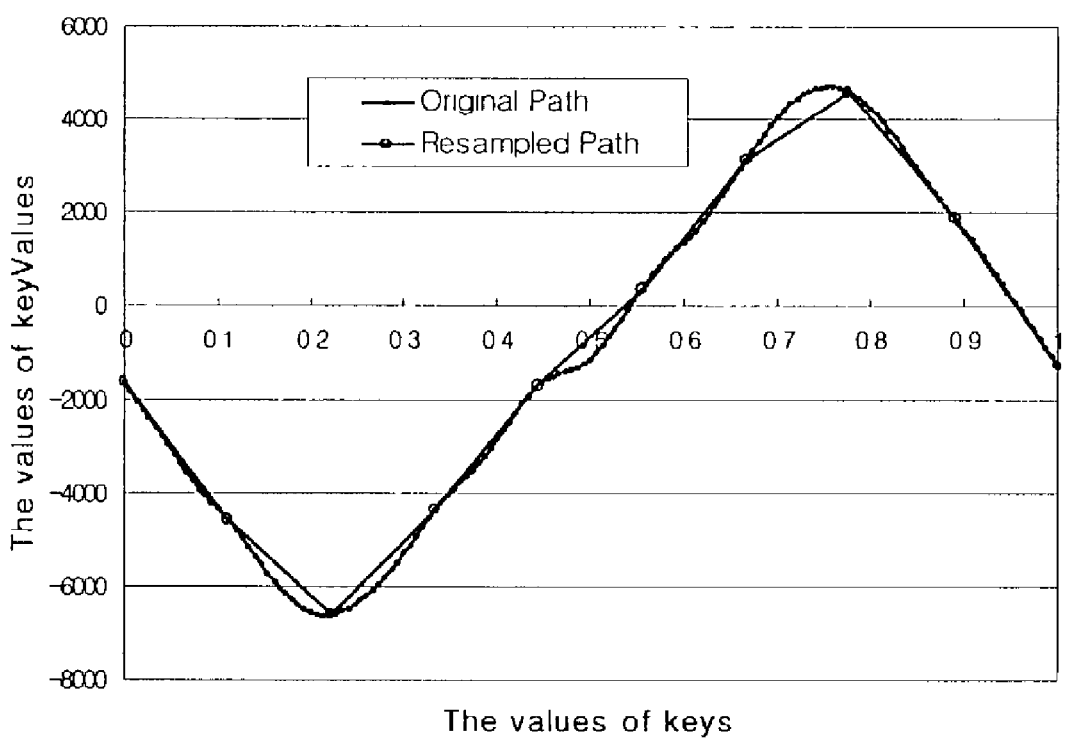
FIG. 6B is a diagram illustrating an original animation path and a resampled animation path.

FIG. 6A is a diagram illustrating original key data and resampled key data. Since the key data of the input position interpolator represent the locations of keyframes on a temporal axis, the key data monotonously increase, but intervals among the key data are irregular, as shown in FIG. 6A.

Therefore, as shown in FIG. 6A, the resampler 43 obtains an interval of a predetermined amount of time by dividing a difference between key data respectively representing the first path point and the final path point selected in step S504 by the number of key data to be resampled and then resamples the key data to be resampled at intervals of the predetermined amount of time.

In step S508, the resampler 43 generates key value data corresponding to the key data generated by resampling by linear interpolation using the original animation path. In other words, key value data corresponding to the resampled key data are linearly interpolated using key value data corresponding to key data right after the resampled key data and key value data corresponding to key data right before the resampled key data.

Thereafter, in step S510, the resampler 43 verifies if the resampling process has been performed on all the key data to be resampled and repeatedly performs steps S506 and S508 until all the key data and their corresponding key value data are resampled.

Figure 5C:
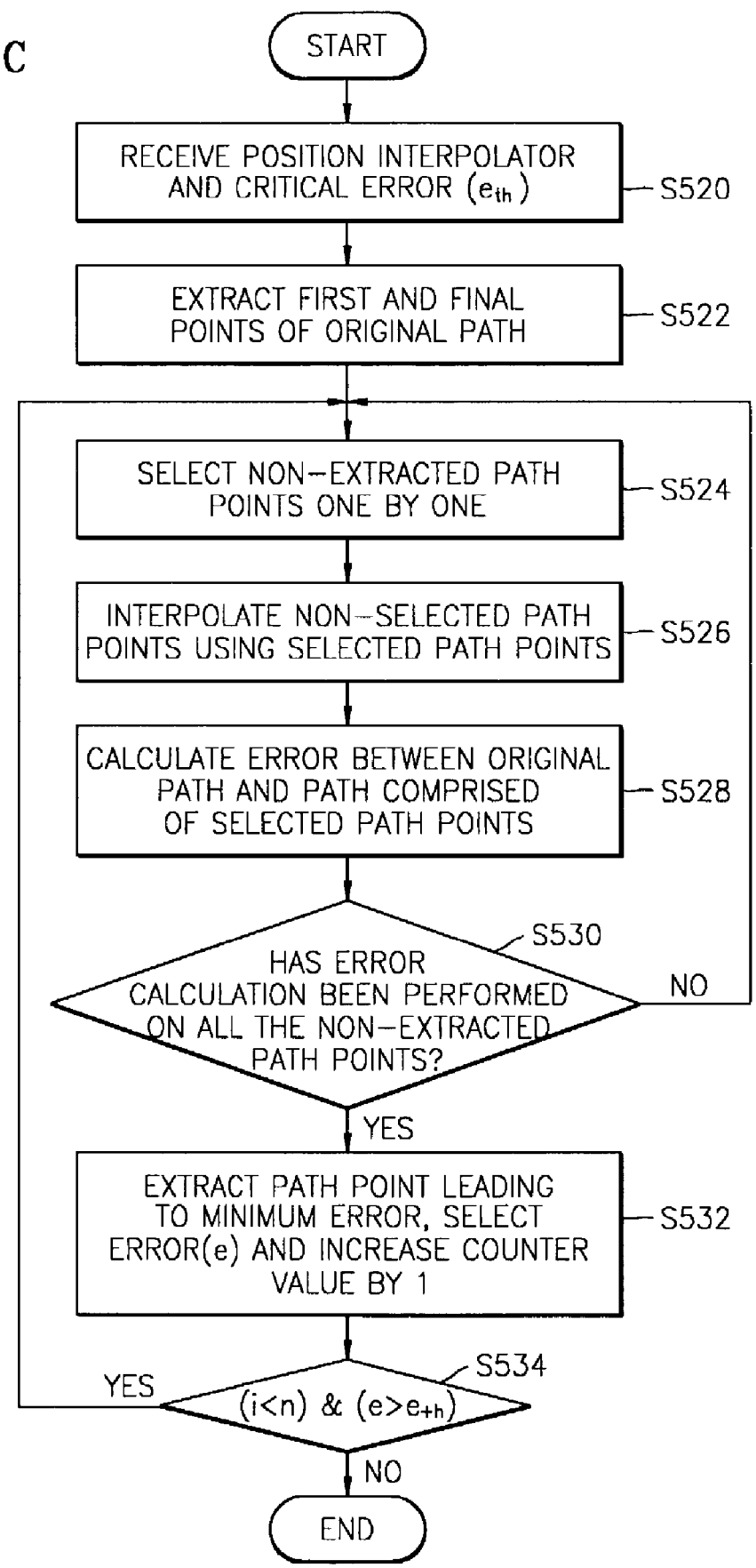
FIG. 5C is a flowchart of a method of extracting break points according to a preferred embodiment of the present embodiment.

FIG. 5C is a flowchart of a method of extracting break points according to a first embodiment of the present embodiment, and FIGS. 7A through 7F are diagrams illustrating each step of extracting break points from a position interpolator according to a preferred embodiment of the present embodiment.

Figure 7A:
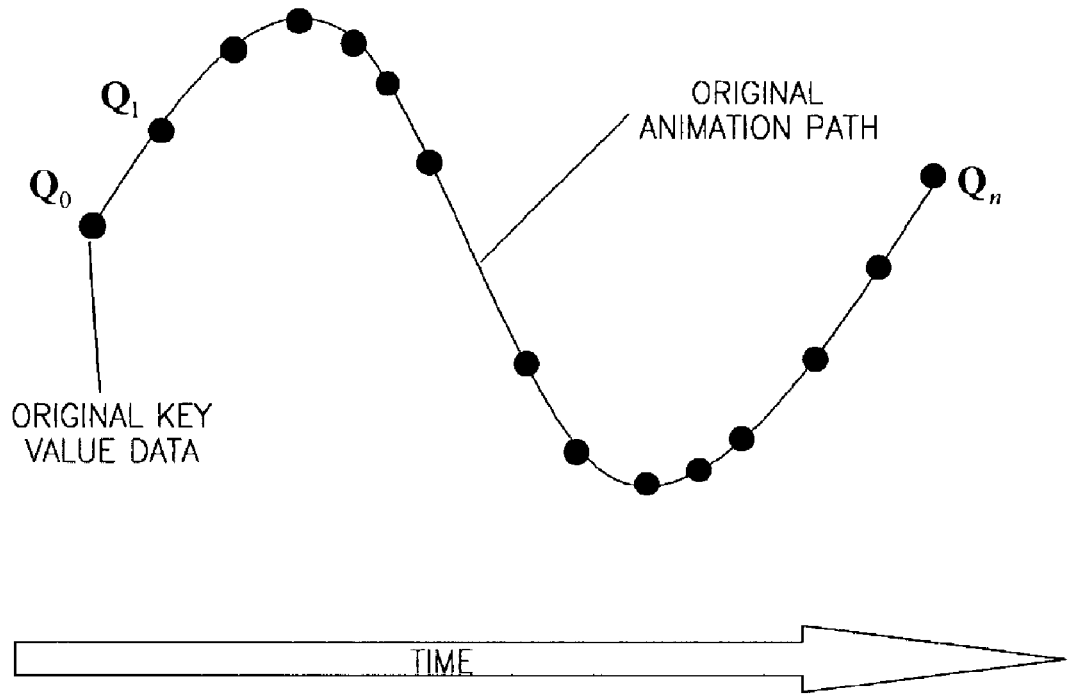
FIGS. 7A through 7F are diagrams illustrating a method of extracting break points according to a preferred embodiment of the present embodiment.
Figure 7B:
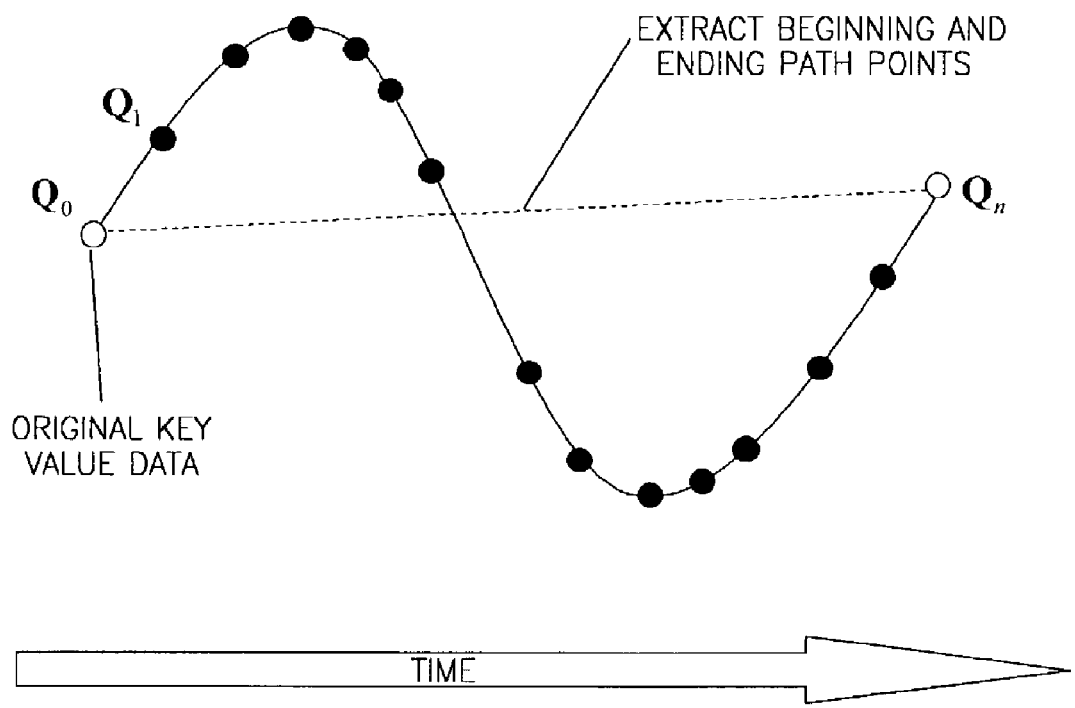

Referring to FIGS. 4A, 5C, and 7A through 7F, the linear interpolator 42a of the break point extractor 42 receives a position interpolator and an allowable error limit $e_{th}$ from the selector 41 in step S520. An animation path constituted by the input position interpolator is shown in FIG. 7A.

The linear interpolator 42a extracts a first path point $Q_0$ and a final path point $Q_n$ of the animation path constituted by the input position interpolator, as shown in FIG. 7A, and sets up a counter (i) at 1 in step S522.

The linear interpolator 42a arbitrarily or sequentially selects path points between the first and final path points $Q_0$ and $Q_n$ one by one in step S524. Next, the linear interpolator 42a linearly interpolates path points, which have not been selected yet, using the selected path points and outputs the selected path points and the interpolated path points to the error calculator 42b in step S526.

The error calculator 42b calculates an error (e) between the original animation path and a candidate animation path constituted by the selected path points and the interpolated path points and outputs the error (e) to the determining unit 42c in step S528. The method of calculating the error (e) will be described later.

The error calculator 42b checks if among the path points, which have not been selected by the linear interpolator 42a, there still exists path points, which have not been considered when calculating the error (e). If there are path points, which have not been considered when calculating the error (e), the error calculator 42b calculates an error between the path points and the original animation path in step S530 by repeatedly performing steps S524 through S528.

Figure 7C:
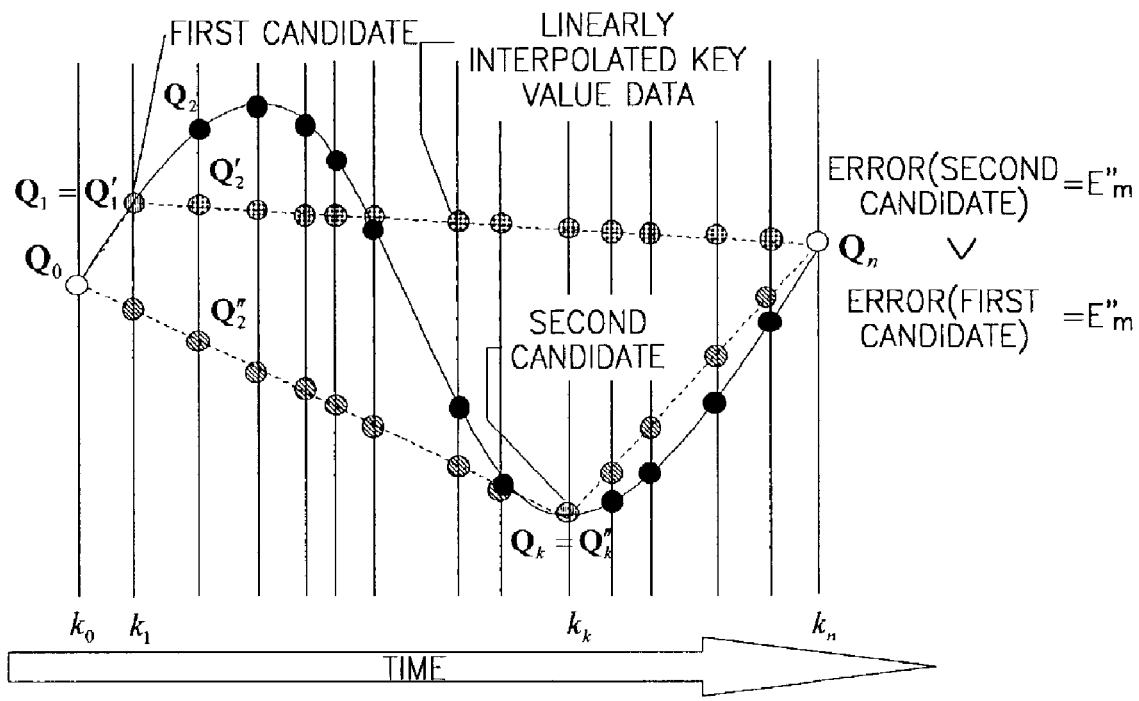
Figure 7D:
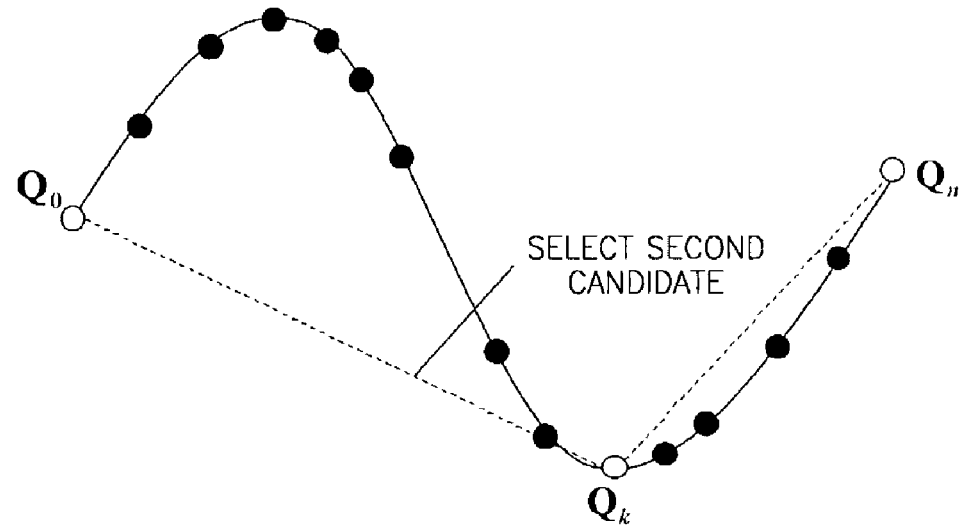
Figure 7E:
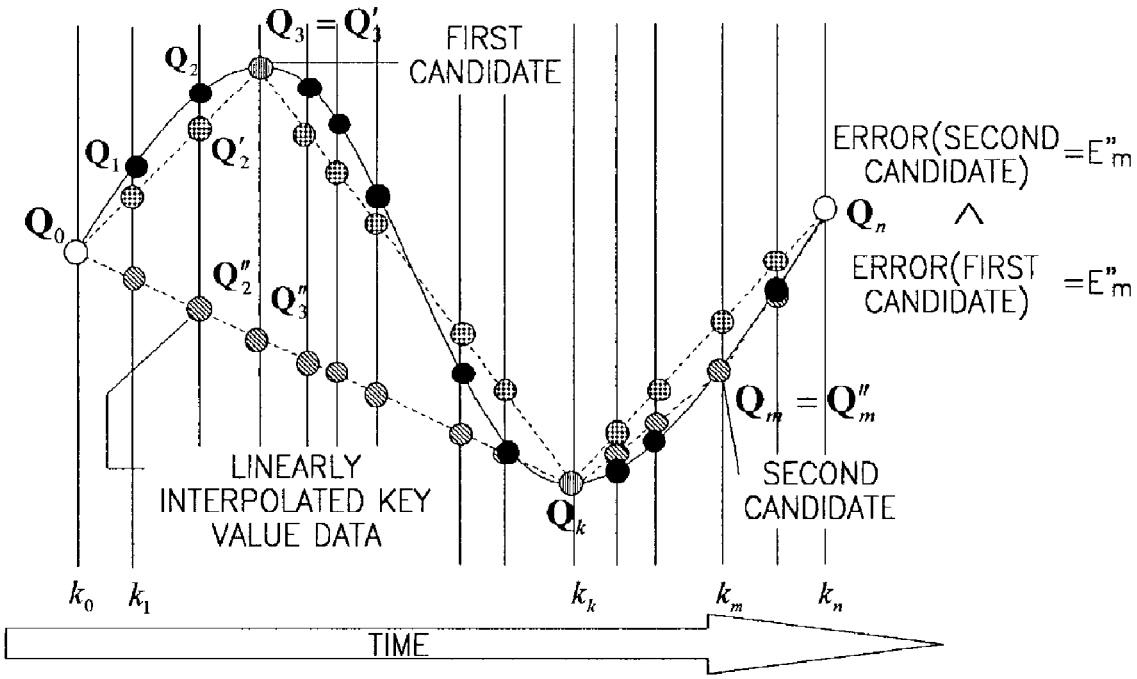
Figure 7F:
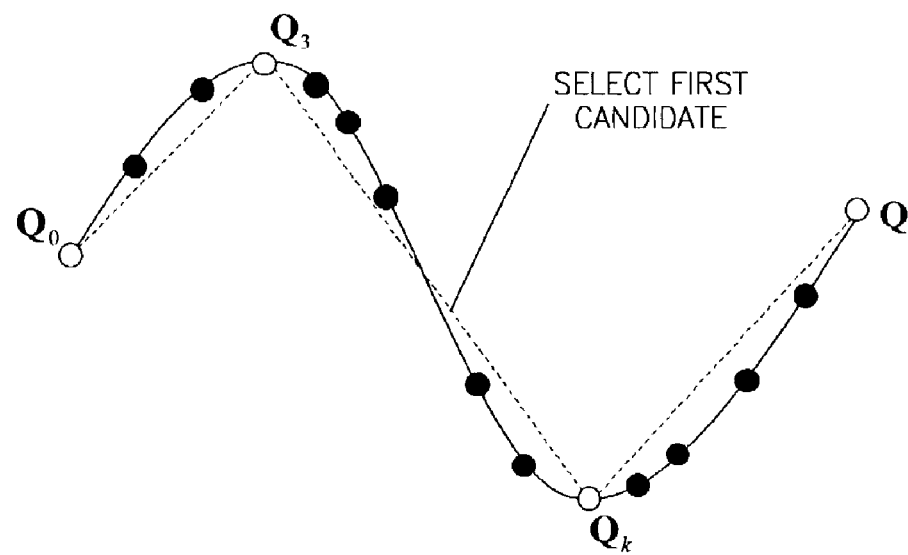

FIG. 7C is a diagram illustrating steps S524 through S530. Referring to FIG. 7C, the linear interpolator 42a extracts an break point $Q_1$ corresponding to key data at a predetermined moment of time $k_1$ and generates a first candidate animation path by linearly interpolating path points between the first path point $Q_0$ and the break point $Q_1$. The error calculator 42b calculates an error $e_1$ between the original animation path and the first candidate animation path. Thereafter, in the same manner, the linear interpolator 42a extracts another break point $Q_k$ and generates a k-th candidate animation path by linearly interpolating path points between the first path point $Q_0$ and the break point $Q_k$ and between the break point $Q_k$ and the final path point $Q_n$. The error calculator 42b calculates an error ($e_k$) between the original animation path and the k-th candidate animation path.

If steps S524 through S530 have been performed on all the path points that have not been selected by the linear interpolator 42a, errors between the original animation path and candidate animation paths each generated following steps S524 through S530 are output to the determining unit 42c. Then, the determining unit 42c selects a break point, which forms a candidate animation path having the smallest error with the original animation path, and increases the value of the counter (i) by 1 in step S532.

The determining unit 42c checks if an error (e) between the original animation path and the candidate animation path constituted by the extracted break point is greater than the allowable error limit $e_{th}$ and the value of the counter (i) greater than the number (n) of key data, i.e., the number of path points between the first path point $Q_0$ and the final path point $Q_n$, in step S534.

If the error (e) is smaller than the allowable error limit $e_{th}$, it means all the break points required for encoding have been extracted. If the number of break points finally selected as the ones to be encoded is equal to 'n', which means that all the path points of the process of extracting break points is completed.

However, if the number of selected break points is smaller than n and the error (e) is greater than the allowable error limit $e_{th}$, which means there still exists break points to be extracted, the extracted break points are output to the linear interpolator 42a, and then steps S524 through S532 are performed again.

Hereinafter, data, which are supposed to be output from the resampler 43 and the break point extractor 42 to the key data encoder 200 and the key value data encoder 300 when the generation mode is an animation path-preserving mode, will be described in the following paragraphs.

The resampler 43 outputs sampled key data and sampled key value data to the key data encoder 200 and the key value data encoder 300, respectively, as key data and key value data to be encoded, respectively.

Hereinafter, key data and key value data output from the break point extractor 42 depending on a generation mode will be described with reference to FIG. 8.

Figure 8:
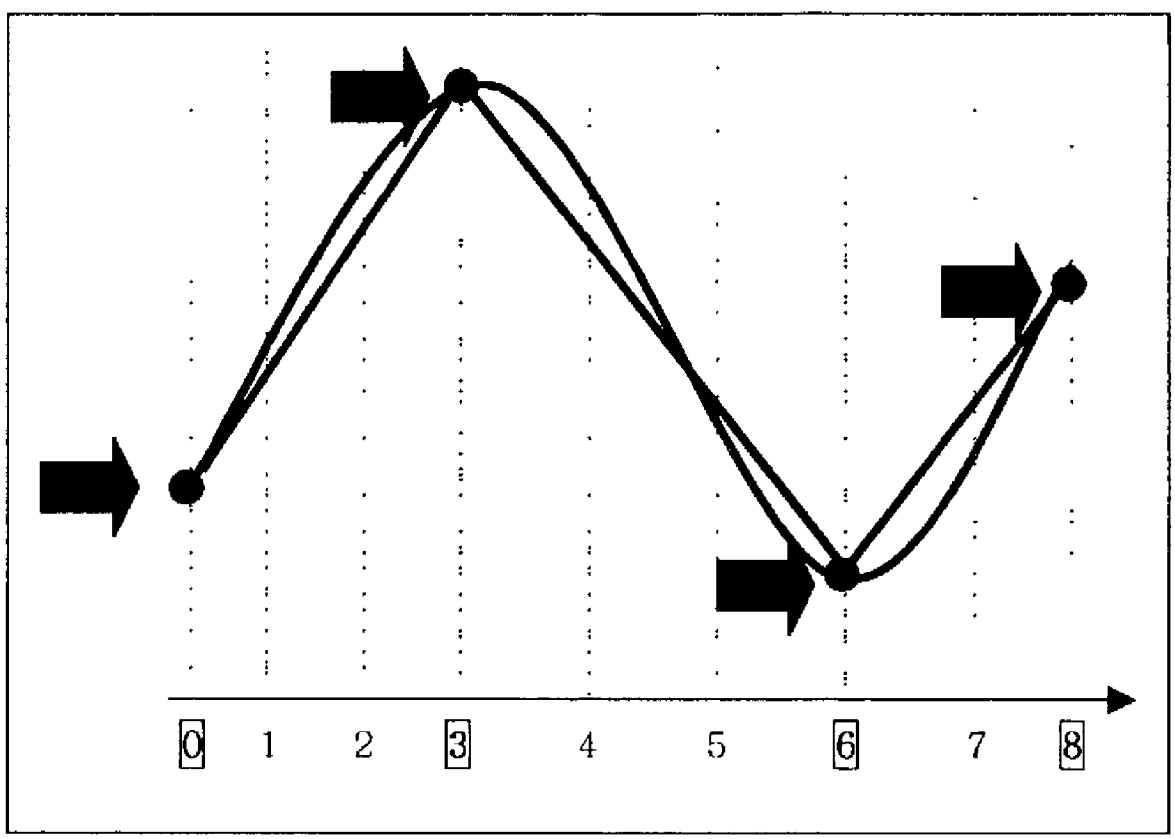
FIG. 8 is a diagram illustrating key data and key value data output from break point extractor in an occurrence mode.

As shown in FIG. 8, supposing finally extracted break points are referred to as 0, 3, 6, and 8, key data and key value data corresponding to the break points 0, 3, 6, and 8 are output with key selection flags, which is shown in the following table.

TABLE 2

| Key Data of Original Path | P0 | P1 | P2 | P3 | P4 | P5 | P6 | P7 | P8 |
|---|---|---|---|---|---|---|---|---|---|
| Key Selection Flags | 1 | 0 | 0 | 1 | 0 | 0 | 1 | 0 | 1 |

The structure of the analyzer 40 according to the first embodiment of the present embodiment has been described above. However, the analyzer 40 may be only constituted by the break point extractor 42 without the selector 41 and the resampler 43 or may be only constituted by the resampler 43 without the selector 41 and the break point extractor 42, which is obvious to one skilled in the art.

Hereinafter, another example of the analyzer 40 according to a second embodiment of the present embodiment will be described.

Figure 4B:
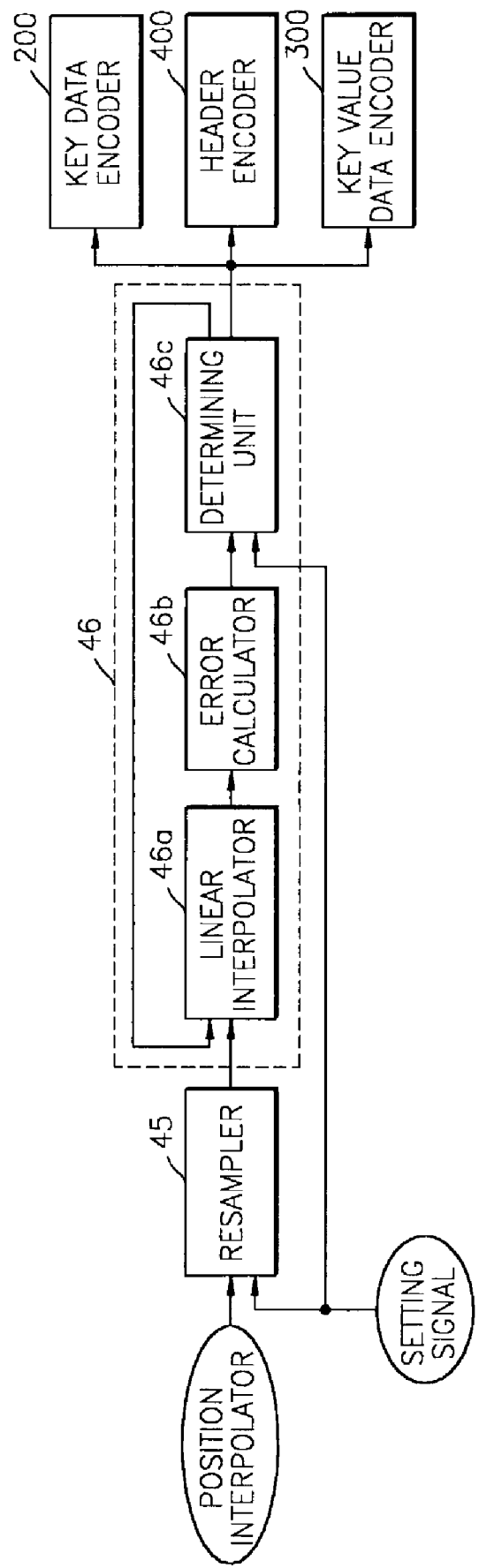

Referring to FIG. 4B, the analyzer 40 according to the second embodiment of the present embodiment includes a resampler 45, which receives and resamples a position interpolator, and an break point extractor 46, which extracts break points of the resampled position interpolator and outputs key data and key value data to be encoded. The break point extractor 46 in the second embodiment of the present embodiment, like the one in the first embodiment of the present embodiment, also includes a linear interpolator 46a, an error calculator 46b, and a determining unit 46c.

When a position interpolator is input into the analyzer 40, the resampler 45 resamples a first animation path constituted by the position interpolator into a predetermined number of sections having an interval of a predetermined amount of time with one another.

The resampler 45 outputs the position interpolator consisting of sampled key data and sampled key value data to the linear interpolator 46a of the break point extractor 46.

The linear interpolator 46a interpolates a position interpolator by performing steps S522 through S526 shown in FIG. 5C and outputs the interpolated position interpolator to the error calculator 46b. The error calculator 46b calculates an error between the first animation path and a second animation path constituted by the interpolated position interpolator by performing steps S528 and S530. The determining unit 46c selects a path point, which will lead to a minimum error between the first and second animation paths, verifies if the corresponding error is greater than an allowable error limit $e_{th}$ and if all path points of the first animation path have been selected, and generates key data and key value data to be encoded.

As described above, in the analyzer 40 according to the second embodiment of the present embodiment, the operation of the resampler 45 and the break point extractor 46 is the same as the operation of the corresponding elements in the first embodiment of the present embodiment except that the break point extractor 46 receives a position interpolator consisting of the key data and key value data output from the resampler 45 and the process of extracting break points is performed on an animation path constituted by the position interpolator input from the resampler 45.

Hereinafter, an example of the analyzer 40 according to a third embodiment of the present embodiment will be described with reference to FIG. 4C.

Figure 4C:
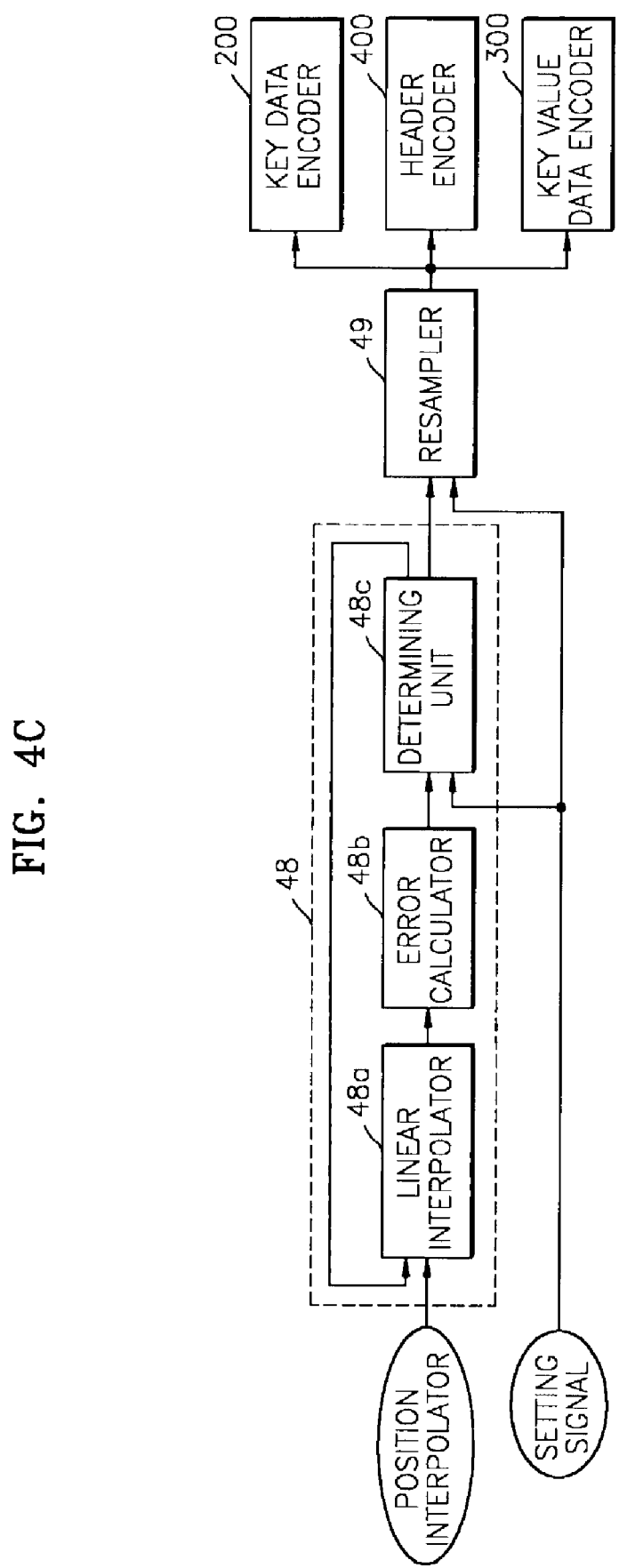

Referring to FIG. 4C, the analyzer 40 includes an break point extractor 48, which receives a position interpolator, extracts break points from a first animation path constituted by the position interpolator, and outputs key data and key value data, and a resampler 49, which resamples a second animation path constituted by a position interpolator consisting of the key data and key value data input from the break point extractor 48 at intervals of a predetermined amount of time. The break point extractor 48, like the ones in the first and second embodiments of the present embodiment, also includes a linear interpolator 48a, an error calculator 48b, and a determining unit 48c.

The break point extractor 48, like the one in the first embodiment of the present embodiment, outputs the key data and key value data extracted from the first animation path to the resampler 49.

The resampler 49 resamples an animation path constituted by a position interpolator consisting of the key data and key value data input from the break point extractor 48 at intervals of a predetermined amount of time and outputs the key data and key value data to be encoded. The function of the resampler 49 is the same as the ones in the first and second embodiments of the present embodiment, and thus its description will not be repeated here.

The key data and the key value data output from the analyzer 40 in the first through third embodiments of the present embodiment are output to the key data encoder 200 and the key value data encoder 300, respectively.

Hereinafter, an example of the key data encoder 200 according to a preferred embodiment of the present embodiment will be described with reference to FIGS. 9A through 12J.

Figure 9A:
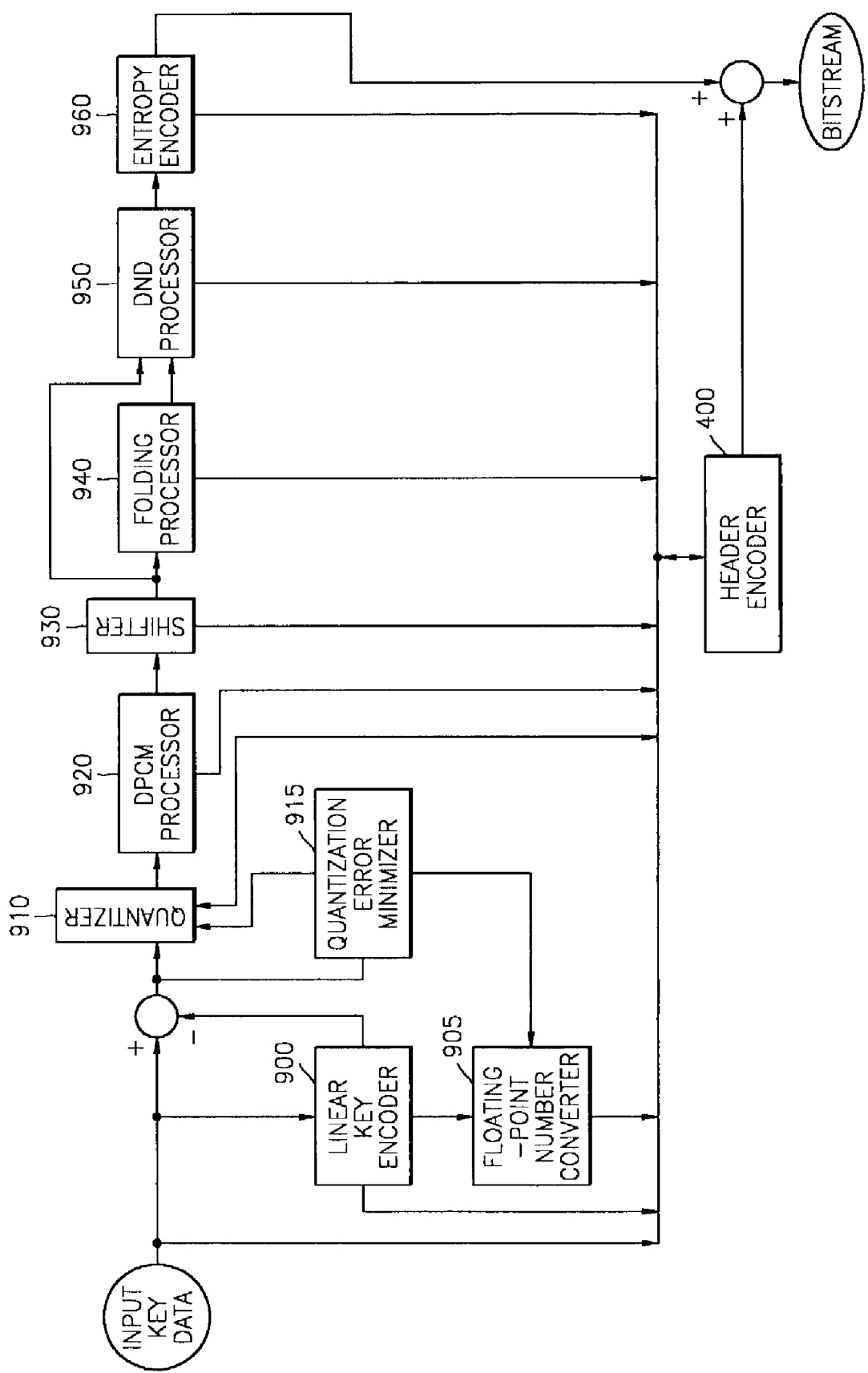
FIG. 9A is a block diagram of a key data encoder according to a preferred embodiment of the present embodiment.

FIG. 9A is a block diagram of an example of the key data encoder 200 according to a preferred embodiment of the present embodiment. Referring to FIG. 9A, the key data encoder 200 includes a linear key encoder 900, a quantizer 910, a DPCM processor 920, a shifter 930, a folding processor 940, a DND processor 950, and an entropy encoder 960.

The linear key encoder 900 identifies a region where key data linearly increase in an entire key data range and encodes the region. The quantizer 910 quantizes key data input thereinto using a quantization method capable of minimizing a quantization error. The DPCM processor 920 receives quantized key data and generates differential data of key data. The shifter 930 subtracts a differential datum having the highest frequency among all differential data from the differential data. The folding processor 940 transfers differential data to a positive or negative number region. The DND processor 950 reduces the range of differential data of key data by selectively performing a divide operation, a divide-up operation, and a divide-down operation on the differential data. The entropy encoder 960 encodes differential data using a function SignedAAC or UnsignedAAC, which is used for encoding differential data on each bit plane.

Figure 10A:
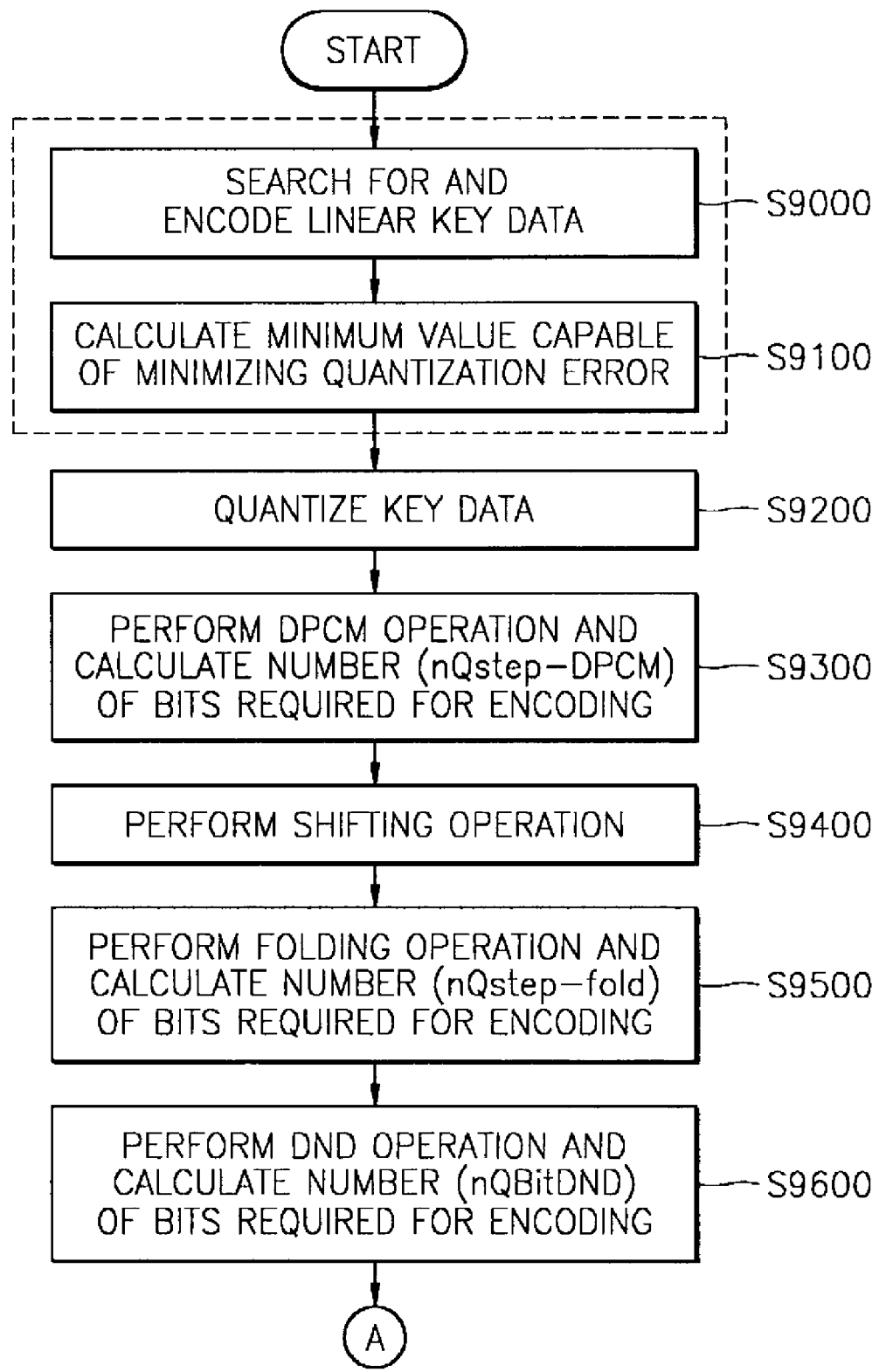
FIGS. 10A through 10G are flowcharts of a method of encoding key data according to a preferred embodiment of the present embodiment.
Figure 10B:
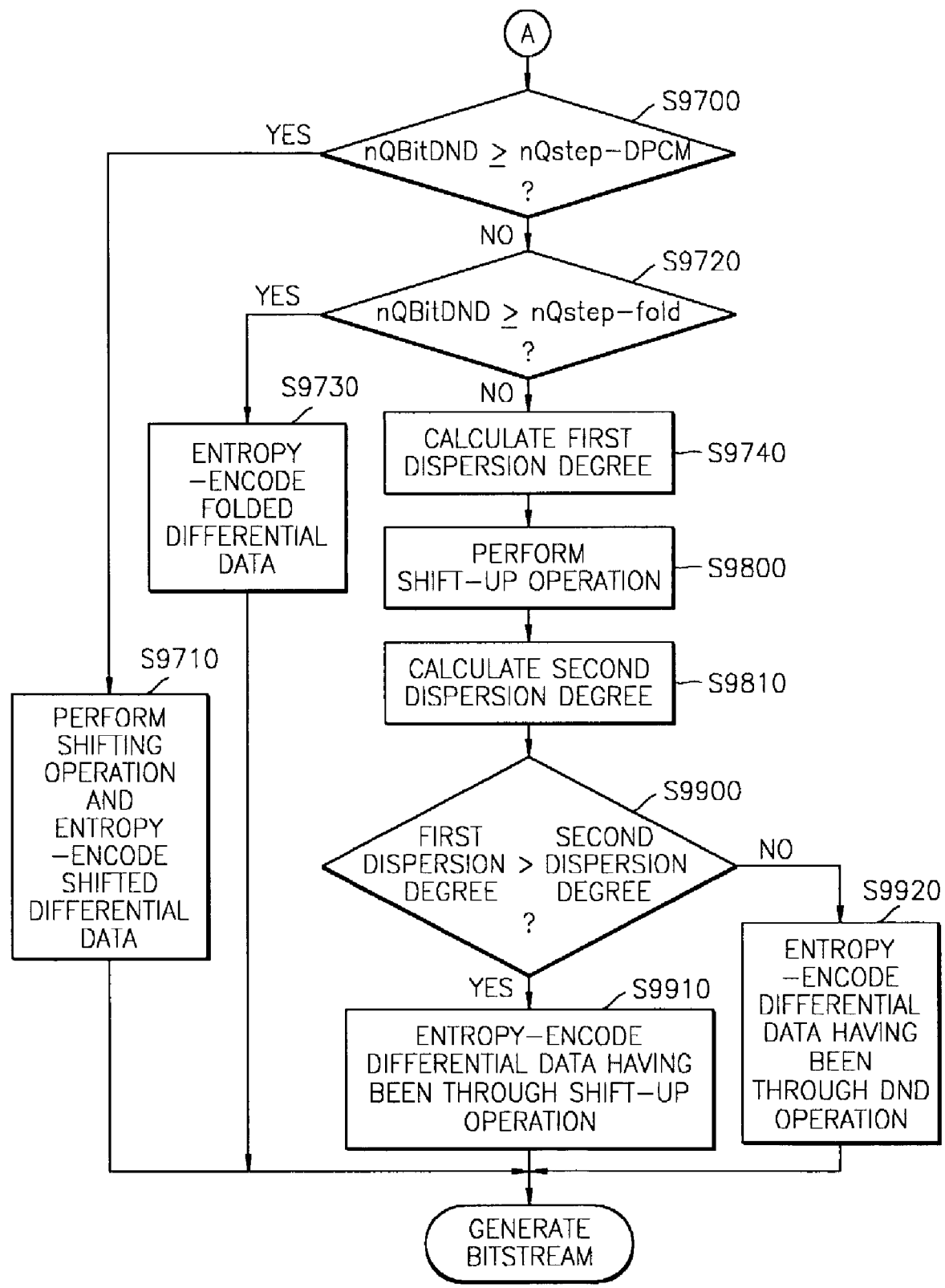

Hereinafter, the operation of the key data encoder 200 will be described with reference to FIGS. 10A and 10B. FIGS. 10A and 10B are flowcharts of a method of encoding key data according to a preferred embodiment of the present embodiment.

When key data are input into the key data encoder 200, the number of key data and the digit number of each of the key data are input into the header encoder 400 and then are encoded. The linear key encoder 900 searches the input key data for a linear key region, i.e., a region where keyframes are located at intervals of a predetermined amount of time, key data have the same difference with one another, and thus the key data linearly increase, and then encodes the linear key region first in step S9000.

Famous 3D application software, such as 3DMax or Maya, generates key-frame based animation using keys having a predetermined time interval therebetween in specific regions. In this case, it is possible to easily encode key data using the beginning and ending key data of a linear key data region and the number of key frames existing between them. Accordingly, linear prediction is very useful for encoding keys in a certain region using an interpolator.

The following equation is used for linear prediction.

$$t(i) = \frac{t_E - t_S}{E - S} + t_S \quad (0 \le i \le E - S, S < E) \quad (1)$$

Here, $t_S$ represents the data of a key where a partially linear region begins, $t_E$ represents the data of a key where the partially linear region ends, S represents an index of $t_S$, and E represents an index of $t_E$. The error between real key data in a specific region ranging from S-th key data to E-th key data and key data linearly predicted following Equation (1) can be calculated using the following equation.

$$e_i = t(i) - t_{i+S} = \frac{t_E - t_S}{E - S} i + t_S - t_{i+S} \quad (2)$$

If a maximum value among errors calculated using Equation (2) is not greater than a predetermined critical value, $t_I$ can be considered co-linear in region $[t_S, t_E]$ or within a certain range of errors. Whether or not the maximum error value $t_I$ is co-linear with the specific region is determined using the following Equation (3).

$$E_p = \underset{i=0,\ldots,(E-S)}{\text{MAX}} |e_i| = \underset{i=0,\ldots,(E-S)}{\text{MAX}} \left| \frac{t_E - t_S}{E - S} i + t_S - t_{i+S} \right| \quad (3)$$

If $$E_p \le \frac{1}{2^{nBits+1}},$$

$t_I$ is co-linear with region $[t_S, t_E]$. Here, nBits represents the number of bits used for encoding.

If the linear key encoder 900 searches for the partially linear region, the beginning and ending key data of the partially linear key data region are output to the floating-point number converter 905. The number of keys included in the linear key data region is output to the header encoder 400 and is encoded. It is possible to considerably reduce the amount of data to be encoded using linear encoding.

The beginning key data and the ending key data are encoded using floating-point number conversion, which will be described later.

The floating-point number converter 905 converts key data represented in the binary system into the decimal system in order to encode the beginning key data and the ending key data.

A computer stores floating-point numbers as 32-bit binary numbers. If a floating-point number represented in the binary system is given, the floating-point number converter 905 converts the floating-point number into a mantissa and an exponent in the decimal system, and this process is expressed by the following equation.

$$\underbrace{\text{mantissa\_binary} * 2^{\text{exponent\_binary}}}_{\text{the floating-point number in binary system}} = \underbrace{\text{mantissa} * 10^{\text{exponent}}}_{\text{the floating-point number in decimal system}} \quad (4)$$

For example, a floating-point number 12.34 can be converted into a binary number by a computer, which is shown in the following.

$$\underset{1}{0} \underset{2}{10001010111000010100011} \underset{3}{10000010}$$

1: the sign
2: the mantissa in the binary system
3: the exponent in the binary system The binary number can be converted into a decimal number following Equation (4), which is shown in the following.

$$\underset{1}{0} \underset{2}{1234} \underset{3}{2}$$

1: the sign
2: the mantissa in the decimal system
3: the exponent in the decimal system In order to include a mantissa and an exponent in the decimal system in a bitstream, the numbers of bits required to represent the mantissa and the exponent must be calculated. The exponent has a value between −38 and 38 and thus can be expressed together with its sign using 7 bits. The number of bits required to represent the mantissa is dependent on the number of digits. The values of the mantissa and the number of bits required to represent the mantissa are shown in the following table.

TABLE 3

| Values of mantissa | Digits of mantissa | Number of bits required |
| --- | --- | --- |
| 0 | 0 | 0 |
| 1-9 | 1 | 4 |
| 10-99 | 2 | 7 |
| 100-999 | 3 | 10 |
| 1000-9999 | 4 | 14 |
| 10000-99999 | 5 | 17 |
| 100000-999999 | 6 | 20 |
| 1000000-9999999 | 7 | 24 |

Figure 10C:
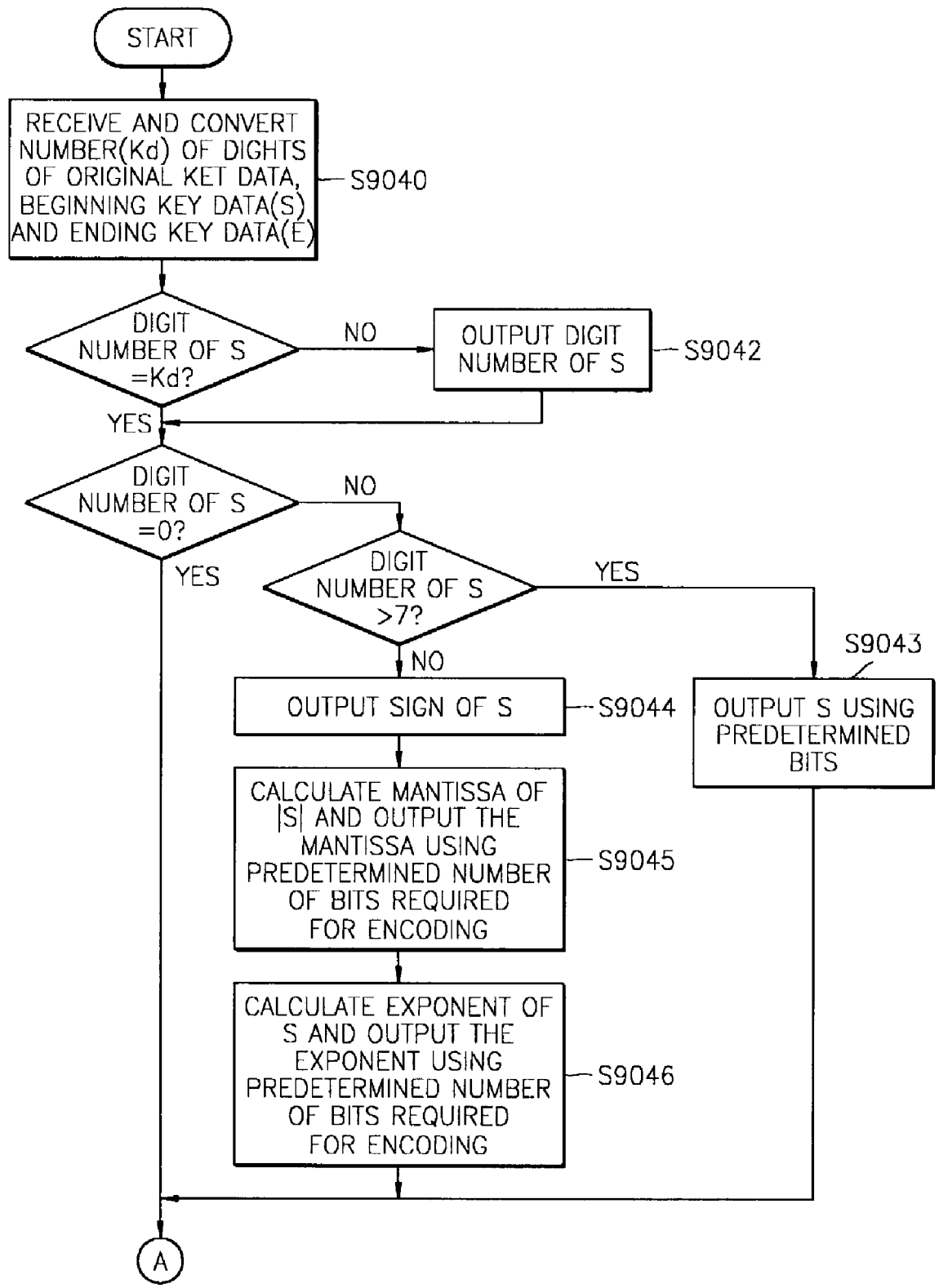
Figure 10D:
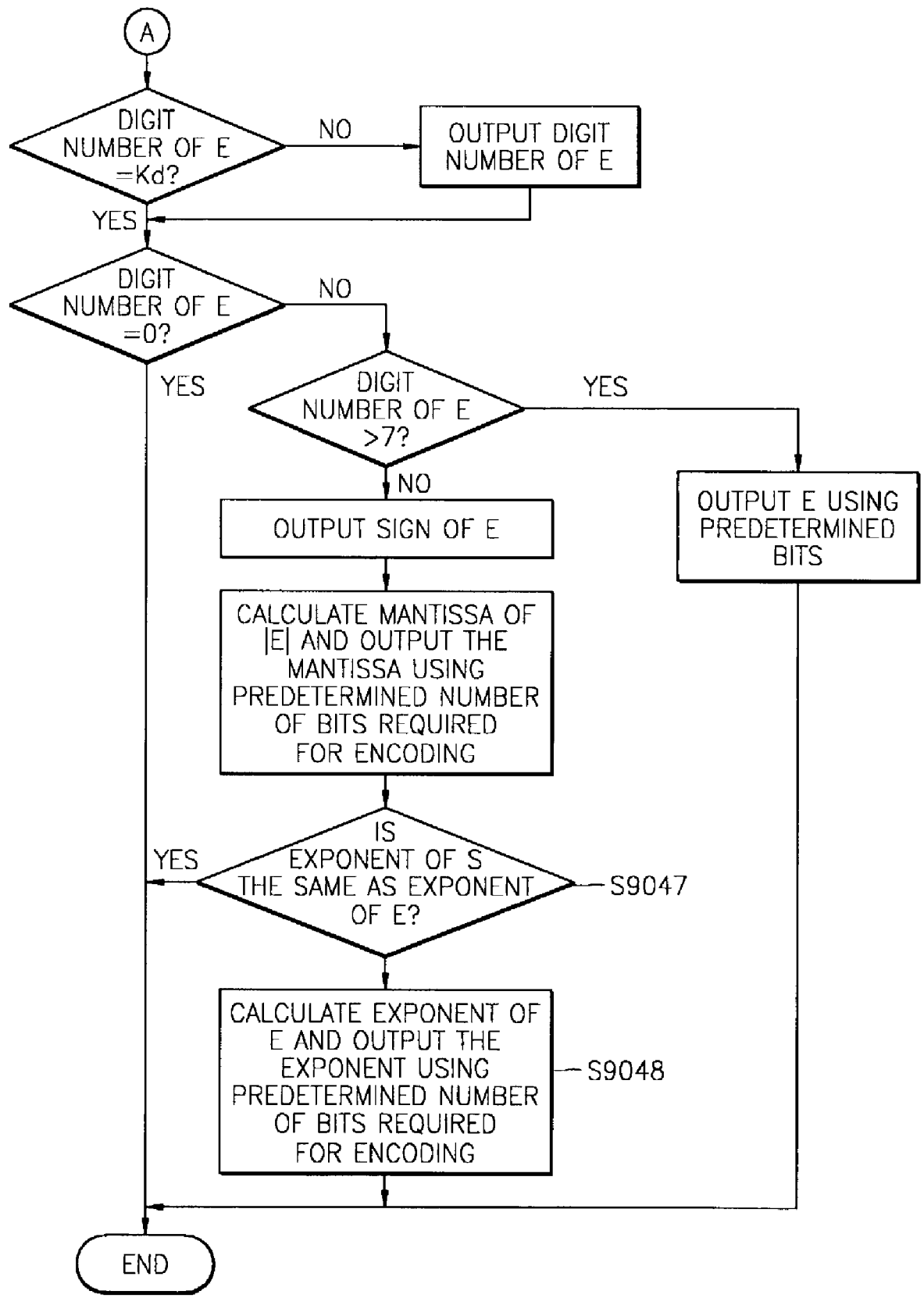

The beginning and ending key data of the linear key data region, which has been searched for and converted using the above-mentioned processes, are encoded following an encoding process shown in FIGS. 10C and 10D, are output to the header encoder 400, and are stored in the bitstream.

FIGS. 10C and 10D show a process of encoding two floating-point numbers input into the floating-point number converter 905. The way the floating-point number converter 905 encodes a floating-point number will be described with reference to FIGS. 10C and 10D.

The floating-point number converter 905 receives the digit number Kd of original key data, beginning key data S, and ending key data E and converts them in step S9040 following Equation (4).

The floating-point number converter 905 encodes S first. In particular, the floating-point number converter 905 checks whether or not the digit number of S is different from Kd. If the digit number of S is different from Kd, the digit number of S is obtained and is output to the header encoder 400 in step S9042. The floating-point number converter 905 obtains the digit number of S using function Digit ( ).

If the digit number of S is greater than 7, S is output to the header encoder 400 using a predetermined number of bits (in the present embodiment, 32 bits are used following a floating-point number manner of IEEE Standard 754) in step S9043 so that the digit number of S can be included in the bitstream.

If the digit number of S is not 0 and is smaller than 7, the floating-point number converter 905 outputs the sign of S to the header encoder 400 in step S9044. The number of bits required to encode the absolute value of the mantissa of S, is obtained using Table 3. Next, the absolute value of the mantissa of S is output to the header encoder 400 using the number of bits obtained using Table 3, in step S9045. The floating-point number converter 905 calculates the exponent of S, outputs the sign of S to the header encoder 400, and outputs the exponent to the header encoder 400 as a predetermined number of bits, for example, 6 bits, in step S9046. Such key data conversion makes it possible to considerably reduce the number of bits included in the bitstream.

If the digit number of S is 0, the encoding of the beginning key data is ended, and the method goes to a step of converting the ending key data E because when the digit number of S is 0, the corresponding floating-point number is also 0 which does not require encoding.

After converting and encoding the beginning key data S, the floating-point number converter 905 converts the ending key data E. The conversion of E is almost the same as that of S. In particular, it is checked whether or not the exponent of E is the same as that of S in step S9047. If the exponent of E is the same as that of S, only a flag bit representing that the exponent of E is the same as the exponent of S is output to the header encoder 400. If the exponent of E is not the same as that of S, the exponent of E as well as the flag bit is output to the header encoder 400 in the same way as the exponent of S has been output to the header encoder 400, in step S9048.

Key data among the input key data, which do not belong to the linear key region, are input into the quantizer 910 and quantized according to a predetermined quantization bit size, i.e., nKeyQBit.

However, in the case of decoding quantized key data using a decoder, it is impossible to perfectly recover original key data due to the error between the original key data and the quantized key data. Therefore, the quantizer 910 of this embodiment of the present embodiment obtains a maximum value and a minimum value among the input key data and quantizes the input key data using the maximum and minimum values. In addition, the present embodiment can include a quantization error minimizer 915 so that the error between original key data and their quantized key data can be minimized using the maximum and minimum values among the input key data.

The quantization error minimizer 915 quantizes or inverse-quantizes the input key data in advance using a method for controlling a range of quantization so that the quantization error can be minimized, in step S9100.

In particular, if a mixed maximum value used for quantization is represented by Max, a minimum value to be controlled for quantization is represented by Min, an input value is represented by $X_i$, and the number of bits used for quantization is represented by nQuantBit, then, a quantized input value $\tilde{X}_i$, an inverse-quantized value $\hat{X}_i$, and an error $e_i$ are obtained using the following equation.

$$\tilde{X}_i = \text{floor}\left(\frac{X_i - \text{Min}}{\text{Max} - \text{Min}} * (2^{nQuantBit} - 1) + 0.5\right) \quad (5)$$

$$\hat{X}_i = \frac{\tilde{X}_i * (\text{Max} - \text{Min})}{2^{nQuantBit} - 1} + \text{Min}$$

$$e_i = X_i - \hat{X}_i$$

There are two methods for reducing the sum $\Sigma e_i$ of errors. One is a method for reducing the sum of errors by continuously controlling Min until the sum of errors is minimized. The other is as follows.

First, let us assume that $X_i=(i+n)\Delta x+\epsilon_i$ where $X_i$ indicates an input key data sequence, $\Delta x$ indicates a basic step size of input data, n is an arbitrary integer, and $\epsilon_i$ indicates zero-mean random noise.

Next, when $d_i \equiv X_i - X_{i-1} = \Delta x + (\epsilon_i - \epsilon_{i-1})$, $\Delta'x = E[d_i]$ and $\text{Min} = \text{Max} - \Delta'x*(2^{nQuantBit}-1)$.

Min, which can make it possible to minimize a quantization error, and Max are input into the quantizer 910 and are used for quantization of key data.

The quantizer 910 receives the maximum and minimum values Max and Min which can minimize a quantization error and quantizes key data fKey$_i$ in step S9200, following Equation (6).

$$nQKey_i = \text{floor}\left(\frac{fKey_i - fKeyMin}{fKeyMax - fKeyMin}(2^{nKeyQBit} - 1) + 0.5\right) \quad (6)$$

Here, i indicates an index of quantized key data, nQKey$_i$ indicates an array of integers of the quantized key data, fKey$_i$ indicates an array of floating-point numbers of the quantized key data, fKeyMax indicates a maximum value input from the quantization error minimizer 915, fKeyMin indicates a minimum value input from the quantization error minimizer 915, and nKeyQBit indicates a quantization bit size. In Equation (6), function floor(v) is a function which outputs a maximum integer no greater than a certain floating-point value v.

The quantizer 910 of the present embodiment may not use such algorithm for reducing a quantization error, in which case quantization is performed simply using the maximum and minimum values fKeyMax and fKeyMin among input key data.

Figure 10E:
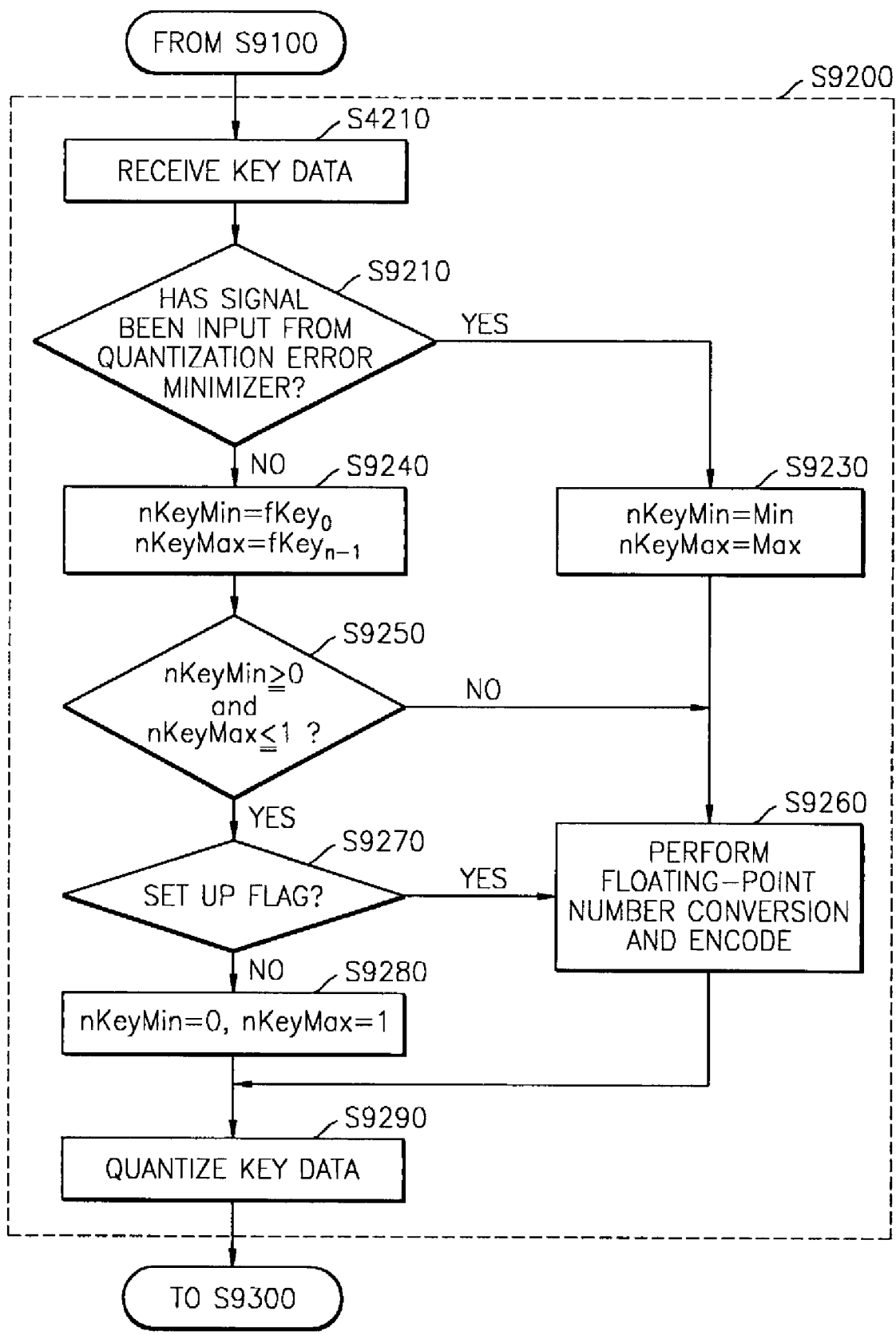

A quantization process of the present embodiment will be described more fully with reference to FIG. 10E.

The quantizer 910 receives key data in step S9210 and checks if the maximum and minimum values MAX and MIN are input from the quantization error minimizer 915 in step S9220.

If MAX and MIN are input, the quantizer 910 sets the maximum and minimum values fKeyMax and fKeyMin for quantization as MAX and MIN, respectively, in step S9230 and outputs the newly set maximum and minimum values fKeyMax and fKeyMin to the floating-point number converter 905. The maximum and minimum values fKeyMax and fKeyMin are converted and encoded through the above-mentioned floating-point number conversion process and are output to the header encoder 400 so that they can be included in a key header for being used in decoding.

If there is no value input from the quantization error minimizer 915, the quantizer 910 sets first key data fKey$_0$ and final key data fKey$_{N-1}$ as the minimum value fKeyMin and the maximum value fKeyMax, respectively, in step S9240.

Next, the quantizer 910 checks whether or not the maximum value fKeyMax is smaller than 1 but greater than 0 and whether or not the minimum value fKeyMin is greater than 0 in step S9250. If the maximum value fKeyMax is not smaller than 1 or not greater than 0, the maximum and minimum values fKeyMax and fKeyMin are output to the floating-point number converter 905 and are converted and encoded through the above-mentioned floating-point number conversion. Next, the maximum and minimum values fKeyMax and fKeyMin that have been converted and encoded are included in the key header in step S9260 so that they can be used in decoding.

On the other hand, if the maximum value fKeyMax is smaller than 1 and the minimum value fKeyMin is greater than 0, a flag indicating whether the maximum and minimum values fKeyMax and fKeyMin will be included in the key header for being used in decoding is checked in step S9270. If the flag is set up so that the maximum and minimum values fKeyMax and fKeyMin can be included in the key header, step S9260 is performed so that the maximum and minimum values fKeyMax and fKeyMin are output to the header encoder 400. If the flag is not set up, the quantizer 910 does not allow the maximum and minimum values fKeyMax and fKeyMin to be included in the header.

In a case where the maximum and minimum values fKeyMax and fKeyMin are not included in the key header, the key data encoder and the key data decoder are supposed to perform encoding and decoding, respectively, setting up the maximum and minimum values fKeyMax and fKeyMin at 1 and 0, respectively. In this case, the quantizer 910 sets up the maximum and minimum values fKeyMax and fKeyMin at 1 and 0, respectively, in step S9280. The maximum and minimum values fKeyMax and fKeyMin are already known to the key data decoder so that they do not need to be included in the key header.

The quantizer 910 quantizes the input key data by substituting the maximum and minimum values fKeyMax and fKeyMin that have been set up through the above-mentioned process into Equation (6) and outputs the quantized key data to a DPCM processor 920 in step S9290.

The DPCM processor 920 receives the quantized key data and performs DPCM on the quantized key data a predetermined number of times. Next, the DPCM processor 920 outputs the order of DPCM, by which a minimum value in the degree of dispersion can be obtained, and intra key data obtained in each cycle of DPCM, to the header encoder 400. The DPCM processor 920 outputs differential data generated by DPCM to the shifter 930 in step S9300.

Figure 10F:
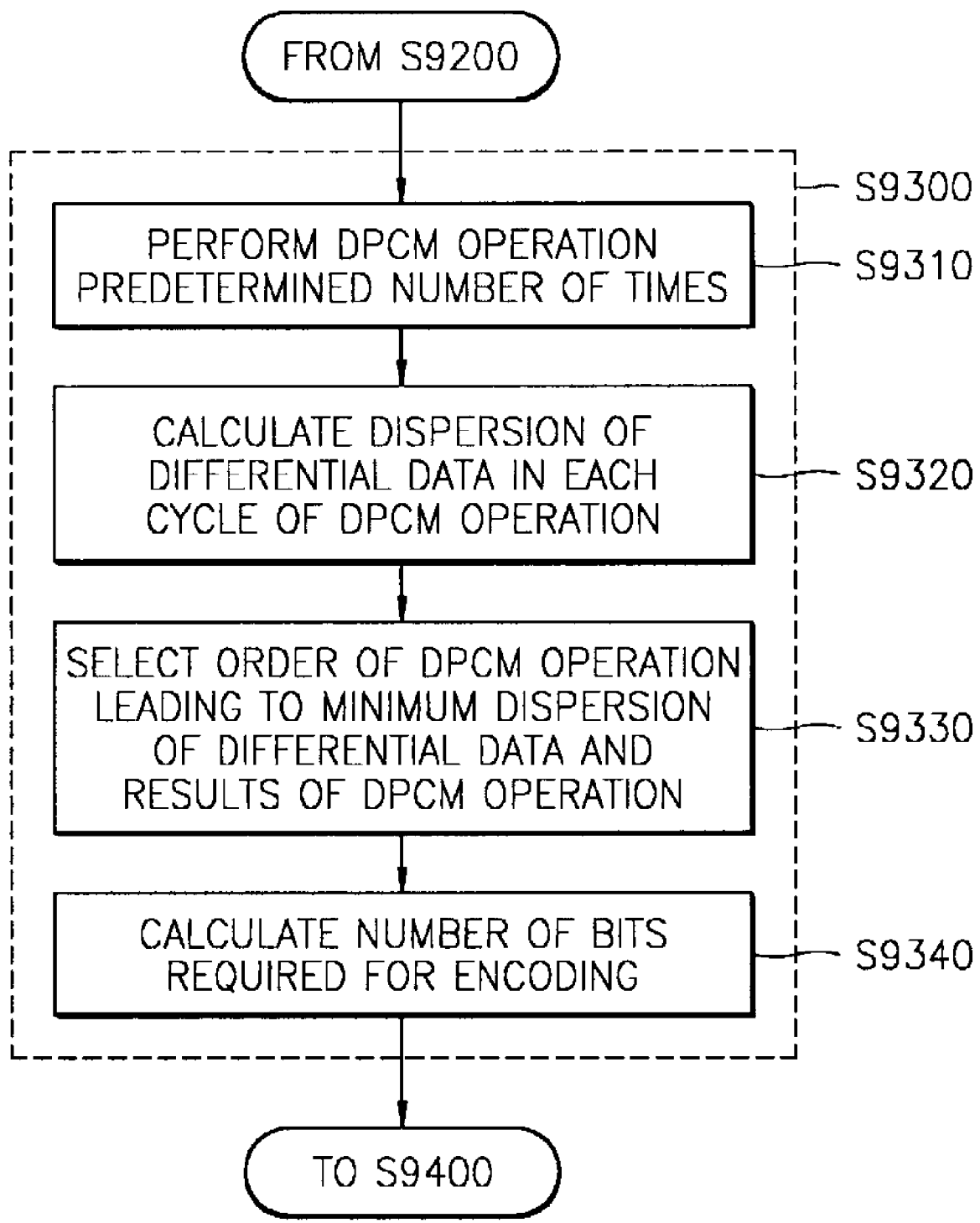

Referring to FIG. 10F, the DPCM processor 920 performs DPCM on the input key data a predetermined number of times and stores the number of cycles of DPCM as the order of DPCM in step S9310. In a preferred embodiment of the present embodiment, DPCM may be performed three times.

Thereafter, the DPCM processor 920 calculates the degree of dispersion of the results of each cycle of DPCM in step S9320. Here, the degree of dispersion may be represented by dispersion, standard deviation, or quartile deviation, and in a preferred embodiment of the present embodiment, quartile deviation may be used.

Next, the DPCM processor 920 selects a cycle of DPCM by which a minimum value in the degree of dispersion can be obtained and outputs the results of the selected order of DPCM to the shifter 930. The selected cycle of DPCM, intra key data of each cycle of DPCM and other pieces of information required for DPCM are output to the header encoder 400 in step S9330. However, in a preferred embodiment of the present embodiment, DPCM is performed only one time if the number of keys is smaller than 5. For example, a first cycle of DPCM is performed following Equation (7).

$$\Delta_i = nQKey_{i+1} - nQKey_i \quad (7)$$

Here, i indicates an index of quantized key data, nQKey$_i$ indicates an array of integers, and $\Delta_i$ indicates differential data.

The DPCM processor 920 calculates the number of bits required to encode the results of the selected cycle of DPCM and differential data of the key data that have been generated by DPCM in a predetermined memory (nQStep_DPCM) in step S9340. The calculation of the number of bits required for encoding may also be performed later in a subsequent step of selecting key data to be encoded, the fact which is obvious to one skilled in the art.

The shifter 930 selects a differential datum (hereinafter, referred to as a mode) which has the highest frequency from among the differential data input from the DPCM processor 920. Then, the shifter 930 subtracts the mode from all the differential data in step S9400 so that most data to be encoded are arranged around 0 and the number of bits required for encoding can be decreased.

Such shifting operation is performed subtracting mode nKeyShift from all the quantized key data, which is expressed by the following equation.

$$\text{shift}(nQKey_i) = nQKey_i - nKeyShift \quad (8)$$

Here, i indicates an index of quantized key data, $nQKey_i$ indicates an array of integers, and nKeyShift indicates a mode value. As a result of the shifting operation, differential data having the highest frequency become 0 so that the number of bits required for encoding can be considerably reduced.

The key data having been through the shifting operation are output to a folding processor 940 and a DND processor 950, and the mode value nKeyShift is output to the header encoder 400 so as to be included in the key header.

The folding processor 940 performs a folding operation on the outputs of the shifter 930 and outputs the results of the folding operation to the DND processor 950 in step S9500.

The folding operation is used to reduce the range of differential data that widely disperse over both a positive number region and a negative number region by concentrating them in either the positive or negative number region. In the present embodiment, the folding operation is performed following Equation (9) to concentrate the differential data in the positive number region.

$$\text{fold}(nQKey_i) = 2 \cdot nQKey_i \quad (\text{if } nQKey_i \geq 0) \quad (9)$$
$$= 2|nQKey_i| - 1 \quad (\text{if } nQKey_i < 0)$$

Here, i indicates an index of quantized key data, and $nQKey_i$ indicates an array of integers. As a result of the folding operation, positive differential data are converted into even numbers, and negative different data are converted into odd numbers.

The folding processor 940 calculates the number of bits required for encoding the differential data having been through the folding operation and stores it in a predetermined memory nQStep_fold. In this step, the calculation of the number of bits required for encoding may be performed later in a subsequent step of selecting differential data to be entropy-encoded, which is obvious to one skilled in the art. The data generated by the folding operation in the folding processor 940 are output to the DND processor 950.

In order to enhance the efficiency of entropy encoding, the DND processor 950 performs a DND operation on the input differential data of the key data a predetermined number of times, thus reducing the range of the differential data in S9600.

Figure 9B:
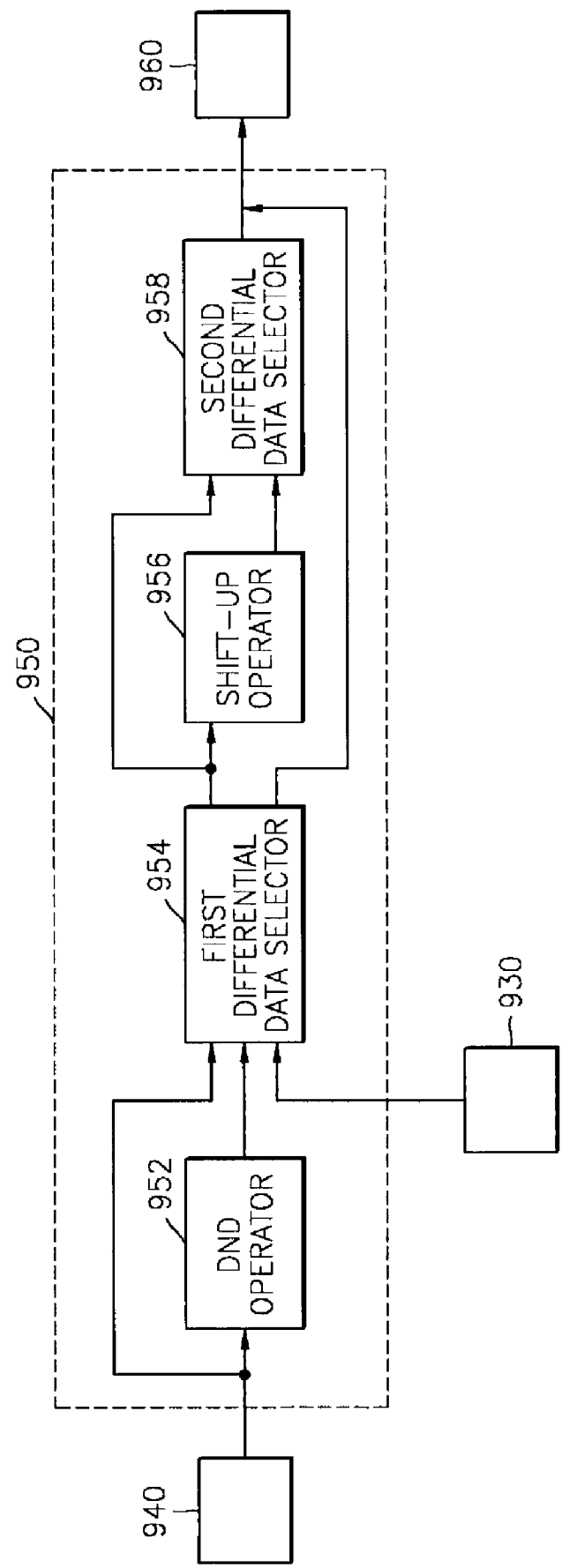
FIG. 9B is a block diagram of a DND processor shown in FIG. 9A.

Referring to FIG. 9B, the DND processor 950 includes a DND operator 952, which performs a DND operation on differential data, a first differential data selector 954, which selects differential data to be entropy-encoded based on the number of bits for encoding, a shift-up operator 956, which performs a shift-up operation on the differential data having been through a DND operation, and a second differential data selector 958, which selects from between the differential data having been through only the DND operation and the differential data having been through the shift-up operation the ones that have a lower dispersion degree and outputs the selected differential data to the entropy encoder 960.

The DND operation performed in the DND operator 952 will be described in the following paragraphs.

When the differential data having been through the folding operation in the folding processor 940 are input into the DND operator 952, they are divided in two groups, and a group of differential data having a higher range than the other group of differential data is moved to the positive number region by a divide function. The divide function is defined by the following equation.

$$\text{divide}(nQKey_j, nKeyMax) \quad (10)$$
$$= nQKey_j - (nKeyMax + 1) \quad \left(\text{if } nQKey_j > \frac{nKeyMax}{2}\right)$$
$$= nQKey_j \quad \left(\text{if } nQKey_j \leq \frac{nKeyMax}{2}\right)$$

Here, j indicates an index of input differential data, $nQKey_j$ indicates an array of integers, and nKeyMax indicates a maximum value among differential data having been through the folding operation. Especially, in a case where most differential data are densely populated along boundaries of the entire region accounted for by all differential data, it is possible to considerably reduce the entire region of all differential data using the divide operation.

After the divide operation, the degree of dispersion is calculated, in which case the size of bits required for encoding is used as a measure of the degree of dispersion so that a minimum value in the size of bits for encoding can be selected.

After the DND operation, a different kind of DND operation, i.e., a divide-up operation or a divide-down operation, is further performed. Whether a divide-up operation or a divide-down operation will be further performed is determined depending on both the size of a positive range of differential data and the size of a negative range of the differential data.

If the range of the differential data having positive values is larger than that of the differential data having negative values, a divide-down operation defined by the following equation is performed.

$$\text{divide} - \text{down}(nQKey_j, nKeyMax) \quad (11)$$
$$= -2(nKeyMax - nQKey_j + 1) + 1 \quad \left(\text{if } nQKey_j > \frac{nKeyMax}{2}\right)$$
$$= nQKey_j \quad \left(\text{if } 0 \leq nQKey_j \leq \frac{nKeyMax}{2}\right)$$
$$= 2 \cdot nQKey_j \quad (\text{if } nQKey_j < 0)$$

On the other hand, if the range of the differential data having negative values is larger than the range of the differential data having positive values, a divide-up operation defined by the following equation is performed.

$$\text{divide} - \text{up}(nQKey_j, nKeyMin) \quad (12)$$
$$= nQKey_j \quad (nQKey_j \geq 0)$$
$$= 2 \cdot nQKey_j \quad \left(\frac{nKeyMin}{2} \leq nQKey_j \leq 0\right)$$
$$= 2(nKeyMin - nQKey_j - 1) + 1 \quad \left(nQKey_j < \frac{nKeyMin}{2}\right)$$

In Equations (11) and (12), j indicates an index of quantized key data, $nQKey_j$ represents an array of integers, nKeyMax indicates a maximum value of $nQKey_j$, and nKeyMin indicates a minimum value of $nQKey_j$.

Figure 10G:
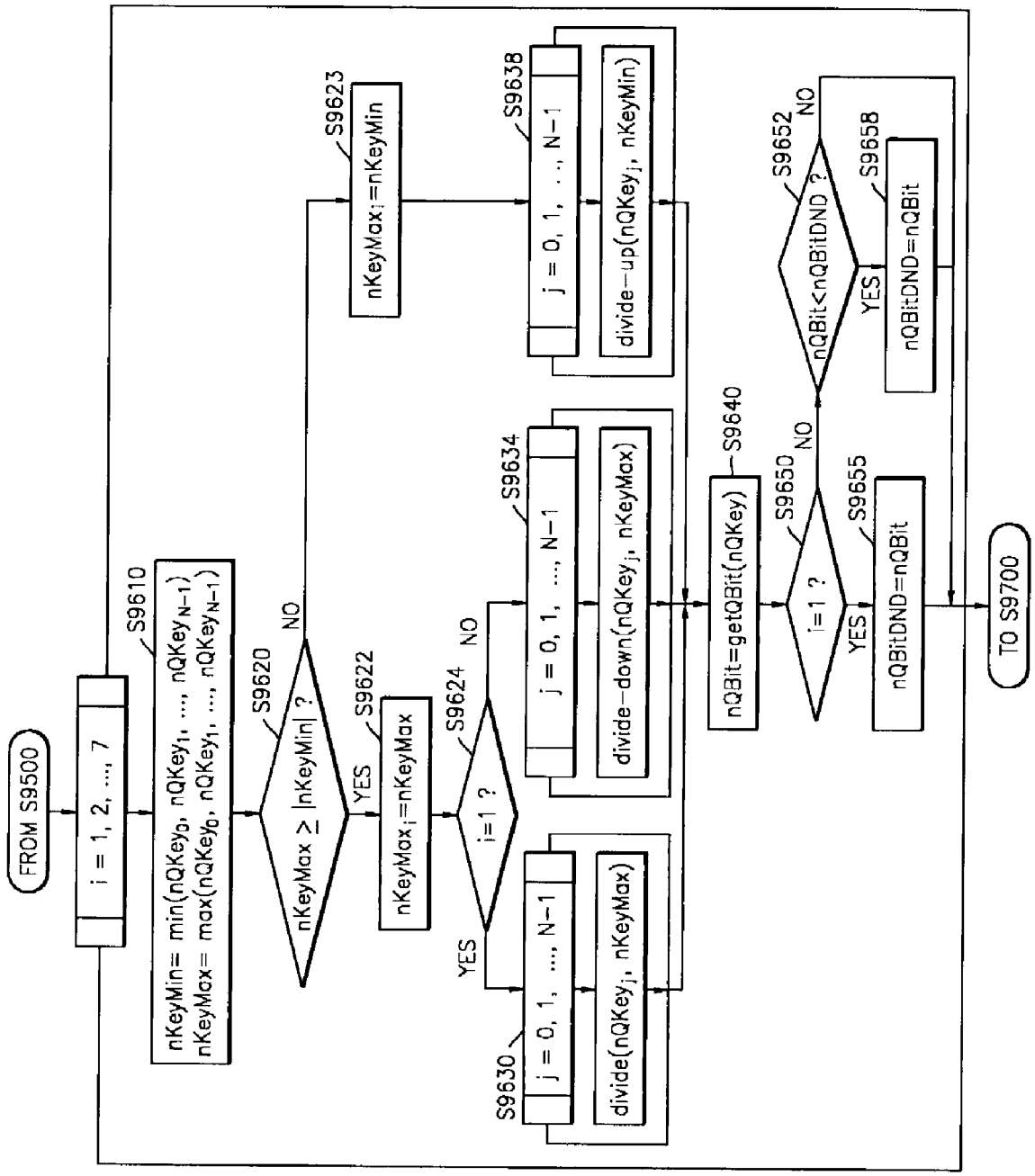

The operation of the DND operator 952 will be described in the following paragraphs with reference to FIG. 10G.

When the differential data of the input key data are input from the folding processor 940, the DND operator 952 obtains the maximum value nKeyMax and the minimum value nKeyMin among the input differential data in step S9610. Then, the DND operator 952 compares the absolute value of nKeyMax with that of nKeyMin in step S9620. If nKeyMax is not smaller than the absolute value of nKeyMin, the DND operator 952 sets nKeyMax as a maximum value in the current cycle of DND operation in step S9622.

The DND operator 952 checks if the order of DND operation is 1, in other words, if the order of DND operation is 1, in step S9624, and if it is, the DND operator 952 performs a divide-up operation on the input differential data in step S9630 substituting the maximum value nKeyMax in Equation (10).

Thereafter, the DND operator 952 measures the size of bits required for encoding the differential data range having been reduced using the divide operation, in step S9640, using function getQBit( ). If the order of DND operation turns out to be 1 in step S9650, the size of bits required for encoding is stored as a value nQBitDND indicating the minimum size of bits for encoding, and the order of DND operation is increased by 1 in step S9655.

Next, the DND processor 952 performs steps S9610 through S9622 again. If the order of DND operation is not 1 in step S9624, the DND operator 952 performs a divide-down operation in step S9634 substituting the maximum value nKeyMax in Equation (11). The DND operator 952 calculates the number of bits required for encoding the differential data having been through the divide-down operation, in step S9640. If the number is smaller than the minimum value nQBitDND stored in the previous cycle of DND operation, it replaces the minimum size of bits required for encoding after the DND operation in step S9658.

If the absolute value of the minimum value nKeyMin appears to be greater than that of the maximum value nKeyMax in step S9620, the maximum value in the current cycle of DND operation is renewed as a minimum value in step S9623, and then a divide-up operation is performed in step S9628 substituting the minimum value for nKeyMin in Equation 12. Thereafter, the DND operator 952 calculates the number of bits for encoding the differential data having been through the divide-up operation in step S9640. If the result of the calculation turns out to be smaller than nQBitDND that has been stored in the previous cycle of DND operation in step S9652, it replaces the minimum number nQBitDND of bits required for encoding after the DND operation in step S9658.

The DND processor 952 performs the DND operation a predetermined number of times, and the number of performance of the DND operation may vary. For example, in the present embodiment, the DND operation is performed 7 times. The DND operator 952 outputs nQBitDND and the differential data corresponding to nQBitDND to the first differential data selector 954. The DND operator 952 outputs the order of DND by which the corresponding differential data have been generated to the header encoder 400 and allows them to be included in the bitstream.

The first differential data selector 954 receives the differential data having been through the shifting operation, the differential data having been through the folding operation, and the differential data having been through the DND operation and determines which differential data among the three will be entropy-encoded.

Referring to FIGS. 10A and 10B, the first differential data selector 954 selects the results of the DPCM and performs a shifting operation on them in step S9710 if the minimum number nQBitDND of bits required for encoding after the DND operation is no smaller than the size nQStep-DPCM of bits for encoding after the DPCM operation in step S9700. Next, the first differential data selector 954 outputs the results of the shifting operation to the entropy encoder 960 and allows them to be entropy-encoded in step S9710. In this case, the order of DND operation is set up as −1, is output to the header encoder 400, and is included in the key header.

However, if it turns out in step S9720 that nQBitDND is smaller than nQStep-DPCM and is not smaller than the size of bits for encoding after the folding operation, the first differential data selector 954 outputs the differential data having been through the folding operation to the entropy encoder 960 and allows them to be entropy-encoded in step S9730, in which case the order of DND operation is set up at 0, is output to the header encoder 400, and thus is included in the key header.

If the number of bits for encoding the differential data after the DND operation is smallest, the first differential data selector 954 outputs the differential data having been through the DND operation to the shift-up operator 956, and then the shift-up operator 956 calculates a first dispersion degree of the differential data input from the first differential data selector 954, in step S9740. Next, the shift-up operator 956 performs a shift-up operation defined by the following equation on the differential data having been through the DND operation, in step S9800 and calculates a second dispersion degree of the results of the shift-up operation in step S9810.

$$\begin{aligned}shift-up(nQKey_j, nKeyMax) \quad &(13)\\ = nQKey_j \quad &(\text{if } nQKey_j \geq 0)\\ = nKeyMax - nQKey_j \quad &(\text{if } nQKey_j < 0)\end{aligned}$$

Here, j indicates an index of differential data of quantized key data, $nQKey_j$ indicates an array of integers, and nKeyMax indicates a maximum value among differential data.

When the differential data having been through the DND operation and the differential data having been through the shift-up operation are input, the second differential data selector 958 compares the first dispersion degree with the second dispersion degree in step S9900. If the second dispersion degree is smaller than the first dispersion degree, the second differential data selector 958 outputs the differential data having been through the shift-up operation to the entropy-encoder 960 and allows them to be entropy-encoded in step S9910. The second differential data selector 958 outputs the maximum and minimum values nKeyMax and nKeyMin used in the DND operation, and the maximum value nKeyMax used in the shift-up operation to the header encoder 400 and allows them to be included in the key header.

However, if the first dispersion degree is smaller than the second dispersion degree, the second differential data selector 958 outputs the differential data having been through the DND operation to the entropy encoder 960 and allows them to be entropy-encoded in step S9920. Then, the second differential data selector 958 outputs only the maximum and minimum values nKeyMax and nKeyMin used in the DND operation to the header encoder 400. In a preferred embodiment of the present embodiment, standard deviation may be used as a measure of the first and second dispersion degrees.

The entropy encoder 960 performs two different functions on differential data depending on the characteristics of the differential data. For example, differential data having been through a DPCM operation and a shifting operation and differential data having been through only a divide operation have both positive and negative values, and thus it is required to perform a process of encoding the sign of each of the differential data as well as the differential data themselves. On the other hand, since differential data having been through a folding operation only have positive values, a process of encoding only the differential data is performed.

In a preferred embodiment of the present embodiment, function encodeSignedAAC is used for encoding the differential data and their signs as well, and function encodeUnsignedAAC is used for encoding only differential data.

Figure 11:
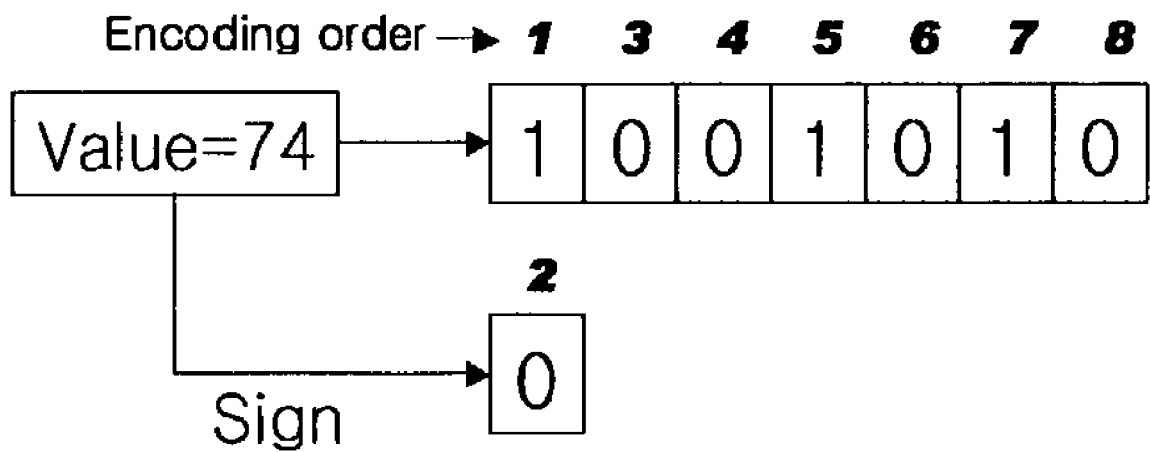
FIG. 11 is a diagram illustrating an example of a function encodeSignedAAC.
Figure 11:
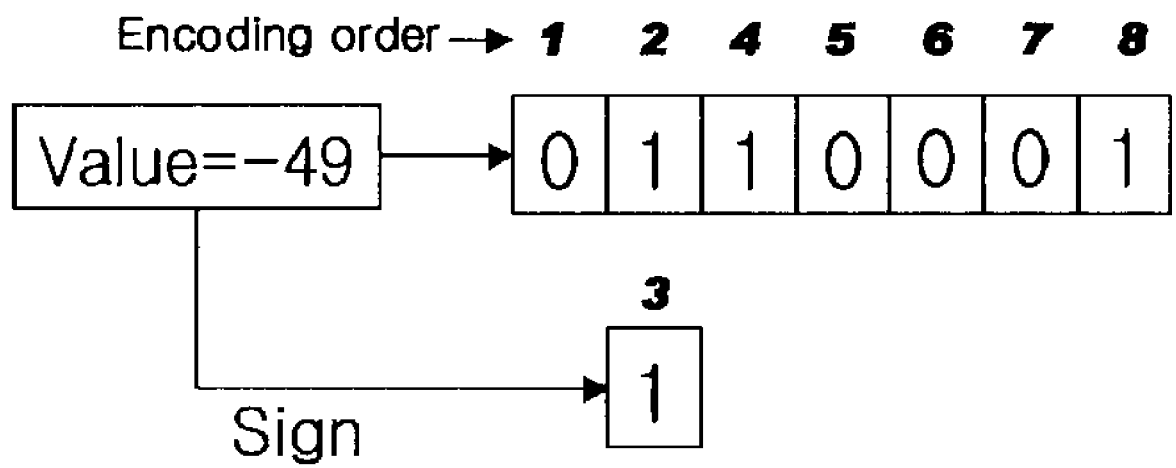

FIG. 11 is a diagram of an example of function encodeSignedAAC. Referring to FIG. 11, when an input value is 74 and the number of bits for encoding the input value is 8, its sign is 0, and it is the same as a binary number of 1001010. Signs and all bit planes are encoded in the following way:

First step: a binary number is encoded on every bit plane in an order of from its most significant bit (MSB) to its least significant bit (LSB);

Second step: it is checked if the bit which is currently being encoded is 0;

Third step: if the bit currently being encoded is not 0, the sign of the binary number is encoded next; and Fourth step: the remaining bits of the binary number are encoded.

Function encodeUnsignedAAC encodes values not having a sign as an adaptive arithmetic encoding bitstream using a context regarding the values. This function is almost the same as function encodeSignedAAC except that there exists a sign context.

FIGS. 12A through 12J are graphs showing key data which have been subjected to operations according to a preferred embodiment of the present embodiment. In FIGS. 12A through 12J, the horizontal axis represents indexes of each of the key data, and the vertical axis represents the values of the key data.

Figure 12A:
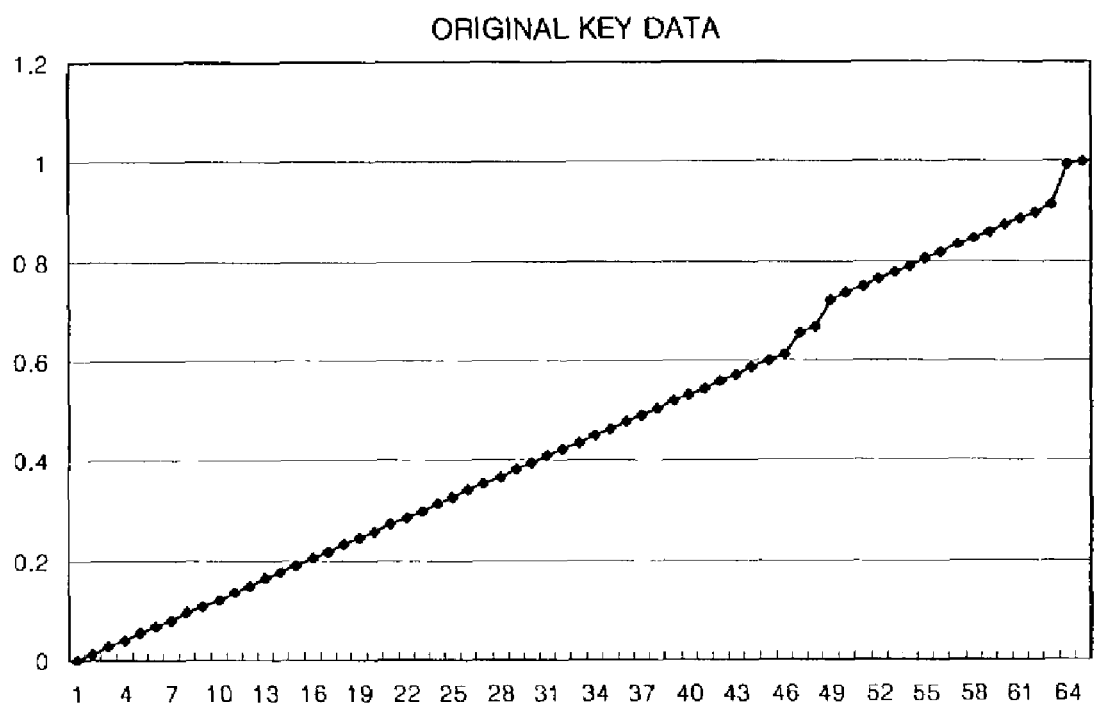
FIGS. 12A through 12J are diagrams illustrating key data obtained by performing encoding operations according to a preferred embodiment of the present embodiment.
Figure 12B:
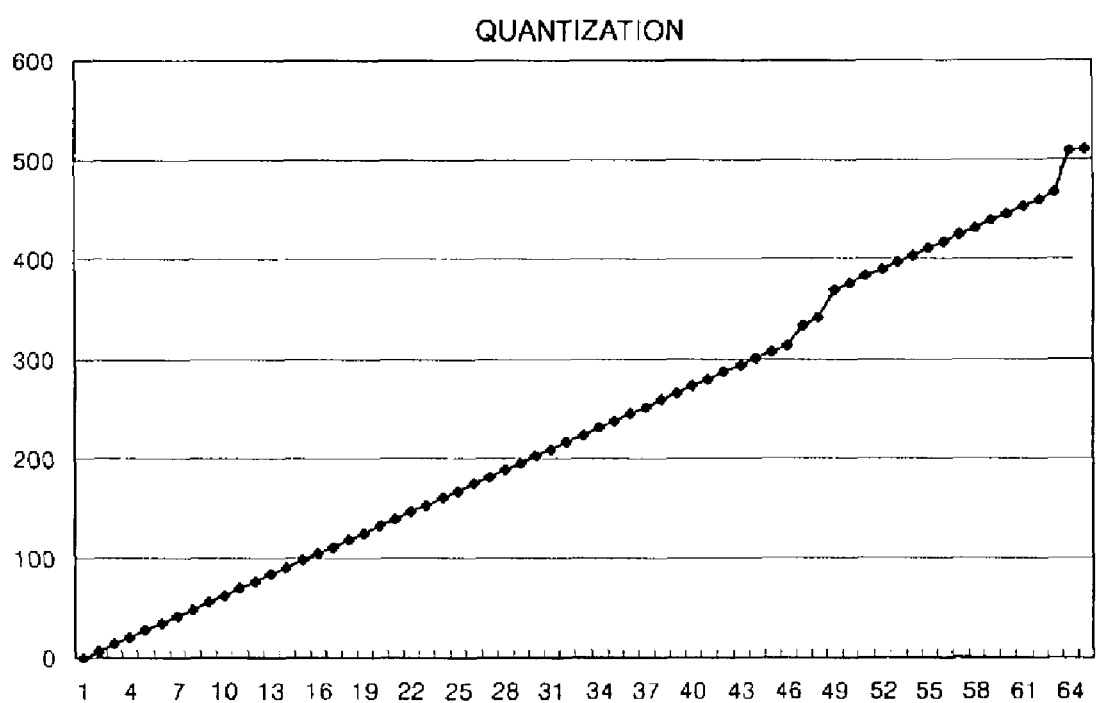
Figure 12C:
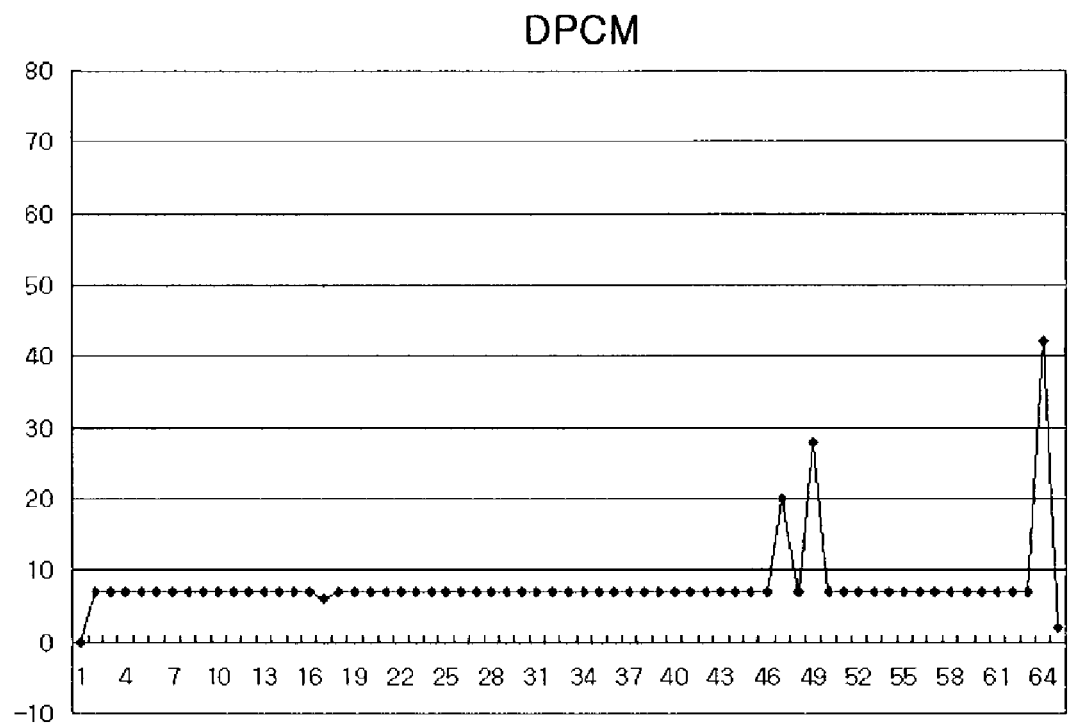

FIG. 12A is a graph showing original key data input into the encoder of the present embodiment. The key data shown in FIG. 12A are output to the quantizer 910 and then are quantized with nine quantization bits so that quantized key data shown in FIG. 12B are obtained. If DPCM is performed on the quantized key data shown in FIG. 12B, differential data shown in FIG. 12C are obtained.

Figure 12D:
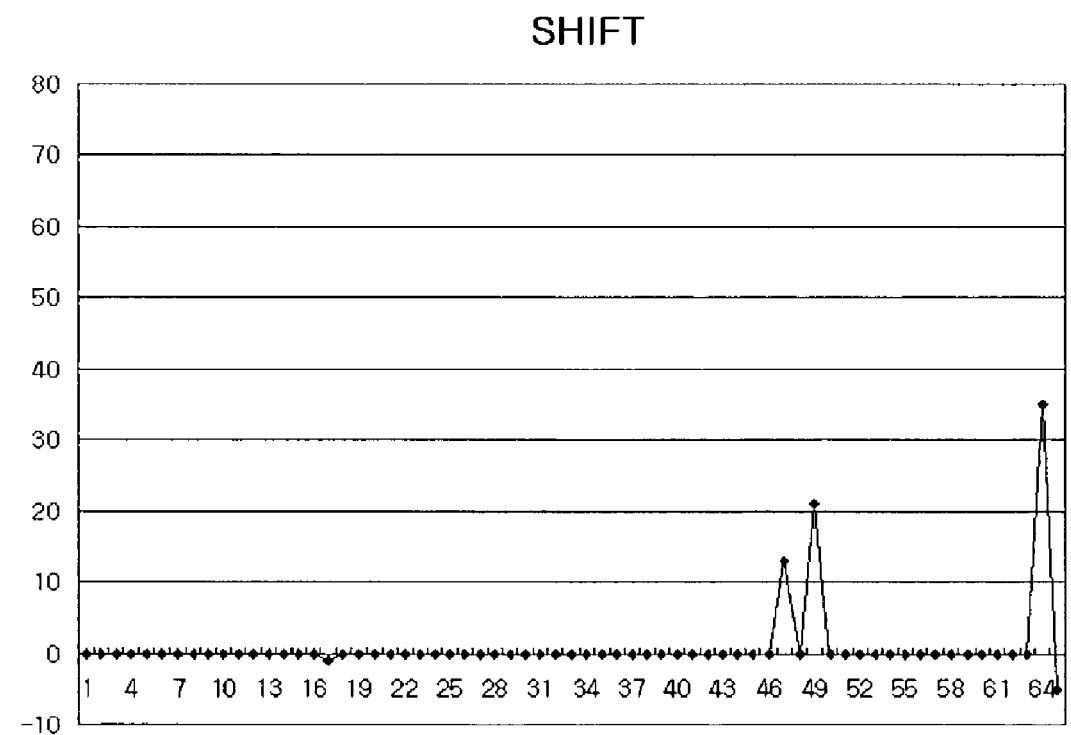

Next, the differential data of the quantized key data are shifted using a mode value of about 7 so that differential data shown in FIG. 12D are obtained. Thereafter, if a folding operation is performed on the shifted differential data, data having only positive values can be obtained, as shown in FIG. 12E.

Figure 12E:
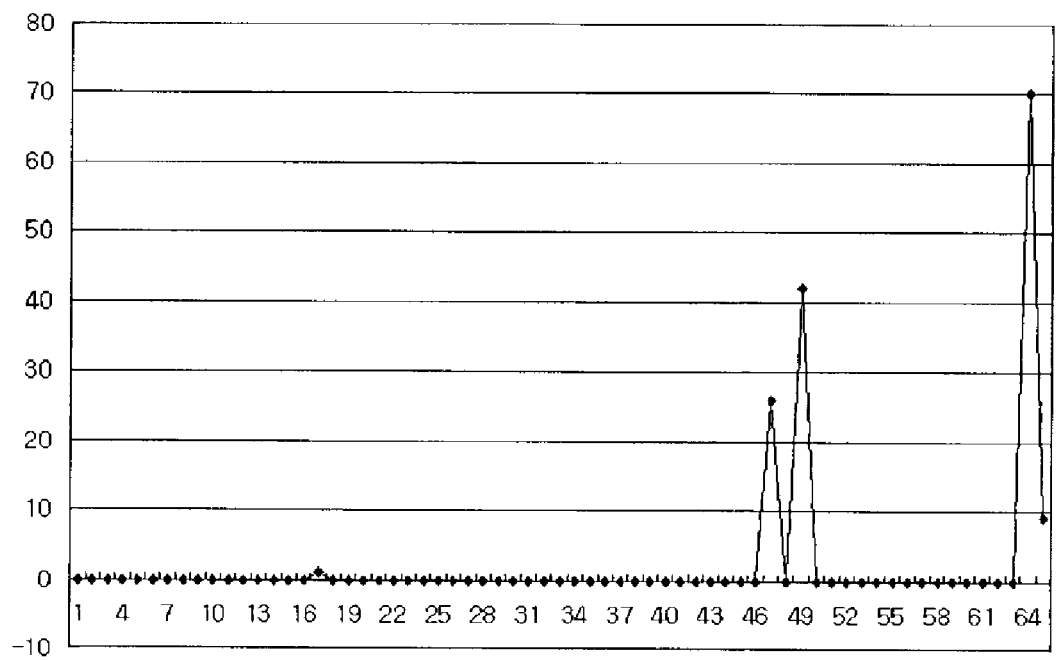
Figure 12F:
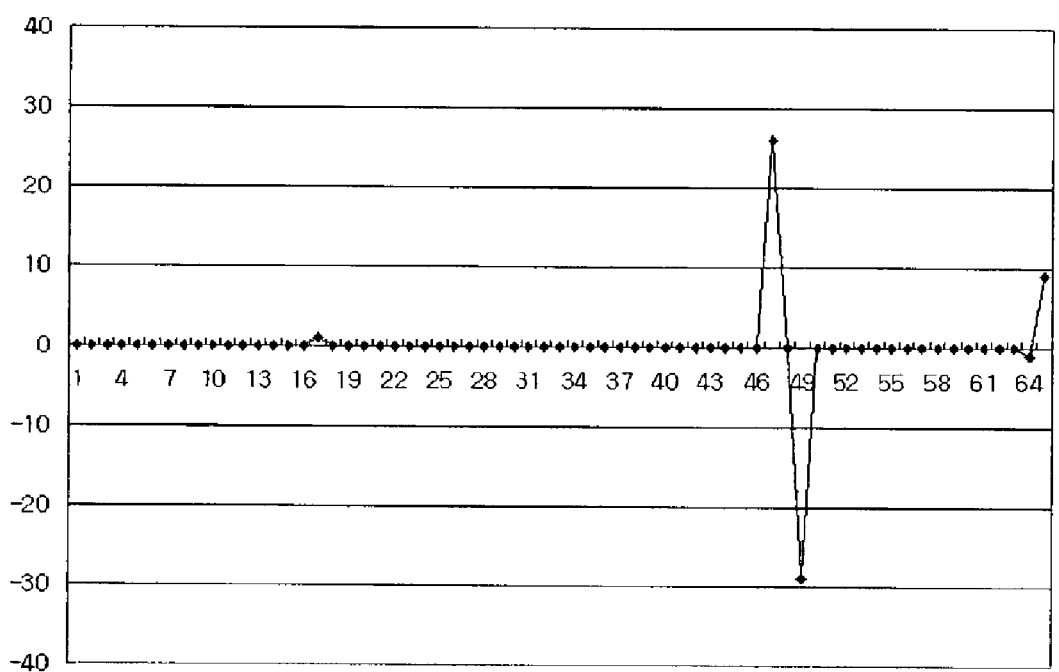
Figure 12G:
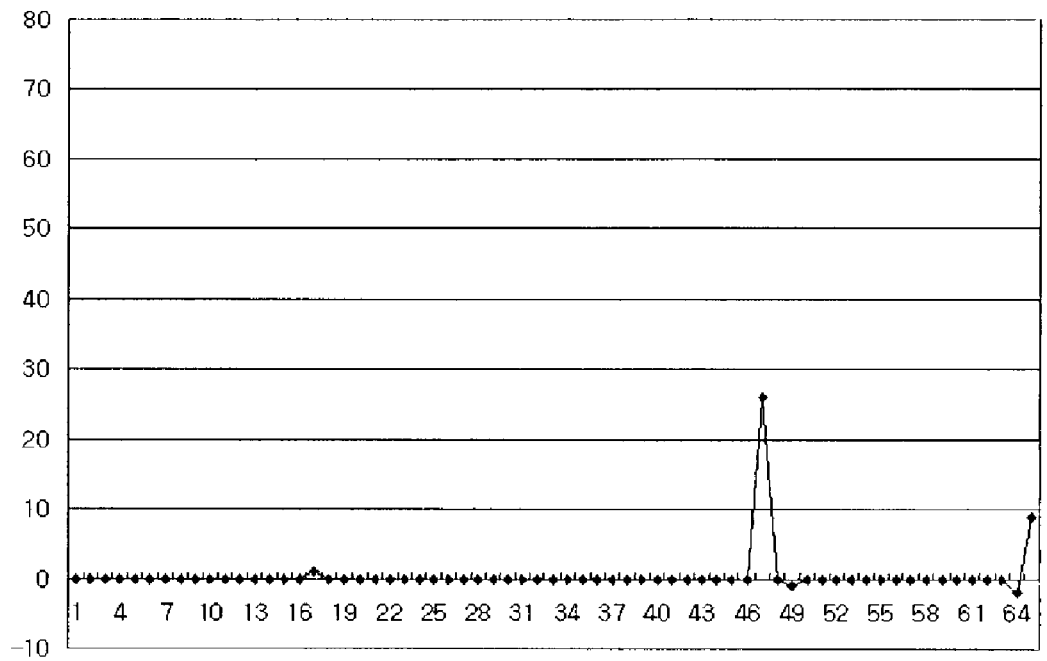
Figure 12H:
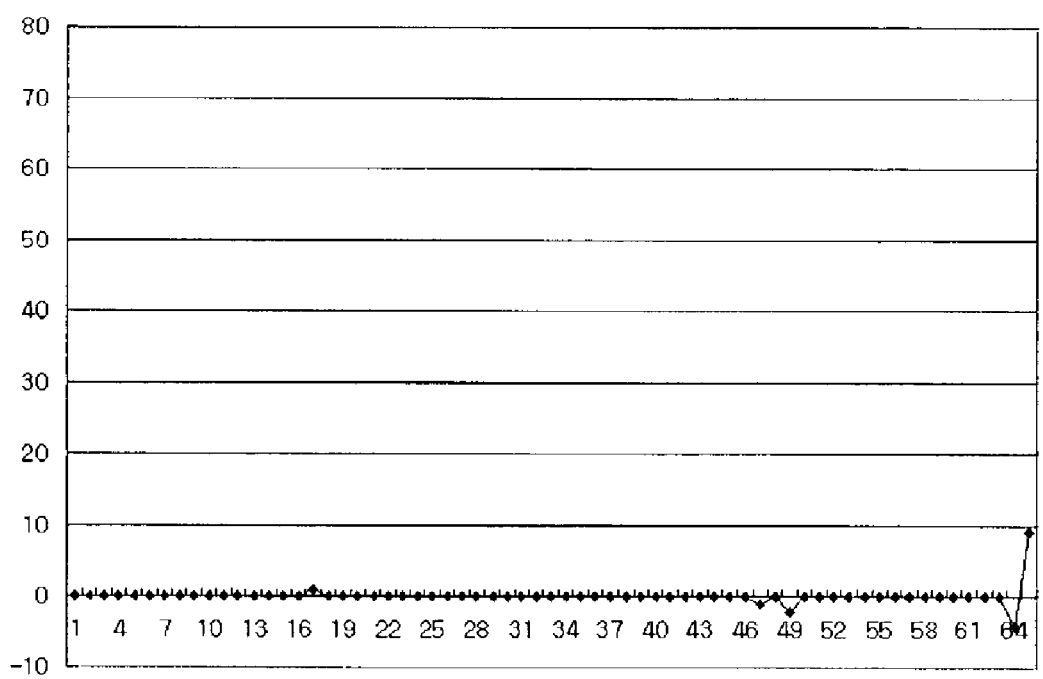

The results of performing a DND operation on the folded data shown in FIG. 12E are shown in FIGS. 12F through 12H. In particular, the results of performing a divide operation on the folded data are shown in FIG. 12F. As shown in FIG. 12F, positive key data values range from 0 to 28, and negative key data values range from −29 to 0, which means that the range of negative key data values is greater than that of positive key data values. Accordingly, it is required to perform a divide-up operation on the data shown in FIG. 12F, and the results of the divide-up operation are shown in FIG. 12G.

Figure 12I:
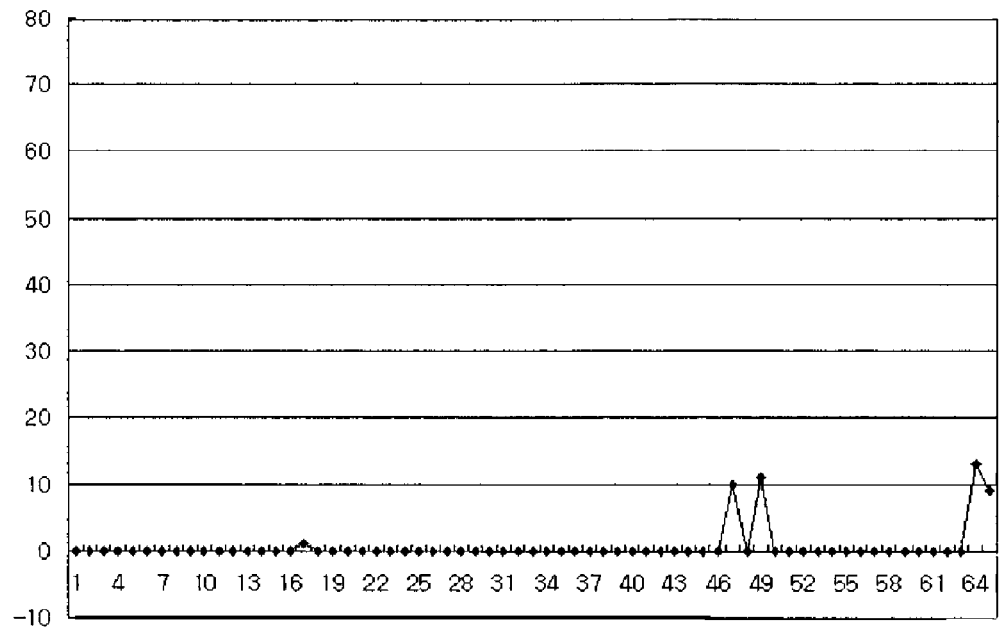

As a result of the divide-up operation, the range of negative key data values is considerably reduced so that it is much smaller than the range of positive key data values. In a subsequent cycle of DND operation, a divide-down operation is performed on the results of the divide-up operation. FIG. 12H is a diagram showing the results of performing a divide-down operation on the differential data shown in FIG. 12G. The results of performing a shift-up operation on the key data shown in FIG. 12H are shown in FIG. 12I.

Figure 12J:
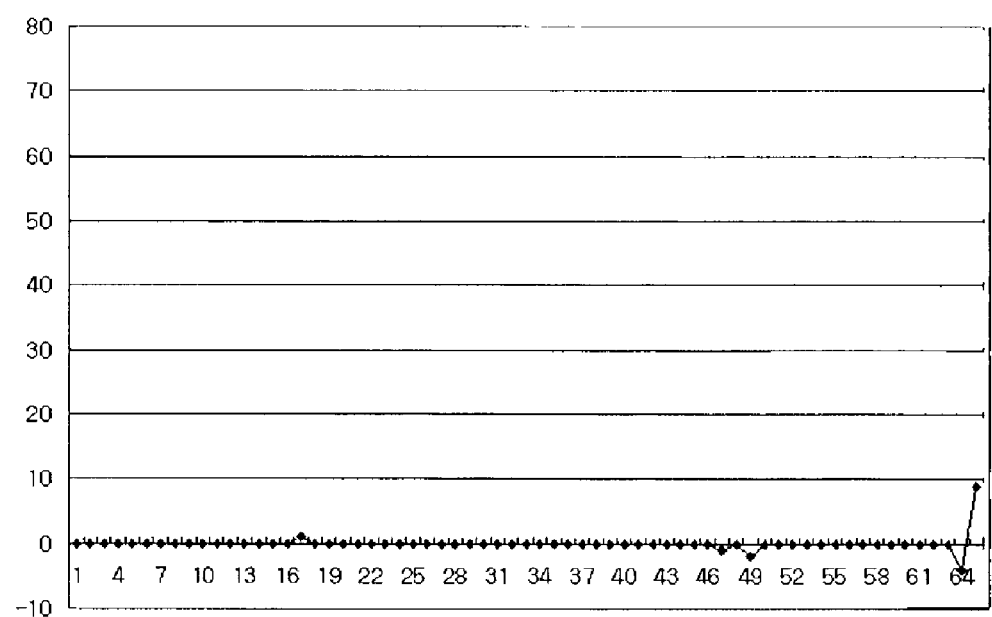

As shown in FIGS. 12A through 12G, the range of key data and differential data gradually decreases. However, as shown in FIGS. 12H and 12I, the range of differential data is increased greater after the shift-up operation than before, which shows that the differential data having been through the divide-down operation, as shown in FIG. 12H, are the ones that are to be finally encoded, as shown in FIG. 12J.

The information encoded in the header encoder 400 and stored in the key header will be described in the following paragraphs.

When key data to be encoded are input, the header encoder 400 encodes the digit number of key data and the number of keys to be encoded. Next, the header encoder 400 receives information on whether or not there exists a linear key data region that has been through the linear key encoding in the input key data and the number of key data in the linear key data region from the linear key encoder 900 and receives the beginning and ending key data of the linear key data region that has been through the floating-point number conversion from the floating-point number converter 905.

In a case where the floating-point number converter 905 receives maximum and minimum values which can bring about a minimum quantization error and converts them into floating-point numbers, the converted maximum and minimum values are input into the header encoder 400 from the floating-point number converter 905 so that they can be used again for inverse quantization. In addition, the size of quantization bits is also input into the header encoder 400 and is included in the header.

The header encoder 400 receives the order of DPCM and intra key data in each cycle of DPCM from the DPCM processor 920 and receives a mode value which has been used for a shifting operation from the shifter 930. In addition, the header encoder 400 receives from the DND processor 950 information on whether or not a shift-up operation has been performed, the order of DND by which the dispersion degree of differential data can be minimized, and maximum and minimum values in each cycle of DND operation. Finally, the header encoder 400 receives the number of bits used for encoding from the entropy encoder 960 and encodes it as a key header.

Hereinafter, the structure and operation of the key value data encoder 300 will be described with reference to FIGS. 13A through 18B.

Figure 13A:
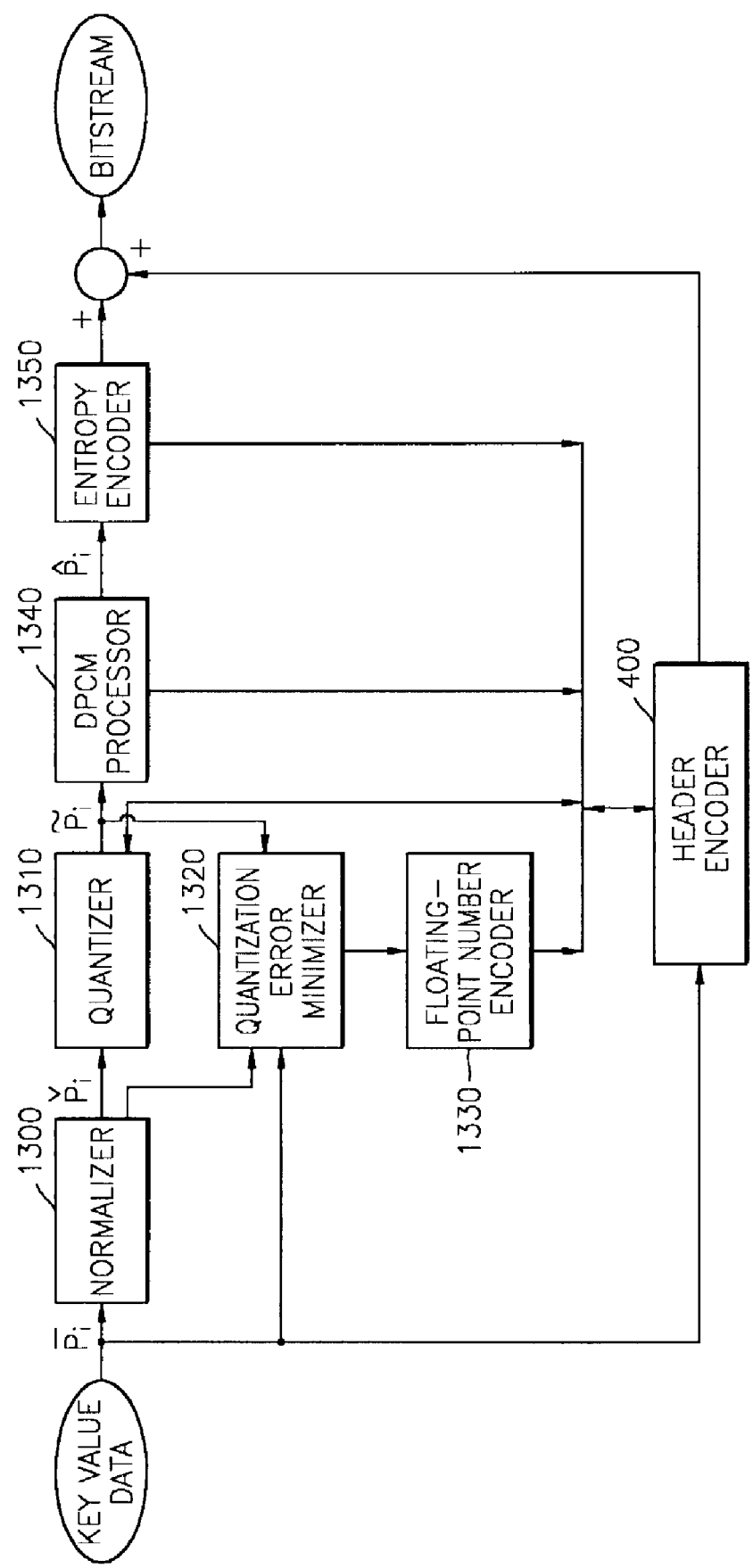
FIG. 13A is a block diagram of a key value data encoder according to a preferred embodiment of the present embodiment.
Figure 14A:
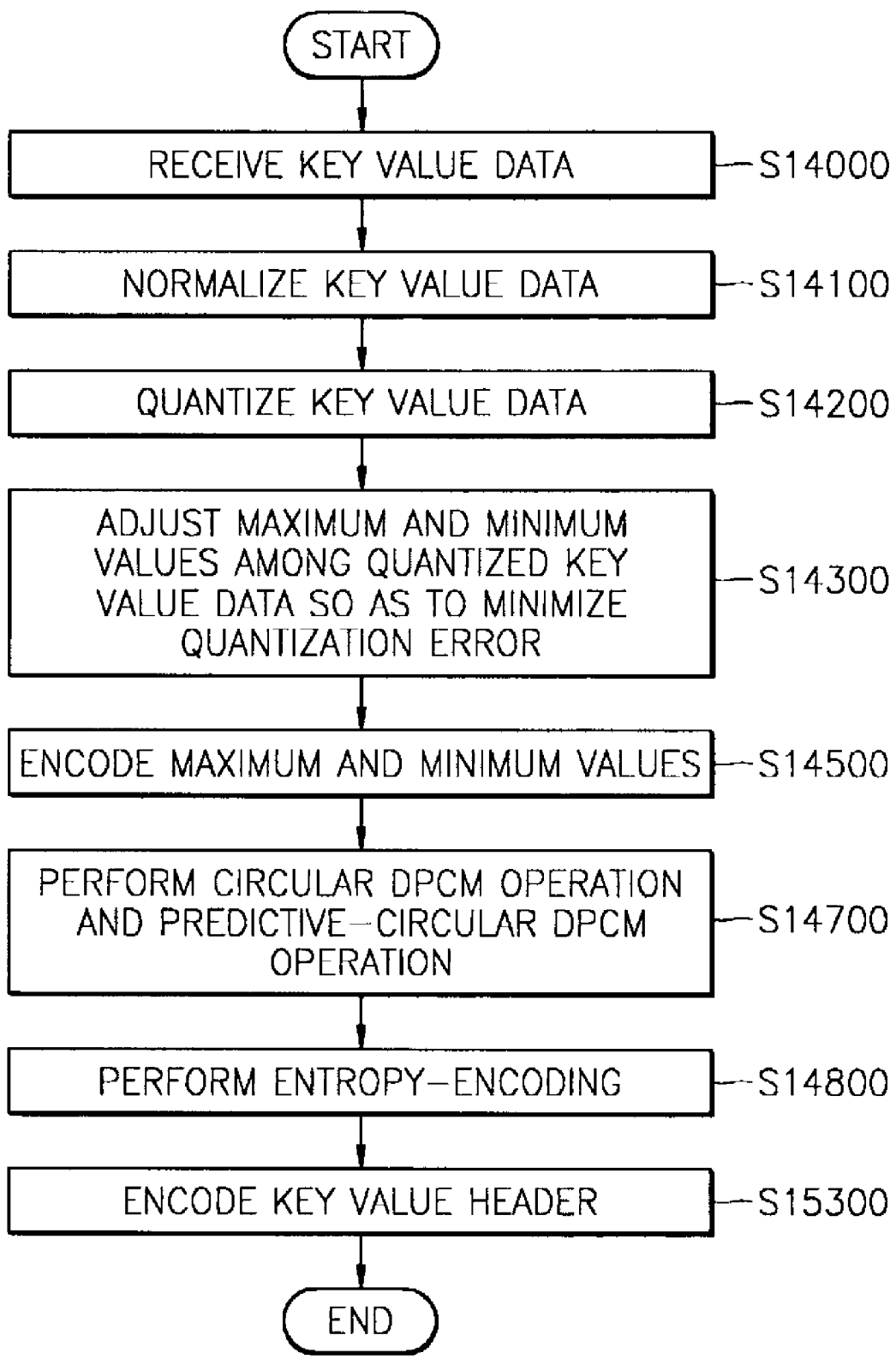
FIGS. 14A through 14H are flowcharts of a method of encoding key value data according to a preferred embodiment of the present embodiment.
Figure 14B:
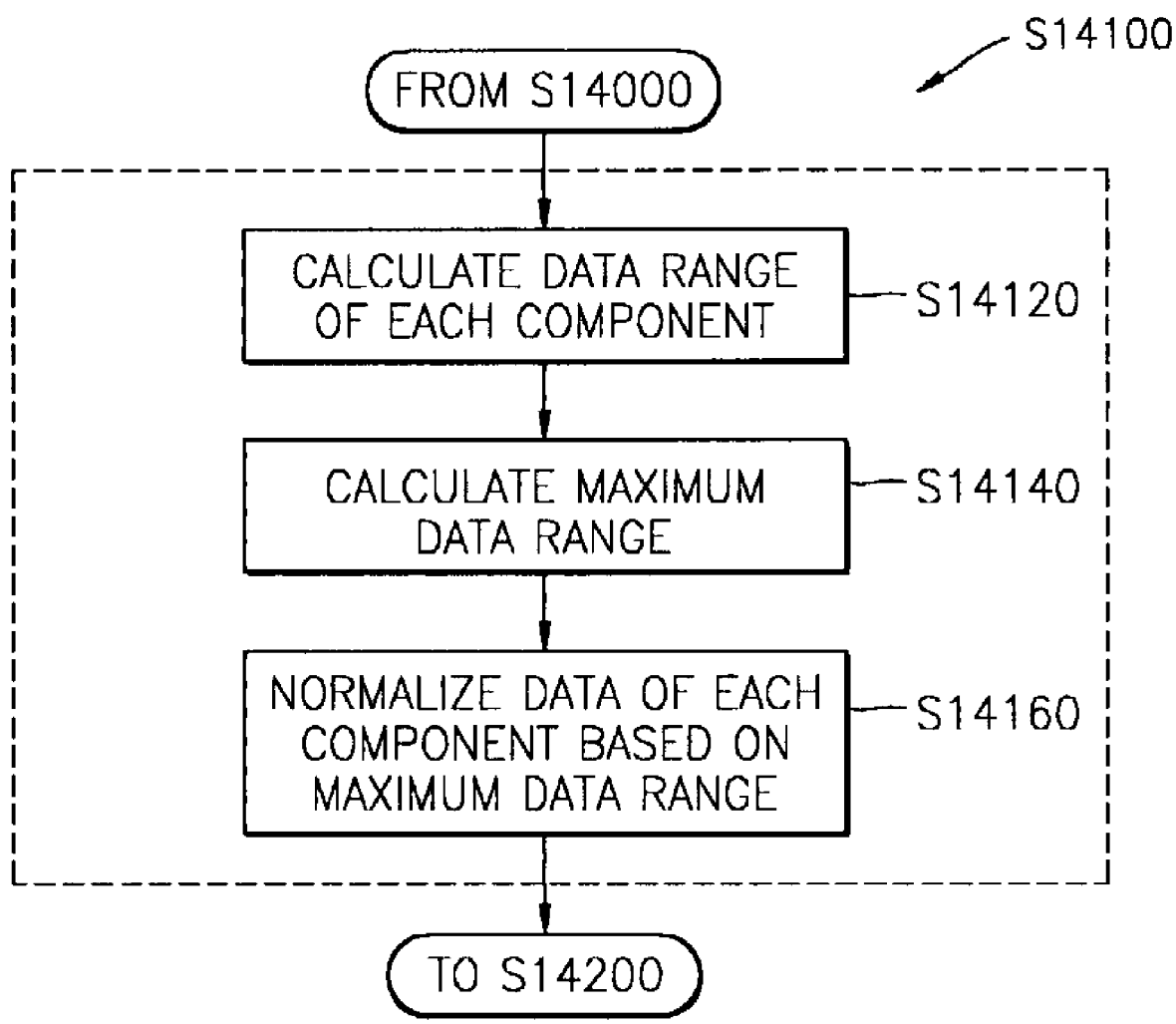

FIG. 13A is a block diagram of an example of the key value data encoder 300 according to a preferred embodiment of the present embodiment, and FIG. 14A is a flowchart of a method of encoding key value data according to a preferred embodiment of the present embodiment.

Referring to FIG. 13A, the key value data encoder 300 includes a normalizer 1300, which normalizes key value data of each component input thereinto based on a maximum data range among data ranges of all the components, a quantizer 1310, which quantizes the normalized key value data using a predetermined number of quantization bits, a quantization error minimizer 1320, which receives the minimum values and the maximum range from normalizer, adjusts maximum and minimum values so as to minimize a quantization error and outputs the adjusted maximum and minimum values, a floating-point number converter 1330, which receives the minimum values and the maximum range from the quantization error minimizer 1320, converts the adjusted maximum range and minimum values into floating-point numbers in the decimal system, a DPCM processor 1340, which obtains differential data and predicted differential data of the quantized key value data and performs a circular quantization operation on the differential data and the predicted differential data so as to reduce their ranges, and an entropy encoder 1350, which entropy-encodes differential data and outputs a bitstream, into which key value data are encoded.

The operation of the key value data 300 will be described in the following paragraphs with reference to FIG. 14A.

The normalizer 1300 receives data of each component (x, y, and z) in step S14000 and calculates data ranges of the x, y, and z components in step S14120, following Equation (14). Then, the normalizer 1300 calculates a maximum data range among the data ranges of the x, y, and z components by comparison in step S14140.

$$Max_j = Max_{i=0}^n(\overline{P}_{ij})$$

$$Min_j = Min_{i=0}^n(\overline{P}_{ij})$$

$$Range_{max} = Max(Max_x - Min_x, Max_y - Min_y, Max_z - Min_z) \quad (14)$$

Thereafter, the normalizer 1300 normalizes the data of each of the x, y, and z components in step S14160, using the following equation.

$$\breve{P}_{ij} = \frac{\overline{P}_{ij} - Min_j}{Range_{max}} \quad (15)$$

In Equations (14) and (15), n represents the number of data, i=0, 1, ..., n−1, and j represents each of the components x, y, and z.

As shown in Equation (15), the x, y, and z components are normalized using the maximum data range $Range_{max}$ among their data ranges. As a result of such normalization, the redundancy of data regarding components not having the maximum data range $Range_{max}$ increases, and accordingly, the efficiency of encoding data also increases.

The normalizer 1300 outputs minimum values x_min, y_min, and z_min among the key value data of each of the components and a maximum value max among all the key value data of the components, information nWhichAxis on a component, from which the maximum value max comes, and a digit number nKeyValueDigit of original key value data to the floating-point number encoder 1330 so as to make these pieces of information be included in a bitstream as a key value header. The normalizer 1300 outputs the normalized key value data to the quantizer 1310.

The normalized key value data of each of the components x, y, and z are input into the quantizer 1310, and then the quantizer 1310 quantizes the normalized key value data using a predetermined number of quantization bits nQuantBit, in step S14200.

$$\tilde{P}_{i,j} = floor(\breve{P}_{i,j} \times 2^{nQuantBit} - 1) + 0.5) \quad (16)$$

In Equation (16), a function floor( ) is used to convert an input floating-point number into a maximum integer of no greater than the input floating-point number. The quantizer 1310 outputs the quantized key value data to the DPCM processor 1340 and the quantization error minimizer 1320.

Figure 13B:
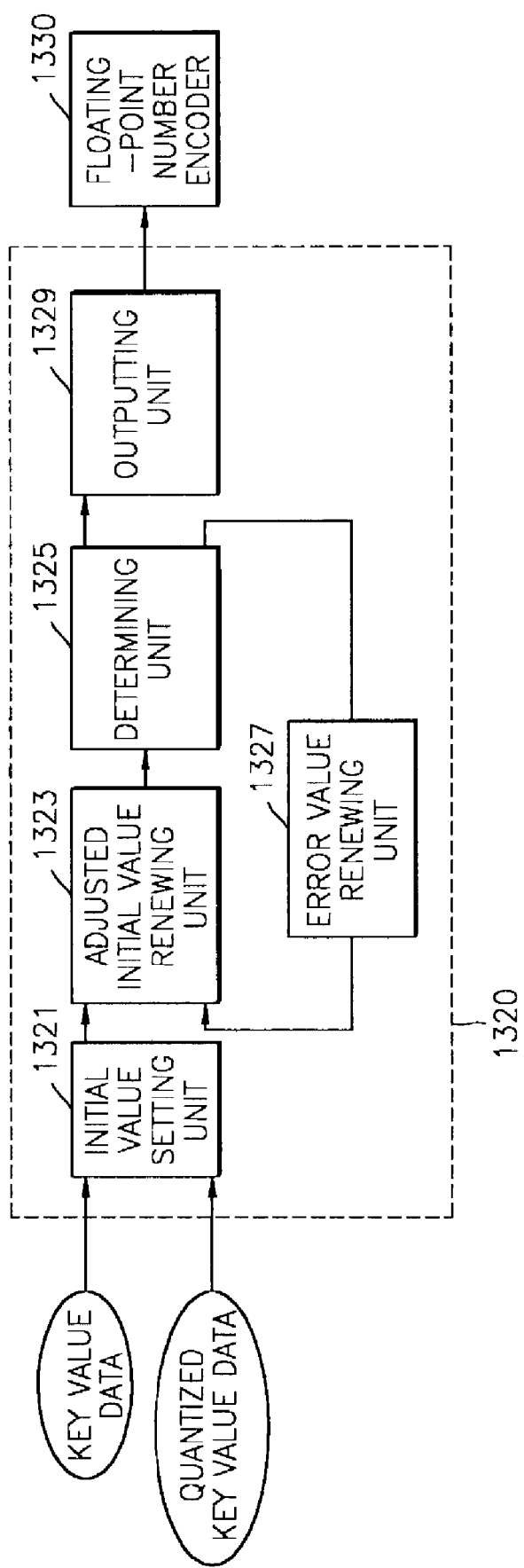
FIG. 13B is a block diagram of a quantization error minimizer shown in FIG. 13A.

FIG. 13B is a block diagram of an example of the quantization error minimizer 1320 according to a preferred embodiment of the present embodiment. Referring to FIG. 13B, the quantization error minimizer 1320 includes an initial value setting unit 1321 which sets a minimum error value $e_{min}$, an adjusted minimum value min', and a quantization error minimizing value $min_{min}$, an adjusted minimum value renewing unit 1323 which renews the adjusted minimum value min' by performing a predetermined operation, a determining unit 1325 which determines the quantization error minimizing value $min_{min}$ as a minimum value to be used for inverse quantization based on the digit number and value of the renewed adjusted minimum value, an error value renewing unit 1327 which calculates a quantization error value using the renewed adjusted minimum value, renews the adjusted minimum value min' and the calculated error value into the quantization error minimizing value $min_{min}$ and the minimum error value $e_{min}$, respectively, if the calculated error value is smaller than the minimum error value $e_{min}$, and outputs the results of the renewal to the adjusted minimum value renewing unit 1323.

The quantization error minimizer 1320 is similar to the quantization error minimizer 915 in terms of the fact that the quantization error minimizer 1320 controls a quantization range so as to minimize a quantization error by performing quantization and inverse quantization on input data.

Figure 14C:
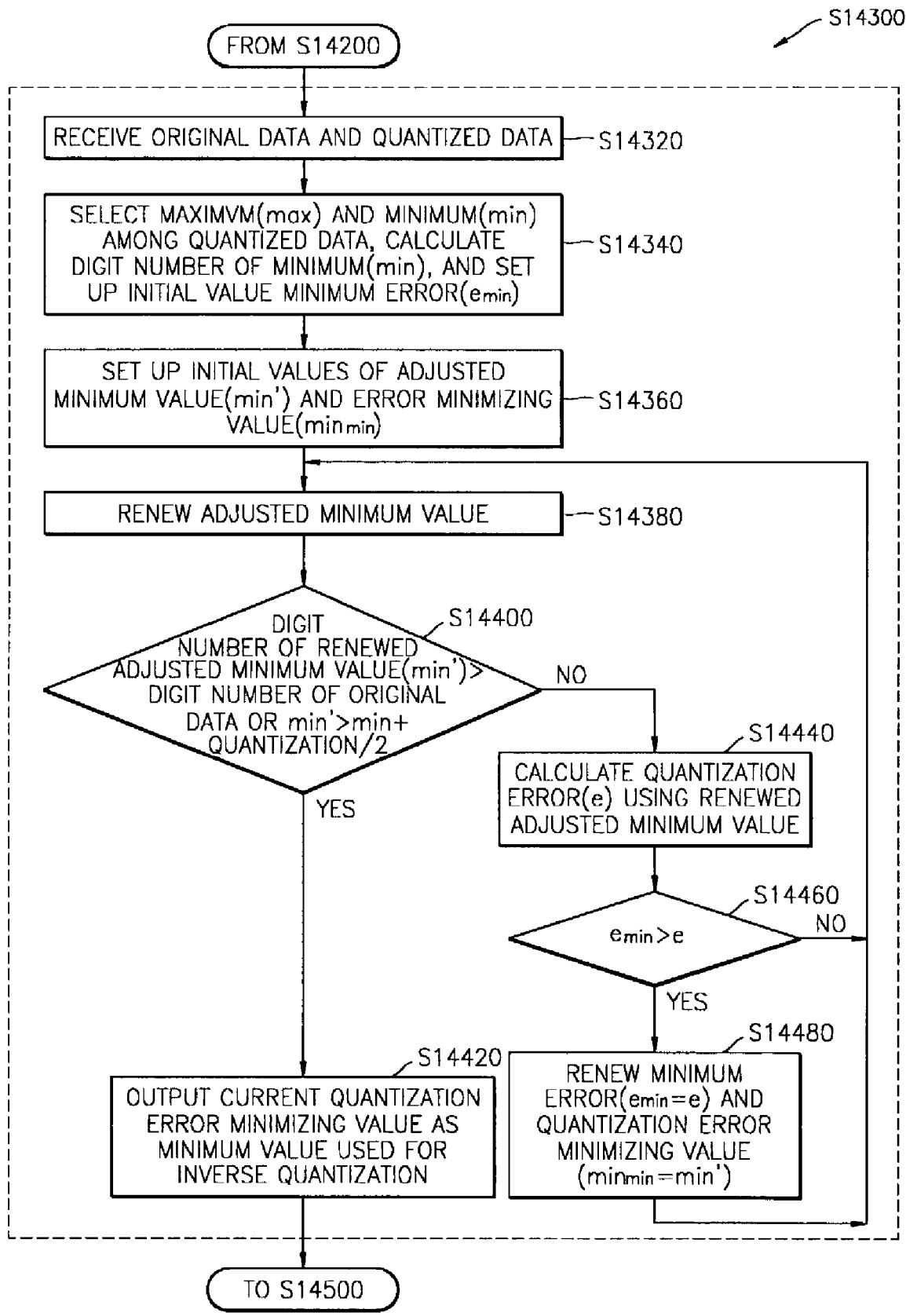

Hereinafter, the operation of the quantization error minimizer 1320 according to the present embodiment will be described with reference to FIG. 14C.

The initial value setting unit 1321 receives the same data as data input into the quantizer 1310 as well as quantized data output from the quantizer 1310 in step S14320.

The initial value setting unit 1321 obtains a maximum value max and a minimum value min from among the input data and calculates the digit number of the minimum value min. Next, the initial value setting unit 1321 calculates a quantization error e by inverse-quantizing the quantized data using the maximum value max and the minimum value min and sets the quantization error e as an initial minimum error value $e_{min}$ in step S14340.

The initial value setting unit 1321 subtracts the result of dividing a quantization step size QuantSpace by 2 from the minimum value min among the input data and sets the result of the subtraction as an initial adjusted minimum value min'. Then, the initial value setting unit 1321 sets the initial adjusted minimum value min' as a quantization error minimizing value $min_{min}$ and outputs the adjusted minimum value min' to the adjusted minimum value renewing unit 1323 in step S14360.

The adjusted minimum value renewing unit 1323 renews the adjusted minimum value min' input from the initial value setting unit 1321 by performing a predetermined operation. According to a preferred embodiment of the present embodiment, the adjusted minimum value renewing unit 1323 renews the adjusted minimum value min' input from the initial value setting unit 1321 following Equation (17) and outputs the renewed adjusted minimum value min' to the determining unit 1325 in step S14380.

$$min' = \frac{Mantissa(min') + 1}{10^{Exponent(min')}} \quad (17)$$

The determining unit 1325 calculates the digit number of the renewed adjusted minimum value min', compares the result of the calculation with the digit number of the minimum value min among the input data, which is calculated by the initial value setting unit 1321, and compares the renewed adjusted minimum value min' with the result of adding the minimum value min among the input data to the result of dividing the quantization bit size QuantSpace by 2, in step S14400.

If the digit number of the renewed adjusted minimum value min' is greater than the digit number of the minimum value min among the input data, or if the renewed adjusted minimum value min' is greater than $$\min + \frac{QuantSpace}{2},$$

the determining unit 1325 determines the currently stored quantization error minimizing value $\min_{min}$ as a minimum value to be used for inverse quantization and outputs the quantization error minimizing value $\min_{min}$ to the outputting unit 1329. If the digit number of the renewed adjusted minimum value min' is not greater than the digit number of the minimum value min among the input data and the renewed adjusted minimum value min' is not greater than $$\min + \frac{QuantSpace}{2},$$

the determining unit 1325 outputs the renewed adjusted minimum value min' to the error value renewing unit 1327.

The error value renewing unit 1327 inverse-quantizes the quantized data using the renewed adjusted minimum value min' and the maximum value max obtained by the initial value setting unit 1321 and calculates the quantization error e in step S14440.

The error value renewing unit 1327 compares the newly calculated error value e with the minimum error value $e_{min}$ in step S14460. As a result of the comparison, if the newly calculated error value e is smaller than the minimum error value $e_{min}$, the error value renewing unit 1327 renews the minimum error value $e_{min}$ with the newly calculated error value e and renews the quantization error minimizing value $\min_{min}$ with the renewed adjusted minimum value min' in step S14480. On the other hand, if the newly calculated error value e is greater than the minimum error value $e_{min}$, the error value renewing unit 1327 performs step S14380 again without renewing the minimum error value $e_{min}$ and the quantization error minimizing value $\min_{min}$.

The maximum and minimum values used for minimizing a quantization error, which are obtained through the above-mentioned processes, are output to the floating-point number converter 1330 and are encoded as header information. Then, the header information is included in a bitstream generated by the entropy encoder 1350.

Figure 14D:
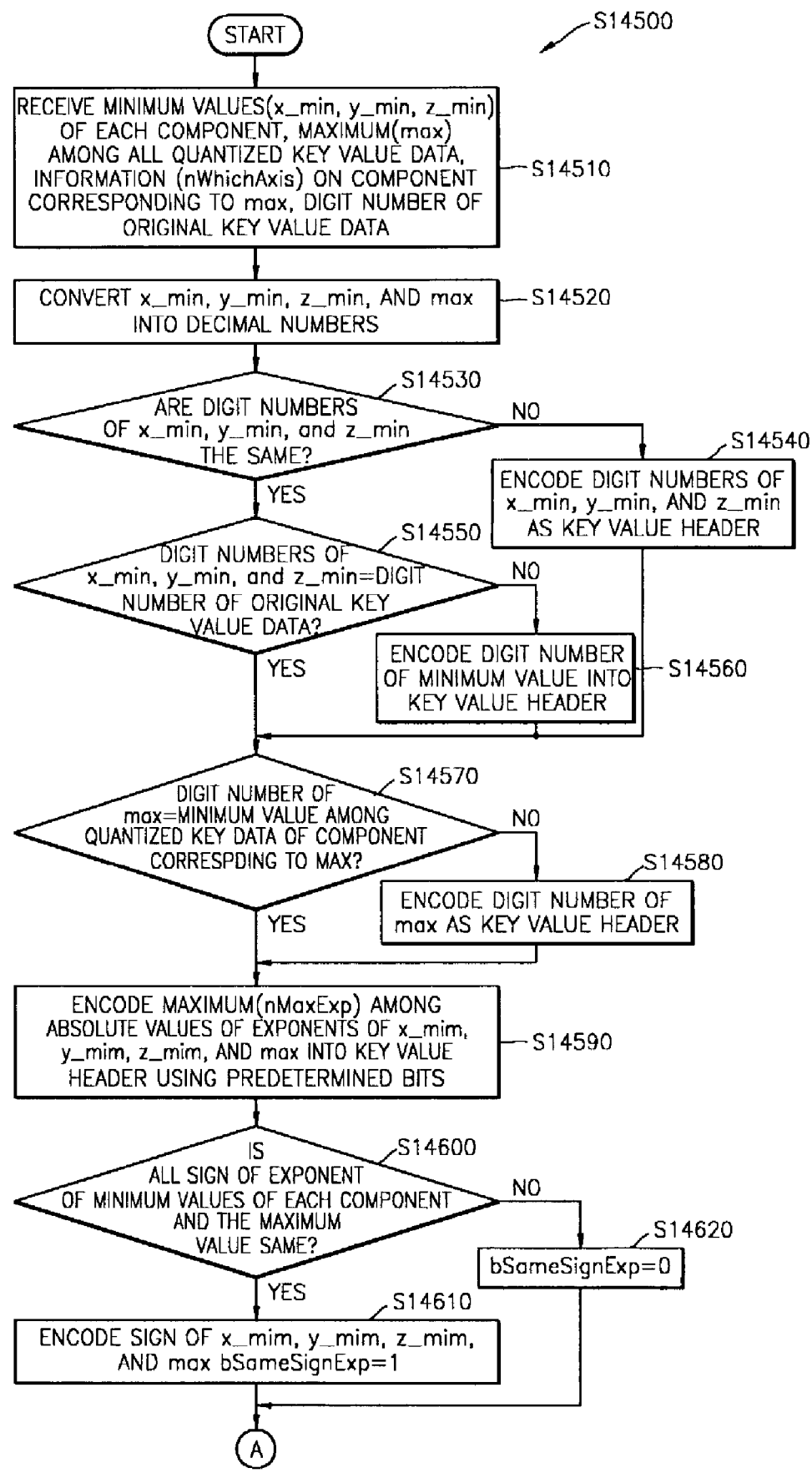

Hereinafter, step S14500 performed in the floating-point number converter 1330 will be described with reference to FIG. 14D. The function of the floating-point number converter 1330 is similar to that of the floating-point number converter 905 shown in FIG. 9A.

The floating-point number encoder 1330 receives the minimum values x_min, y_min, and z_min among the key value data of each of the x, y, and z components, the maximum value max of the component which has the maximum range, the information nWhichAxis on which component a maximum value max belongs to, and the digit number nKeyValueDigit of the original key value data in step S14510.

In order to enhance the efficiency of encoding key value data by decreasing the number of bits required for encoding, the floating-point number encoder 1330 converts x_min, y_min, z_min, and max, which are represented by binary numbers, into decimal numbers following Equation (4), in step S14520.

The floating-point number encoder 1330 checks if the digit numbers of x_min, y_min, and z_min are the same in step S14530. If they are not the same, they are output to the header encoder 400 and are encoded as header information in step 14540.

If the digit numbers of x_min, y_min, and z_min are the same, the floating-point number encoder 1330 checks if they are the same as the digit number of the original key value data in step S14550. If [[they]] digit numbers of x_min, y_min, and z_min are not the same as the digit number of the original key value data, only one of the digit numbers of x_min, y_min, and z_min is output to the header encoder 400 and are encoded as header information in step S14560.

Thereafter, the floating-point number encoder 1330 checks among which component key value data the maximum value max among all the key value data of the x, y, and z components is selected from and determines whether or not the digit number of max is the same as the digit number of a minimum value among the key value data of the component, from which the maximum value max comes, in step S14570.

If the digit number of max is not the same as the digit number of the minimum value among the key value data of the component, from which the maximum value max comes, it is output to the header encoder 400 and is encoded as header information. On the other hand, if the digit number of max is the same as the digit number of the minimum value among the key value data of the component to which the maximum value max belongs to, state information describing that they are the same is output to the header encoder 400 in step S14580.

The aforementioned operation of the floating-point number encoder 1330 is for encoding the mantissa of a converted floating-point number, and a process of encoding information on the exponent of the floating-point number into a key value header will be described in the following paragraphs.

The floating-point number encoder 1330 identifies which one is a maximum value among the absolute values of the exponents of x_min, y_min, z_min, and max, stores the identified maximum value as nMaxExp, and encodes nMaxExp into a key value header of several bits in step S14590.

Thereafter, the floating-point number encoder 1330 checks if the signs of the exponents of x_min, y_min, z_min, and max are the same in step S14600. If they are the same, bSameSignExp is set to 1 and their sign is output to the header encoder 400 in step S14610. On the other hand, if they are not the same, bSameSignExp is set to 0 in step S14620, and then encoding of the information on the exponents of x_min, y_min, z_min, and max are completed.

Figure 14E:
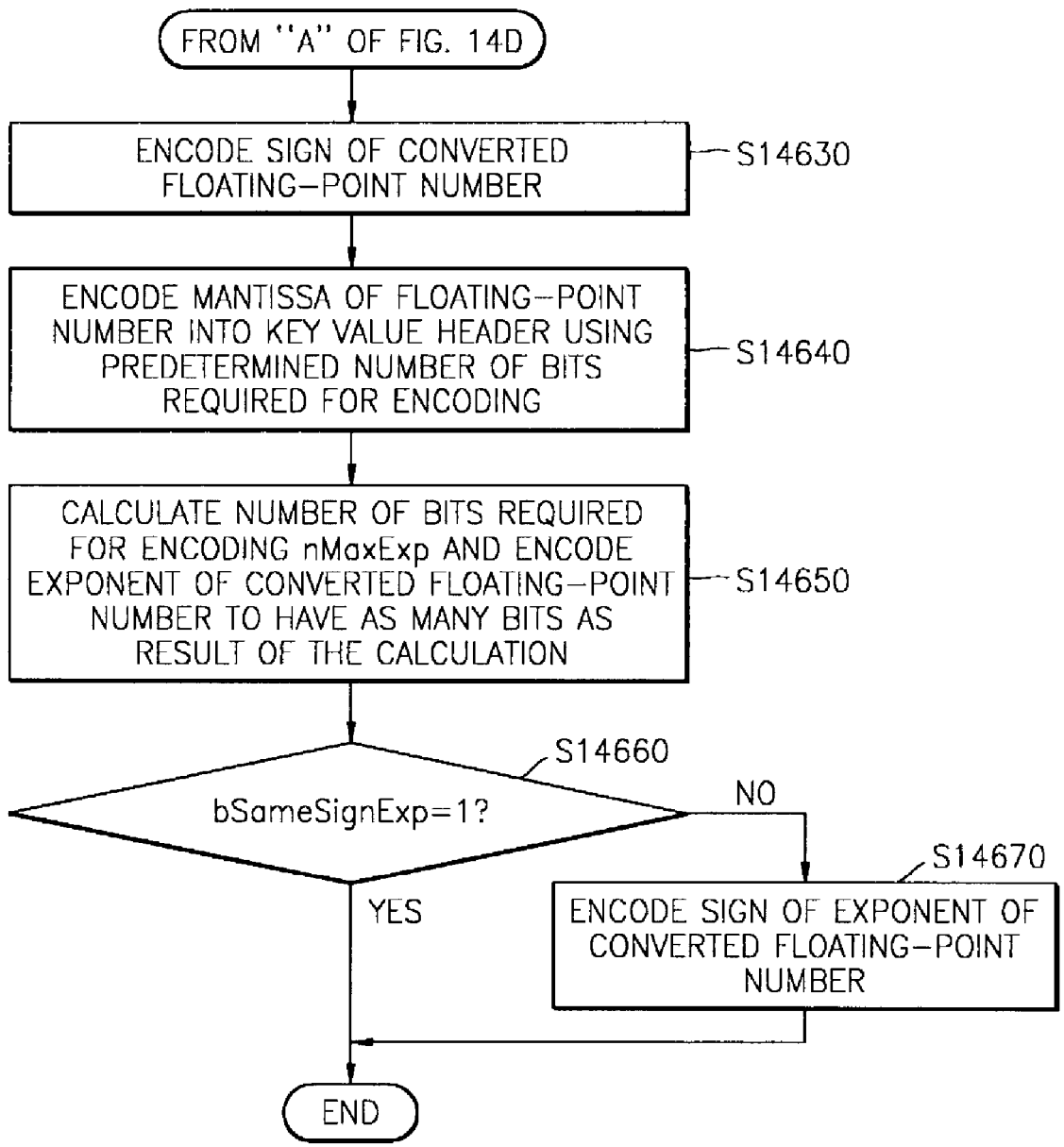

Referring to FIG. 14E, the floating-point number encoder 1330 encodes the sign of the converted floating-point number in step S14630 before encoding x_min, y_min, z_min, and max into header information.

Next, the floating-point number encoder 1330 calculates the number of bits required for encoding the floating-point number referring to Table 3 and outputs the mantissa of the floating-point number, having as many bits as the result of the calculation, to the header encoder 400 in step S14640.

The floating-point number encoder 1330 calculates the number of bits required for encoding nMaxExp referring to Table 3 and outputs the exponent of the floating-point number having as many bits as the result of the calculation, to the header encoder 400 in step S14650.

The floating-point number encoder 1330 checks based on bSameSignExp if exponents of x_min, y_min, z_min, and max have the same sign, in step S14660. If they do not have the same sign, their signs are output to the header encoder 400 and are encoded in step S14670, thus completing the process of encoding the maximum and minimum values among the key data of each of the x, y, and z components input from the normalizer 1300.

The floating-point number converter 1330 encodes the maximum and minimum values, which are capable of minimizing a quantization error of each of the components and are input from the quantization error minimizer 1320, into header information, following the aforementioned steps.

Figure 13C:
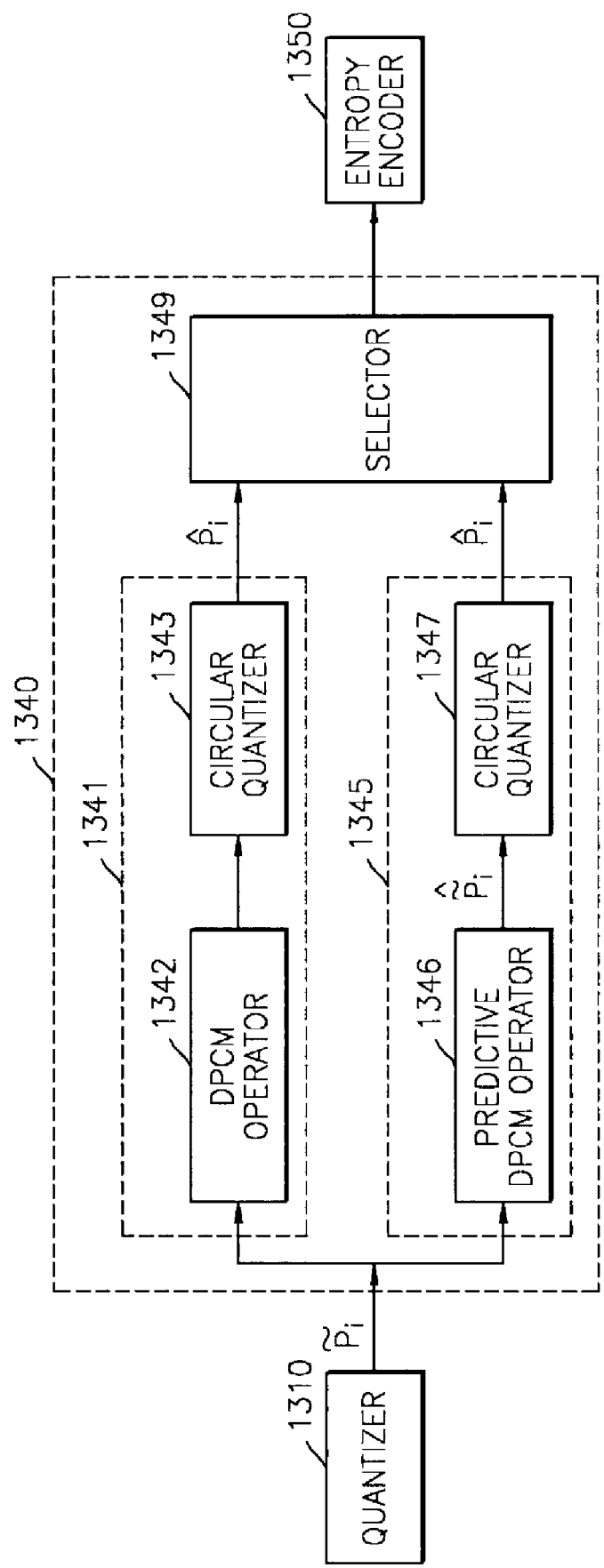
FIG. 13C is a block diagram of a DPCM processor shown in FIG. 13A.
Figure 14F:
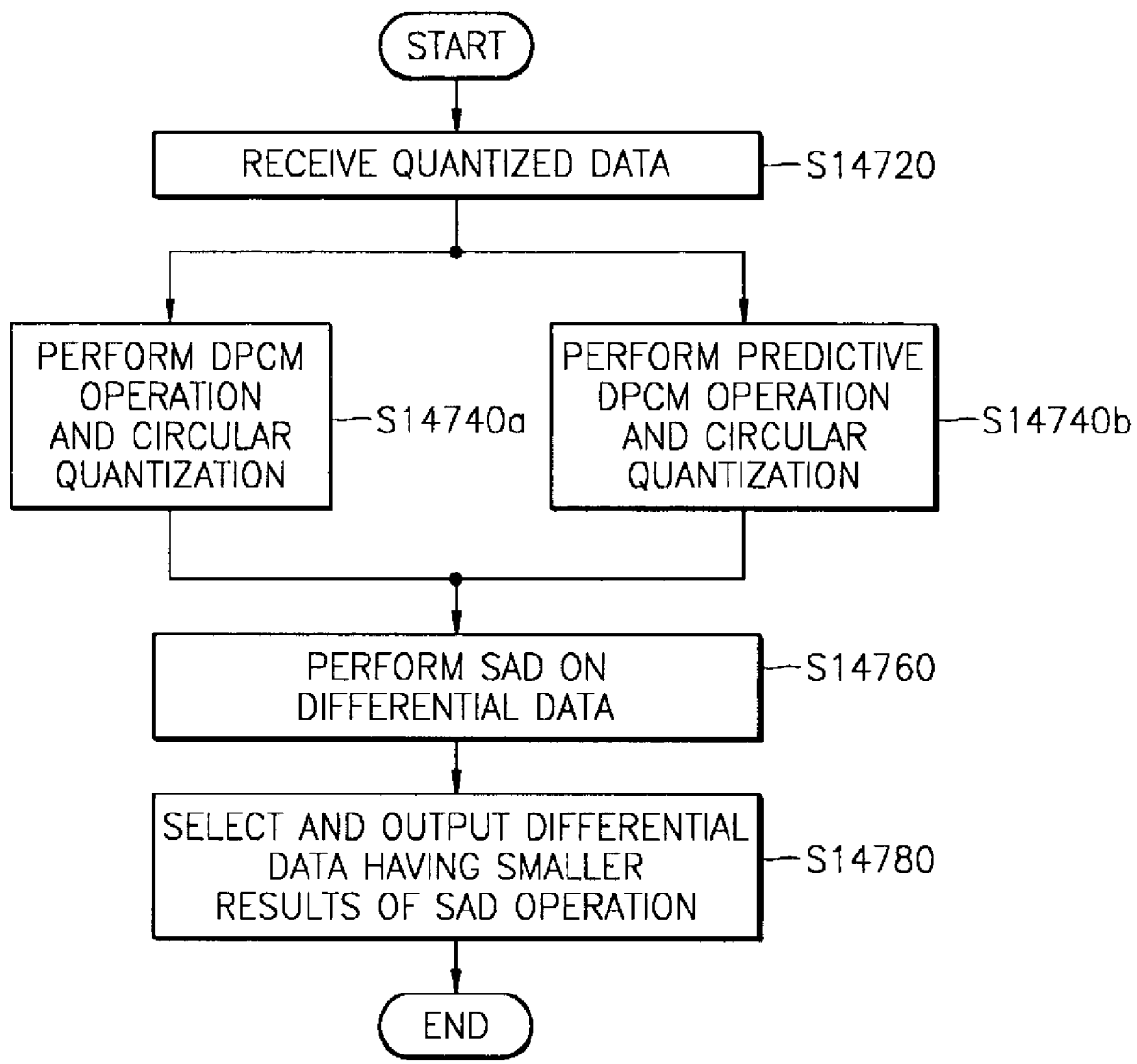

FIG. 13C is a block diagram of an example of the DPCM processor 1340 according to a preferred embodiment of the present embodiment, and FIG. 14F is a flowchart of a DPCM operation method according to a preferred embodiment of the present embodiment.

Referring to FIG. 13C, the DPCM processor 1340 includes a circular DPCM operator 1341, which includes a DPCM operator 1342 performing a general DPCM operation and then outputting differential data and a circular quantization operator 1343 performing a circular quantization operation on differential data input thereinto so as to reduce their range, a predictive-circular DPCM operator 1345, which includes a predictive DPCM operator 1346 performing a predictive DPCM operation on quantized data input thereinto and then outputting predicted differential data and a circular quantizer 1347 performing a circular quantization operation on differential data input thereinto so as to reduce their range, and a selector 1349, which selects one from between the differential data input from the circular DPCM operator 1341 and the differential data input from the predictive-circular DPCM operator 1345 based on the value of the differential data input thereinto.

Referring to FIG. 14F, a DPCM operation according to a preferred embodiment of the present embodiment will be described in the following paragraphs.

Quantized key value data are input into the circular DPCM operator 1341 and the predictive-circular DPCM operator 1345 in step S14720.

In the circular DPCM operator 1341, the DPCM operator 1342 generates differential data by performing a general DPCM operation on the quantized data input thereinto and outputs the generated differential data to the circular quantizer 1343. The circular quantizer 1343, then, performs a circular quantization on the differential data input from the DPCM operator 1342 in step S14740a.

In particular, the DPCM operator 1342 calculates the differential data by subtracting previous quantized data from the current quantized data. Thereafter, the circular quantizer 1343 performs circular quantization on the calculated differential data. The operation of the circular DPCM operator 1341 is expressed by the following equation.

$$\hat{P}_i = CircularQuantization(\tilde{P}_i - \tilde{P}_{i-1}) \quad (i=1,2,\ldots,n) \quad (18)$$

In Equation (18), n represents the number of data. The circular quantization will be described later.

The predictive DPCM operator 1346 in the predictive-circular DPCM operator 1345 calculates predicted differential data by performing a predictive DPCM operation on differential data input thereinto, and then the circular quantizer 1347 performs a circular quantization on the predicted differential data in step S14740b.

In particular, the predictive DPCM operator 1346 generates the predicted differential data by subtracting predicted data from current quantized data and outputs them. In order to obtain the predicted data for the current quantized data, differential values are obtained by subtracting from previous quantized data quantized data prior to the previous quantized data and then are added to previous differential data so that the predicted data for the current data are calculated.

The predicted data calculated by the predictive DPCM operator 1346 may not be beyond a maximum range of quantized data input thereinto. In other words, if the predicted data exceed a maximum value in a quantization range of the input quantized data, the predictive DPCM operator 1346 sets up the predicted data as a maximum value in a quantization range of the input quantized data and generates differential data for current data by subtracting the current data from the predicted data. If the predicted data are smaller than a minimum value in the quantization range of the input data, the predictive DPCM operator 1346 determines the current data as predicted differential data. Hereinafter, this operation of the predictive DPCM operator 1346 will be referred to as a "modified predictive DPCM operation" in the following paragraphs.

The predicted differential data calculated by the predictive DPCM operator 1346 are input into the circular quantizer 1347 and are subjected to a circular quantization operation.

The operation of the predictive-circular DPCM operator 1346 may be expressed by the following equation.

$$\hat{\tilde{P}}_i = (2^{nQuantBit} - 1) - \tilde{P}_i \quad (\text{if } 2 \times \tilde{P}_{i-1} - \tilde{P}_{i-2} > 2^{nQuantBit} - 1) \quad (19)$$

$$\hat{\tilde{P}}_i = \tilde{P}_i \quad (\text{if } 2 \times \tilde{P}_{i-1} - \tilde{P}_{i-2} < 0)$$

$$\hat{\tilde{P}}_i = \tilde{P}_i - (2 \times \tilde{P}_{i-1} - \tilde{P}_{i-2}) \quad (\text{otherwise})$$

$$\hat{P}_i = CircularQuantization(\hat{\tilde{P}}_i)$$

In Equation (19), i is an integer between 2 and n−1, and n indicates the number of data.

Figure 15A:
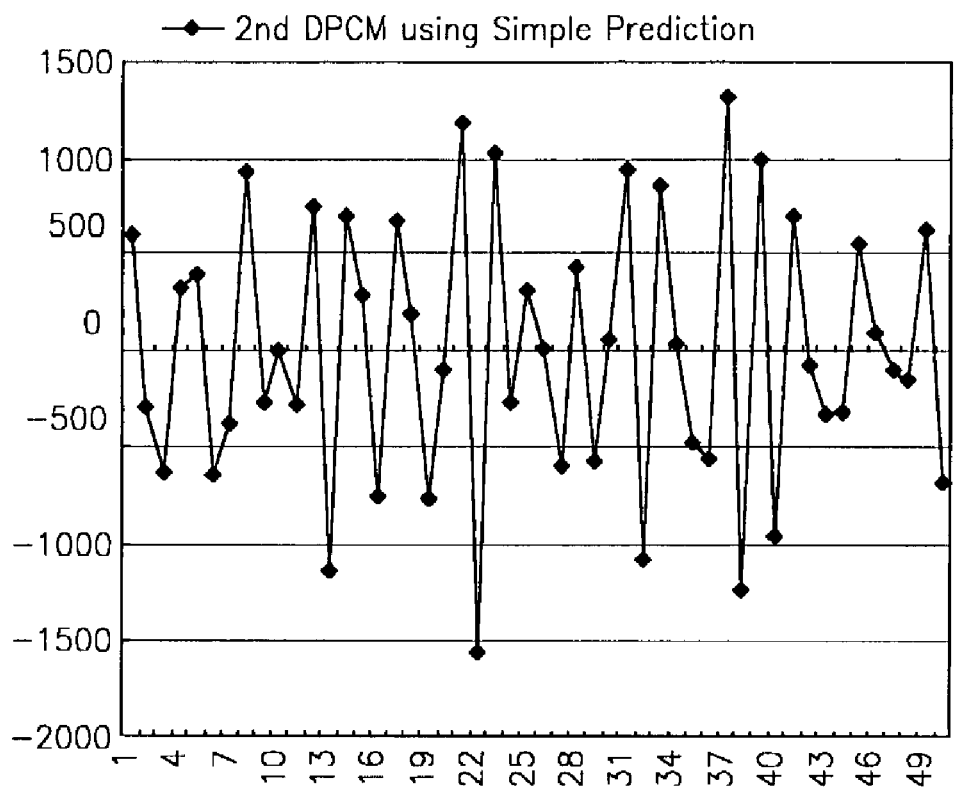
FIG. 15A is a diagram illustrating the results of performing a general predictive DPCM operation on quantized key value data.
Figure 15B:
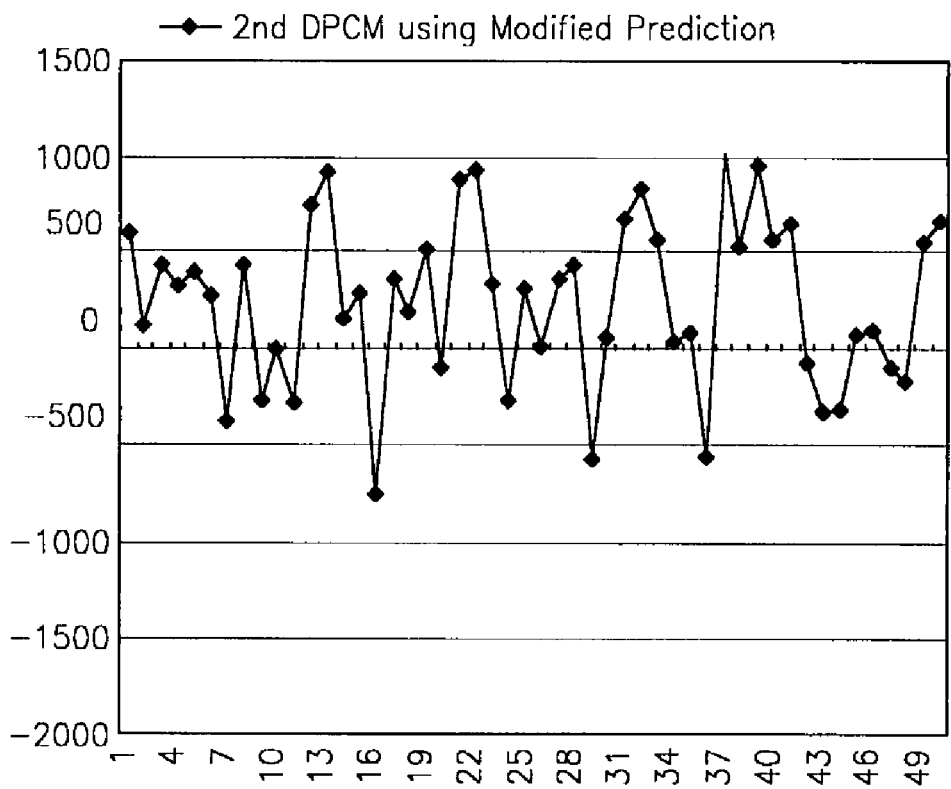
FIG. 15B is a diagram illustrating the results of performing a modified predictive DPCM operation on the quantized key value data.

FIG. 15A shows the results of performing a simple predictive DPCM operation on 50 quantized data having a maximum value of 1024 and a minimum value of 0, and FIG. 15B shows the results of performing a modified predictive DPCM operation on the same data as in the case of FIG. 15A so that differential data for the data are adjusted following Equation (19), in a case where predicted data values for the data are beyond the maximum value or below the minimum value among the data.

As a result of the simple predictive DPCM operation, predicted differential data have as wide a range as about 3,000, as shown in FIGS. 15A and 15B. As a result of the modified predictive DPCM operation, predicted differential data have as narrow a range as no greater than 2,000, as shown in FIG. 16B. This means that it is more likely to obtain predicted differential data having a narrower range in the modified predictive DPCM operation than in the simple predicted DPCM operation.

Hereinafter, circular quantization will be described in the following.

Figure 16A:
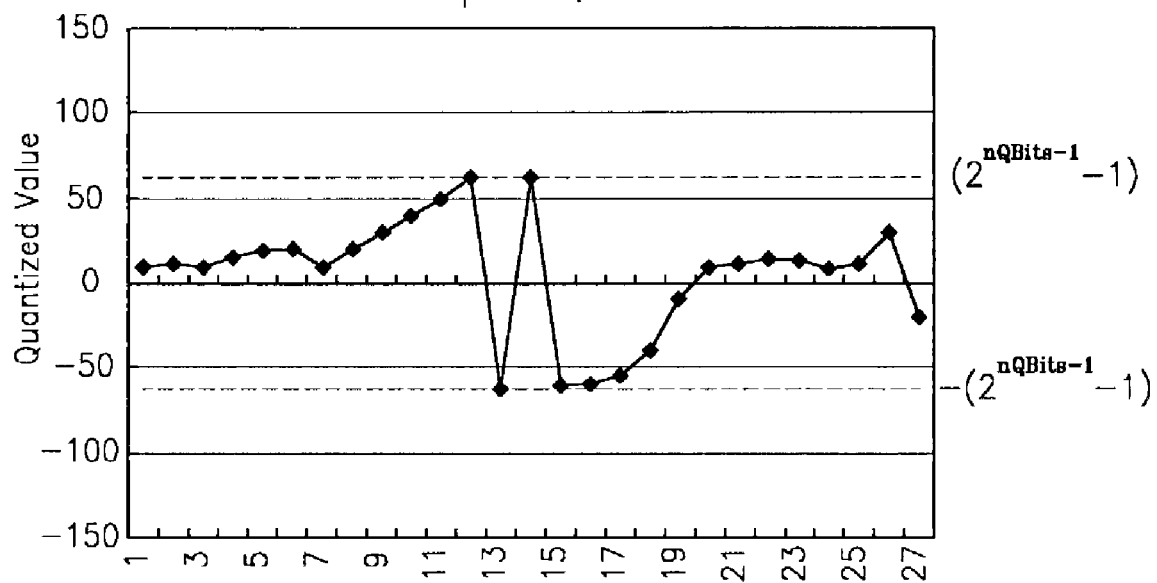
FIG. 16A is a diagram illustrating quantized data.
Figure 16B:
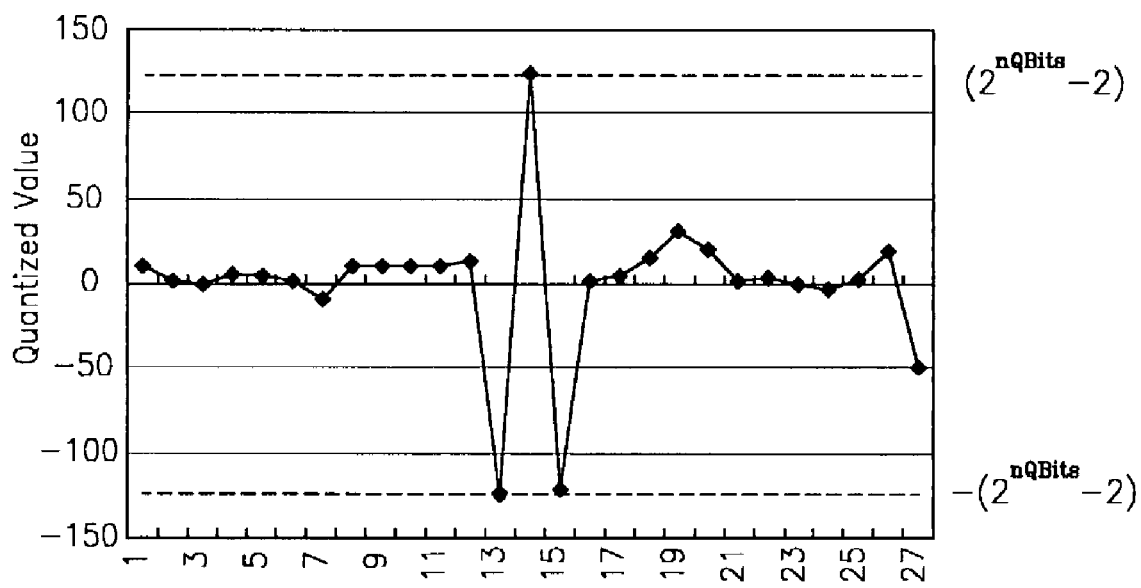
FIGS. 16B and 16C are diagrams illustrating the results of performing a DPCM operation on quantized data shown in FIG. 16A and the results of performing a circular quantization DPCM operation on the quantized data shown in FIG. 16A, respectively.

FIG. 16A shows quantized data, and FIG. 16B shows the results of performing a DPCM operation on the quantized data shown in FIG. 16A. As shown in FIG. 16B, the range of differential data can be increased after a DPCM operation up to two times as wide as it used to be before the DPCM operation. Accordingly, it is possible to say that a circular quantization operation is employed for making it happen that a DPCM operation is performed while maintaining the range of differential data subjected to the DPCM operation within the range of input data.

The circular quantization operation is performed on the assumption that a maximum value and a minimum value in a quantization range are circularly connected to each other. Accordingly, if differential data, which are the results of performing linear DPCM on two consecutive quantized data, are greater than half of the maximum value in the quantization range, their values can be decreased by subtracting the maximum value from each of the differential data.

If the differential data are smaller than half of the minimum value in the quantization range, their values can be decreased even more by adding the maximum value in the quantization range to each of the differential data.

Supposing that X and $\hat{X}$ indicate input differential data and circularly-quantized differential data, respectively, the circular quantization can be expressed by the following equation.

$$CircularQuantization(X_i) = \hat{X}_i = Min(|X_i|, |X'_i|)$$

$$X'_i = X_i - (2^{nQBits} - 1) \text{ (if } X \geq 0)$$

$$X'_i = X_i + (2^{nQBits} - 1) \text{ (otherwise)} \quad (20)$$

Figure 16C:
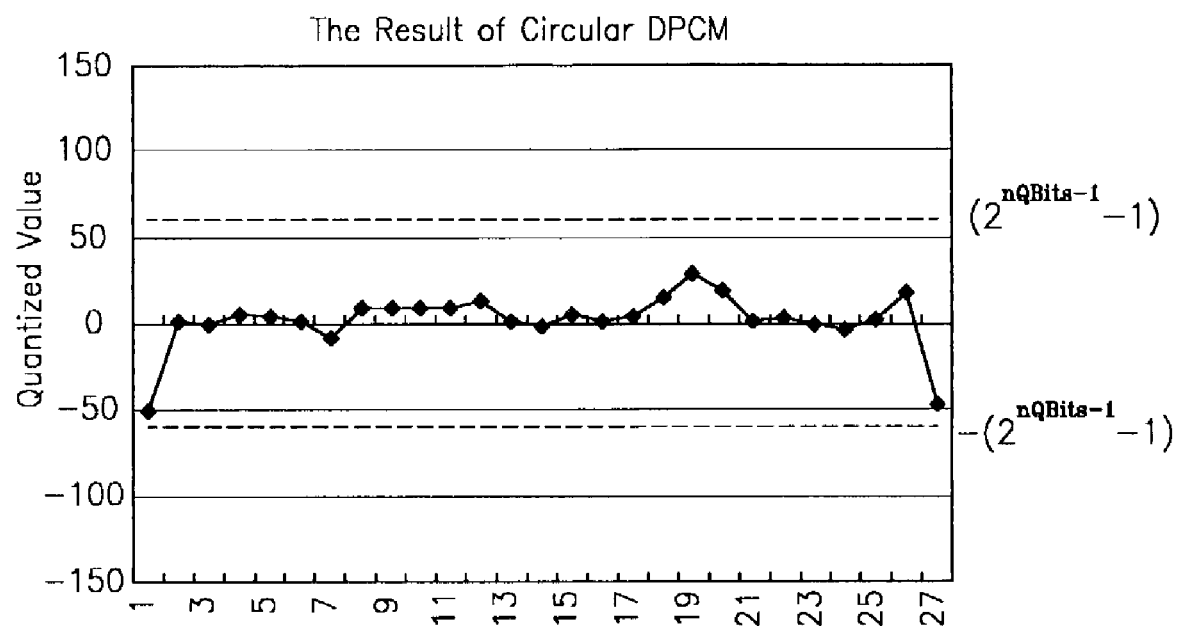

In Equation (20), nQBits indicates a bit size used for quantization. FIG. 16C shows the results of performing the circular quantization on the differential data shown in FIG. 16B.

Referring to FIG. 14F again, circularly-quantized differential data and circular-quantized predicted differential data are output to the selector 1349, and then the selector 1349 performs a sum-of-absolute-difference (SAD) operation on the input differential data in step S14760. Here, the SAD operation is performed so that the absolute values of input data are all added. In step S14760, the selector 1349 adds all the absolute values of the circular-quantized differential data and adds all the absolute values of the circular-quantized predicted differential data.

Thereafter, the selector 1349 compares the sum of the absolute values of the quantized differential data and the sum of the absolute values of the predicted differential data, selects differential data having a smaller sum of absolute values from between the quantized differential data and the predicted differential data, and outputs the selected differential data in step S14780. The reason why the selector 1349 selects differential data having a smaller sum of absolute values is that they supposedly have a narrower range of values. For example, in entropy-encoding predicted differential data, the number of bits required for encoding differential data having a smaller sum of absolute values is expected to be smaller than the number of bits required for encoding differential data having a larger sum of absolute values.

It is obvious to one skilled in the art that the SAD operation is merely one of the methods for selecting a certain group of differential data, and thus the selector 1349 may adopt a different method to select differential data.

Referring to FIG. 14A again, the differential data output from the DPCM processor 1340 are entropy-encoded in the entropy encoder 1350 in step S14800.

Figure 14G:
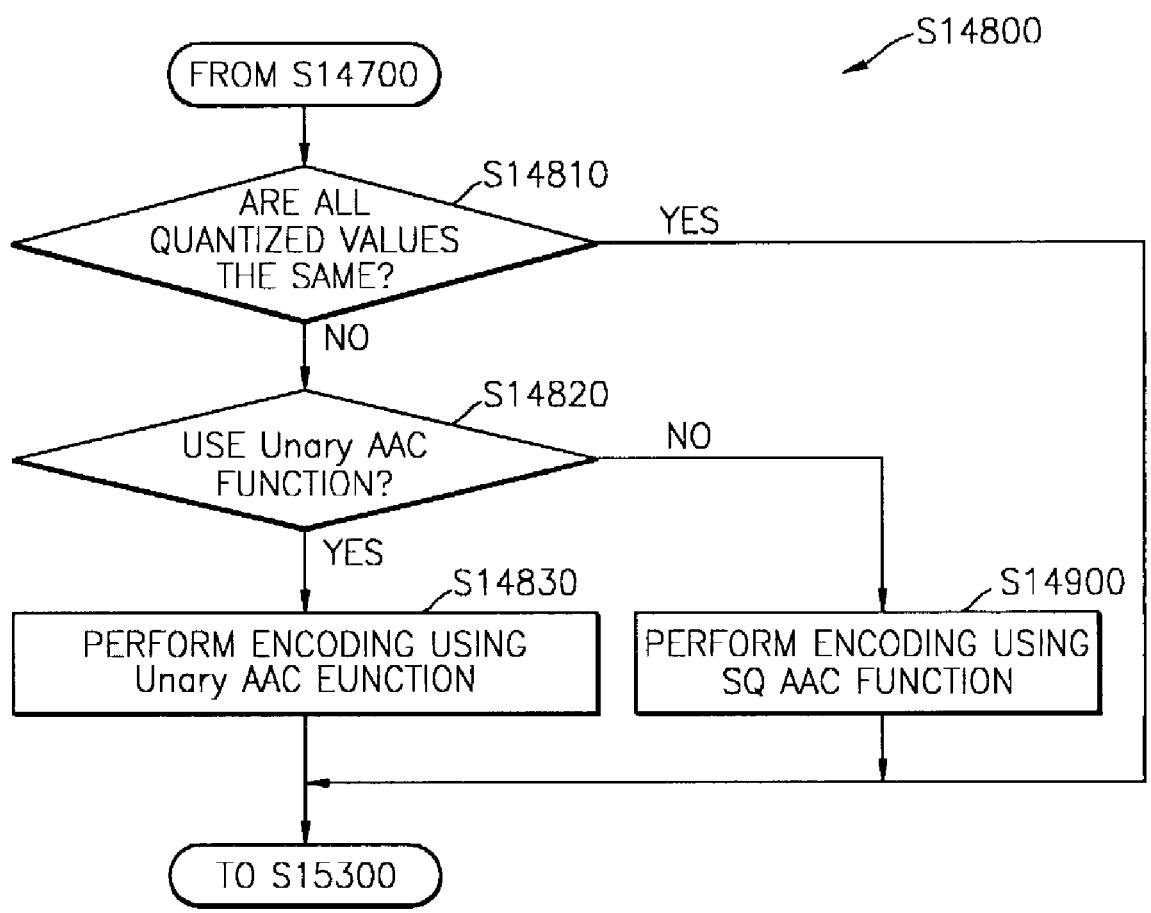

Referring to FIG. 14G, the entropy encoder 1350 entropy-encodes the differential data of the key value data of each of the x, y, and z components.

The entropy encoder 1350 checks referring to the differential data of each of the x, y, and z components if the quantized values of the x, y, and z components are the same, i.e., if the differential data of each of the x, y, and z components are 0, and completes the entropy-encoding in step S14810 if they are the same. For example, in a case where in a three-dimensional animation, a train moves in a horizontal direction, which is the same as the direction of the x component, the key value data of the x component vary. However, there is little change in the y and z components. Accordingly, if the y and z components are quantized, they are supposed to have the same value. Accordingly, there is no need to encode all key value data which are practically the same, and thus it is possible to enhance the efficiency of encoding by encoding only one of the key value data into header information.

If the quantized key value data of each of the x, y, and z components are not the same, the entropy encoder 1350 reads a predetermined value which has been set up in advance, in step S14820. Thereafter, the entropy encoder 1350 encodes the differential data of the quantized key value data of each of the x, y, and z components using a unary AAC function in step S14830 or encodes them using a successive quantization AAC function in step S14850.

Figure 17:
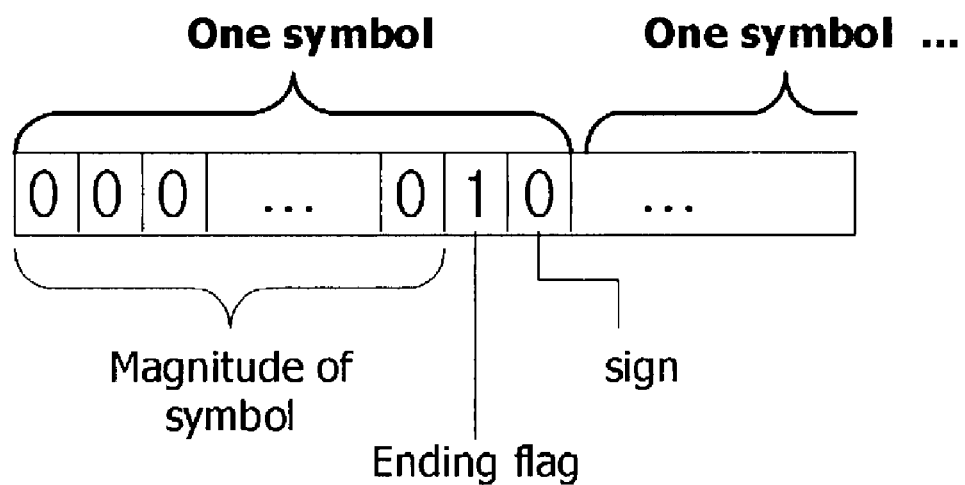
FIG. 17 is a diagram illustrating an example of a function Unary AAC.

Hereinafter, the unary AAC function will be described with reference to FIG. 17. The unary AAC function converts symbols to be encoded into a predetermined number of bits which consist of a series of 0s, a flag bit 1 indicating that the series of zeros end, and one bit representing the sign of the symbol. Here, the series of zeros corresponds to the magnitude of the symbol. For example, 256 is encoded using the unary AAC function into a series of bits consisting of two hundred fifty six 0s, 1 which is a flag bit indicating the series of 0s ends, and 0 which represents the sign of 256, i.e., a plus sign. Due to the unary AAC function, the redundancy of the bits representing the symbol to be encoded increases, which enhances the efficiency of encoding the symbol.

Figure 14H:
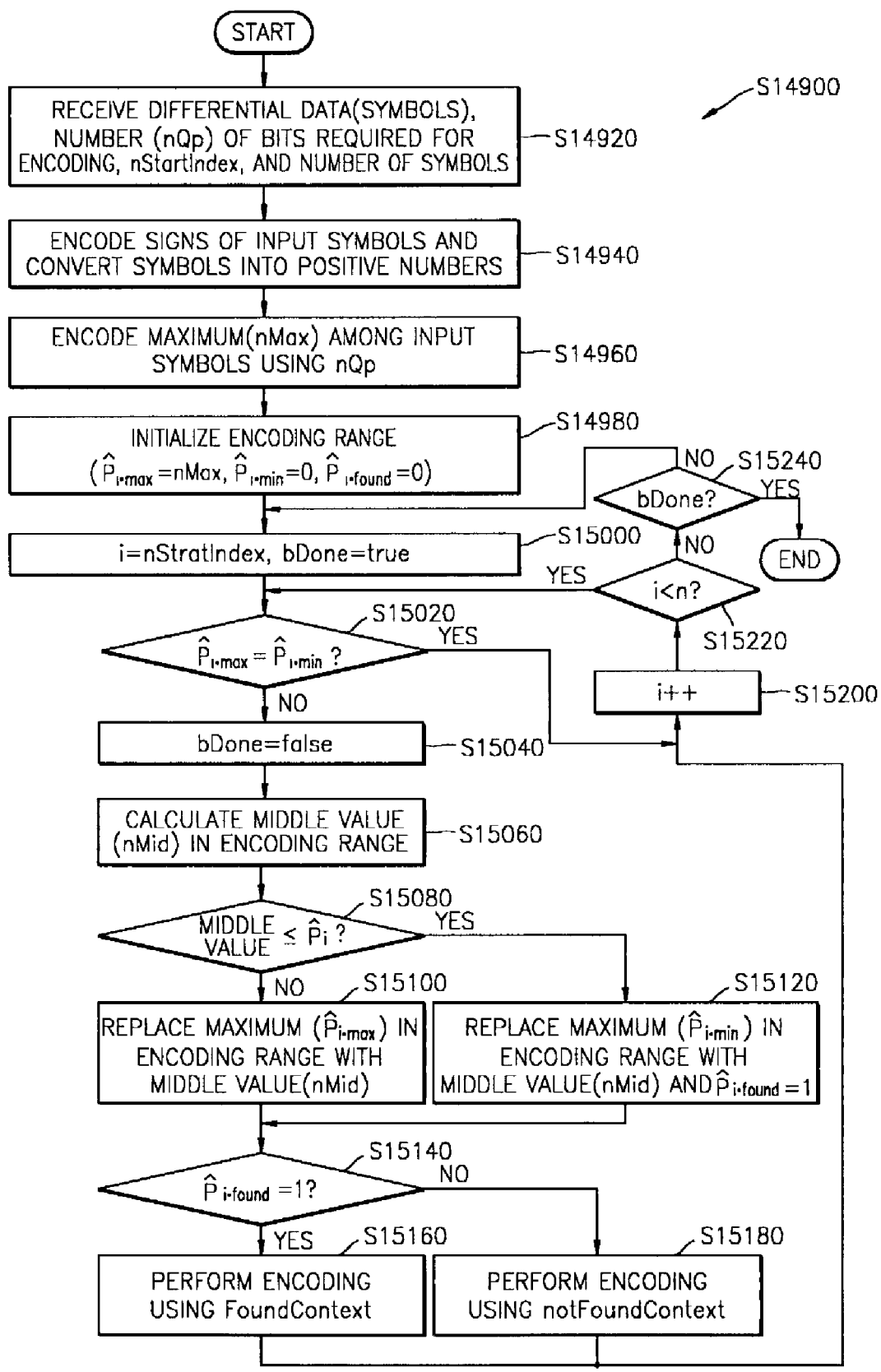
Figure 18A:
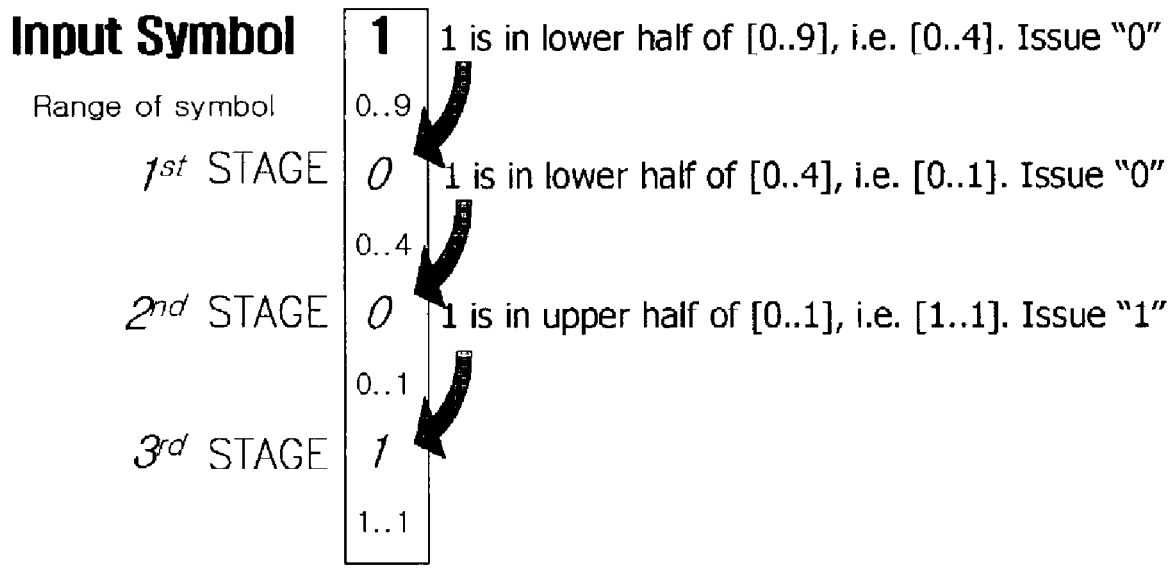
FIGS. 18A and 18B are diagrams illustrating an example of a function SQ AAC.
Figure 18B:
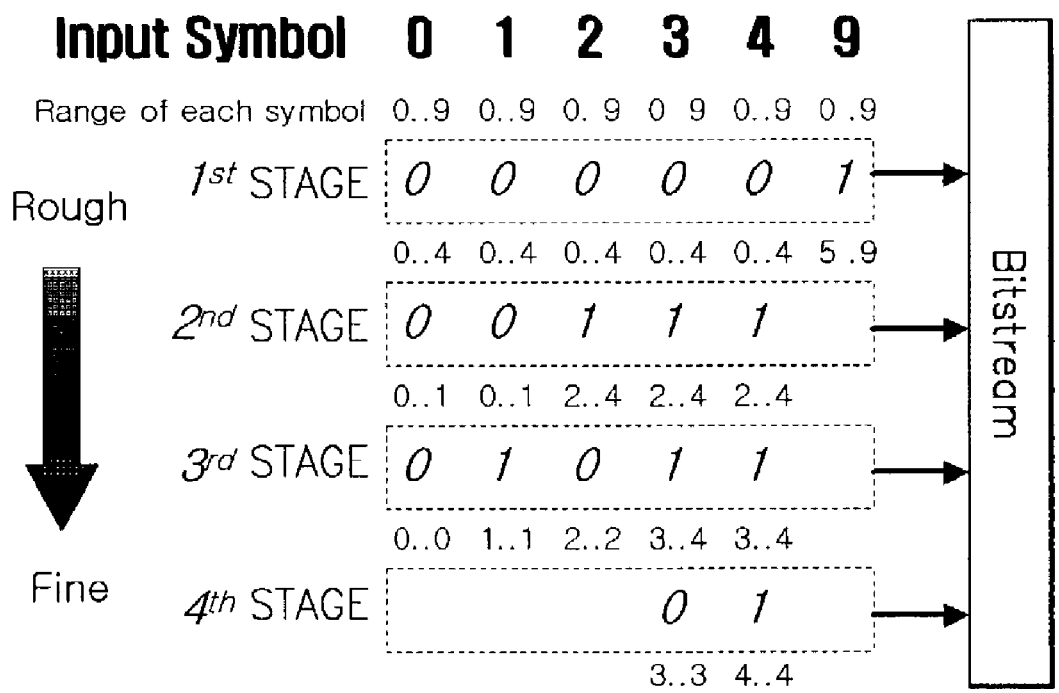

Referring to FIGS. 14H, 18A, and 18B, a method of encoding symbols using the SQ AAC function will be described. The SQ AAC function encodes symbols continuously renewing a quantization range.

FIG. 18A is a diagram illustrating a method of encoding symbols using the SQ AAC function. As shown in FIG. 18A, an input symbol to be encoded is 1, and a minimum value and a maximum value in an encoding range are 0 and 9, respectively.

Referring to FIG. 18A, in a first step of encoding the symbol, the encoding range is divided into two sub-ranges, i.e., an upper range and a lower range, and then it is checked whether the symbol to be encoded, i.e., 1, belongs to the upper range or the lower range. Since 1 belongs to the lower range, 0 is encoded and the lower range is renewed into a new encoding range. Accordingly, the new encoding range for the second step is from 0 to 4.

In the second step, the new encoding range of 0-4 is divided into two sub-ranges, i.e., an upper range and a lower range, and then it is checked whether 1 belongs to the upper range or the lower range. Since 1 belongs to the lower range, 0 is encoded, and the maximum value in the encoding range is renewed into 1 which is the maximum value in the lower range. Accordingly, a new encoding range for the third step, which used to be the lower range, is from 0 to 1.

In the third step, the encoding range of 0-1 is divided into an upper value and a lower value, and then it is checked whether 1 is the same as the upper value or the lower value. Since 1 is equal to the upper value, 1 is encoded and then the minimum value in the corresponding encoding range is renewed into 1. Accordingly, a new encoding range is [1, 1] so that its maximum and minimum values are the same. When minimum and maximum values in an encoding range are the same, the encoding process using the SQ AAC function is completed.

FIG. 14H is a flowchart of a process of encoding differential data of key value data of a component using the SQ AAC function, which is performed in the entropy encoder 1350 according to the present embodiment.

Referring to FIG. 14H, the entropy encoder 1350 receives differential data (hereinafter, referred to as symbols) of key value data, the number nQP of bits required for entropy-encoding the symbols, nStartIndex indicating an index of symbol to be encoded first into bistream, and the number (n) of symbols to be encoded in step S14920.

The entropy encoder 1350 encodes the signs of the symbols and converts the symbols into positive numbers in step S14940. The reason the symbols are converted into positive numbers is that negative numbers are not allowed in subsequent processes.

The entropy encoder 1350 identifies a maximum value among the positive numbers, stores the maximum value as nMax, and encodes nMax into as many bits as nQP in step S14960.

The entropy encoder 1350 initializes a range within which the symbols will be encoded and sets a minimum value $\hat{P}_{i\text{-}min}$ and a maximum value $\hat{P}_{i\text{-}max}$ in the encoding range to 0 and nMax, respectively, in step S14980. In addition, the entropy encoder 1350 allots a one-bit flag $\hat{P}_{i\text{-}found}$ to each of the symbols. The flag $\hat{P}_{i\text{-}found}$ is used for changing probability models during encoding the symbols. The flag $\hat{P}_{i\text{-}found}$ is set as 'false' at the beginning and is converted into 'true' when a value to be encoded next is 1, and thereafter, the probability model having been used for encoding the symbols so far is replaced by another.

Next, the entropy encoder 1350 identifies a differential datum (i=nStartIndex) of each of the x, y, and z components, which is supposed to be encoded first, and sets a flag bDone, which indicates whether or not encoding all the symbols is completed, as 'true' in step S15000.

The entropy encoder 1350 repeatedly performs steps S15020 through S15180, which will be described in the following, until maximum and minimum values in an encoding range for each of the symbols become the same, i.e., until there is no symbol left to be encoded. Here, when maximum and minimum values in an encoding range for a symbol are the same, it is considered that encoding of the symbol is completed.

The entropy encoder 1350 checks if $\hat{P}_{i\text{-}max}$ is equal to $\hat{P}_{i\text{-}min}$ in step S15020. If $\hat{P}_{i\text{-}max}$ is equal to $\hat{P}_{i\text{-}min}$ the method moves on to a step for encoding the next symbol, and if not, bDone is set as 'false', which means the encoding of the current symbol (the symbol currently being encoded) is not completed yet, in step S15040.

The entropy encoder 1350 calculates a middle value nMid in the encoding range for the current symbol in step S15060 and compares the middle value nMid with the value of the current symbol in step S15080. In a preferred embodiment of the present embodiment, the middle value nMid is calculated using the following equation.

$$nMid = \frac{\hat{P}_{i\,max} + \hat{P}_{i\,min}}{2} + \hat{P}_{i\,min} + 1 \quad (21)$$

As a result of the comparison, if the current symbol value is not greater than the middle value nMid, which means the current symbol belongs to the lower range, then 0 is issued to a bitstream and the maximum range $\hat{P}_{i\text{-}max}$ in the encoding range for the current symbol is replaced by the middle value nMid in step S15100.

On the other hand, if the current symbol value is greater than the middle value nMid, 1 is issued to the bitstream and the minimum value $\hat{P}_{i\text{-}min}$ in the encoding range for the current symbol is replaced by the middle value nMid. When the value of the symbol currently being encoded exceeds the middle value nMid for the first time, in other words, when 1 is issued to the bitstream for the first time, $\hat{P}_{i\text{-}found}$ is set as 'true' in step S15120 so as to change the probability model for encoding the symbols.

There are two probability models used in the SQ AAC function. One is notFoundContext for entropy-encoding bits output before 1 is issued from each of the symbols for the first time, and the other is FoundContext for entropy-encoding bits output right after 1 is issued from each of the symbols for the first time. The purpose of using two different probability models is to increase the probability of 0 being generated during using notFoundContext. As the probability of 0 being generated increases, the efficiency of entropy-encoding a symbol increases.

Thereafter, the entropy encoder 1350 checks if $\hat{P}_{i\text{-}found}$ is true or false in step S15140. If $\hat{P}_{i\text{-}found}$ is true, the entropy encoder 1350 encodes the symbols using FoundContext in step S15160, and if not, the entropy encoder 1350 encodes the symbols using notFoundContext in step S15180.

When the process of encoding the current symbol ranging from step S15020 to step S15180 is completed, which means the entropy encoder completes the encoding of the current symbol in only one stage, the entropy encoder 1350 increases an encoding index i by 1 in step S15200. Next, the entropy 1350 checks whether or not all the symbols are completely encoded in a current stage in step S15220. If there are symbols left to be encoded in the current stage, the entropy encoder 1350 performs steps S15020 through S15220 again.

When all the symbols in one stage are completely encoded, the entropy encoder 1350 checks based on the flag bDone if the encoding of all stages is completed, in step S15240. If bDone is true, the entropy encoder 1350 completes the whole encoding process of a current component and starts to encode a following component, and if not, the entropy encoder 1350 performs steps S15000 through S15220 again to encode the remaining symbols.

FIG. 18B is a diagram illustrating a process of encoding a plurality of symbols using the SQ AAC function. Specifically, FIG. 18B shows a process of encoding 0, 1, 2, 3, 4, and 9 using the SQ AAC function.

Referring to FIG. 14B again, if the apparatus for encoding data according to the present embodiment generates a bitstream by entropy-encoding all input key value data, the header encoder 400 encodes information required for decoding the encoded key value data into header information, adds the key value header information to the bitstream, and outputs the resulting bitstream in step S15300.

The header encoder 400 encodes the number and digit number of input key value data to be encoded and the quantization bit size of the key value data. Next, the header encoder 400 identifies if each of the x, y, and z components has the same quantized values (for example, even though the key value data of each of the x, y, and z components vary, the quantized key value data of the x component have the same value because the degree to which the key value data of the x component vary is very small) and encodes the result into a flag.

For example, if the quantized values of the x component are not the same, whether a circular DPCM operation or a predictive-circular DPCM operation has been used to encode the key value data of the x component and whether the key value data of the x component will be encoded using the unary AAC function or the SQ AAC function are encoded into flags. If the key value data of the x component is not expected to be encoded using the unary AAC function, the encoding bit size of the x component and a start index of the x component to be entropy-encoded is encoded into a key value header.

Likewise, if the key value data of each of the y and z components are not the same, header information of the y and z components, which exactly corresponds to the aforementioned header information of the x component is encoded into a header.

If the quantized values of the x component are not the same, the unary AAC function is not used to encode the key value data of the x component, and the start index of the x component to be entropy-encoded is 1, then the first quantized key value datum is encoded as an intra datum. In the same manner, the first quantized key value datum of each of the y and z components is encoded as an intra datum.

The header encoder 400 identifies which component among the x, y, and z components has a maximum data range. If the x component has a maximum data range, the header encoder 400 sets up a variable nWhichAxis at 0. If the component y has a maximum data range, the header encoder 400 sets up nWhichAxis at 1. If the component z has a maximum data range, the header encoder 400 sets up nWhichAxis at 2. Thereafter, the header encoder 400 encodes nWhichAxis, x_min, y_min, z_min, and max into a key header using the floating-point number encoder 1330.

Referring to FIGS. 3A and 3B again, the apparatus for encoding a position interpolator according to the present embodiment encodes key data and key value data, and encodes header information using the header encoder 400 (step S380), and outputs a bitstream, into which a position interpolator is encoded together with the encoded key data, the encoded key value data, and the encoded header information.

Hereinafter, a method and an apparatus for decoding a bitstream, into which a position interpolator is encoded, according to a preferred embodiment of the present embodiment will be described more fully with reference to FIGS. 19A through 24.

Figure 19A:
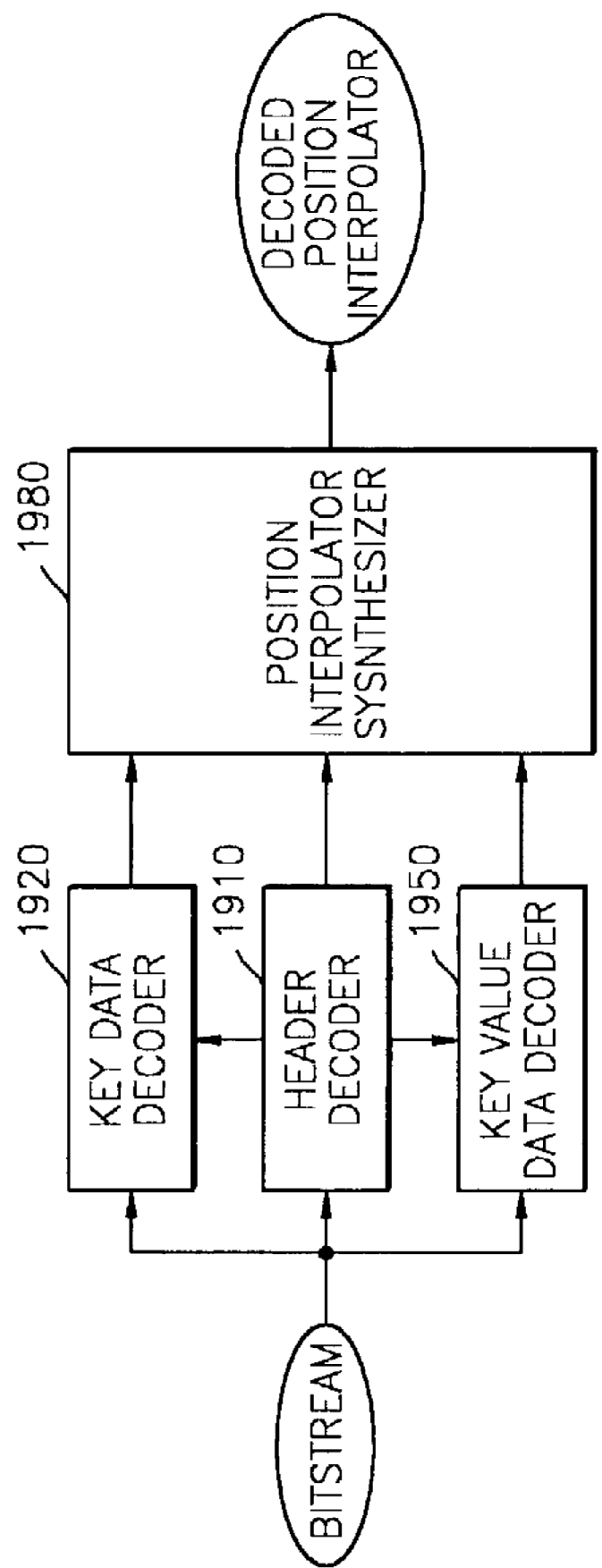
FIG. 19A is a block diagram of an apparatus for decoding a position interpolator according to a preferred embodiment of the present embodiment.
Figure 19B:
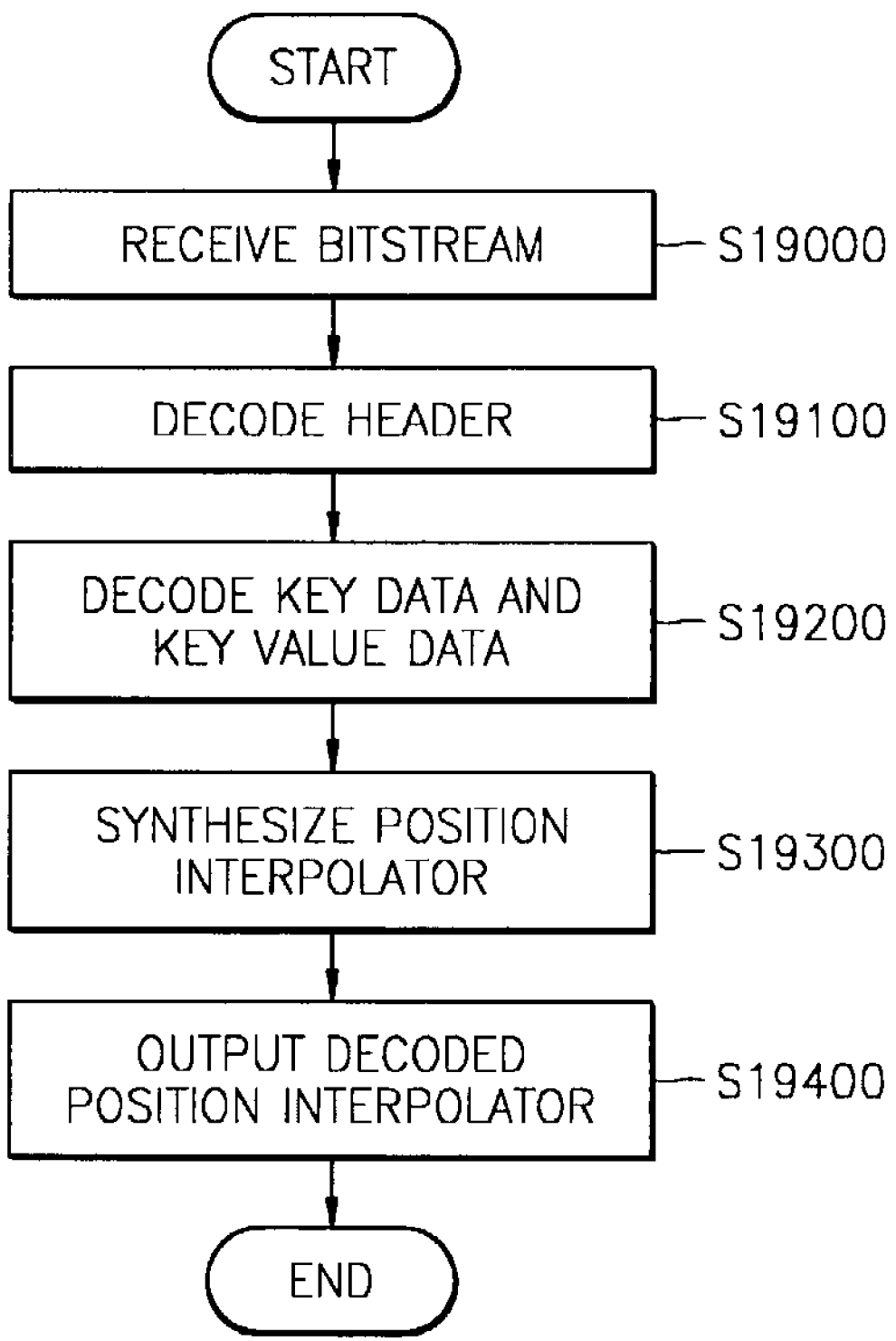
FIG. 19B is a flowchart of a method for decoding a position interpolator according to a preferred embodiment of the present embodiment.

FIG. 19A is a block diagram of an apparatus for decoding an encoded position interpolator according to a preferred embodiment of the present embodiment, and FIG. 19B is a flowchart of a method for decoding an encoded position interpolator according to a preferred embodiment of the present embodiment.

Referring to FIG. 19A, the apparatus for decoding an encoded position interpolator includes a key data decoder 1920, which decodes key data from an input bitstream, a key value data decoder 1950, which decodes key value data from the input bitstream, a header decoder 1910, which decodes header information from the input bitstream and outputs the decoded header information to the key data decoder 1920 and the key value data decoder 1950, and a position interpolator synthesizer 1980, which synthesizes the decoded key data and the decoded key value data using the decoded header information input from the header decoder 1910 and outputs a decoded position interpolator.

Referring to FIG. 19B, a bitstream encoded by the apparatus for encoding a position interpolator shown in FIG. 3A is input into the key data decoder 1920, the key value data decoder 1950, and the header decoder 1910 in step S19000.

The header decoder 1910 decodes header information from the input bitstream and outputs the decoded header information to the key data decoder 1920, the key value data decoder 1950, and the position interpolator synthesizer 1980 in step S19100.

The key data decoder 1920 entropy-decodes key data from the input bitstream, generates decoded key data by performing a predetermined inverse DND operation, an inverse folding operation, and an inverse shifting operation on the key data, and outputs the decoded key data to the position interpolator synthesizer 1980. In addition, the key value data decoder 1950 entropy-decodes key value data from the input bitstream, generates decoded key value data by performing a predetermined inverse quantization operation and an inverse DPCM operation on the key value data, and outputs the decoded key value data to the position interpolator synthesizer 1980 in step S19200.

In step S19300, the position interpolator synthesizer 1980 retrieves a position interpolator by synthesizing the decoded key value data input from the key data decoder 1920 and the decoded key value data input from the key value data decoder 1950 in step S19400 using the decoded header information, including a mode setting signal and key selection flags.

Figure 20:
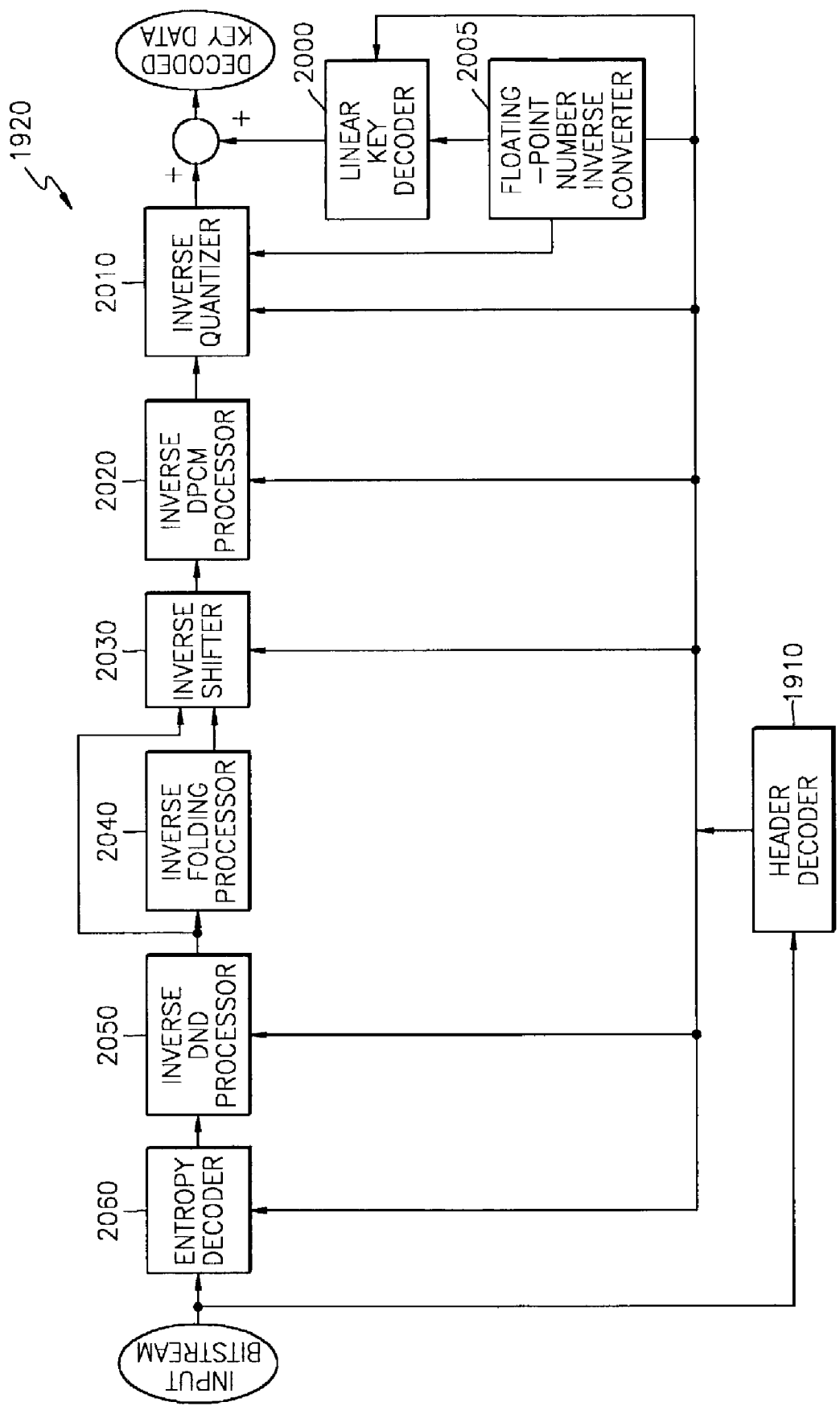
FIG. 20 is a block diagram of a key data decoder according to a preferred embodiment of the present embodiment.

The structure and operation of the key data decoder 1920 will be described more fully with reference to FIGS. 20 through 21B. The key data decoder 1920 according to the present embodiment receives an encoded bitstream and constitutes it into decoded key data.

The key data decoder 1920 includes an entropy decoder 2060, an inverse DND processor 2050, an inverse folding processor 2040, an inverse shifter 2030, an inverse DPCM processor 2020, an inverse quantizer 2010, a linear key decoder 2000, and a floating-point number inverse converter 2005.

Figure 21A:
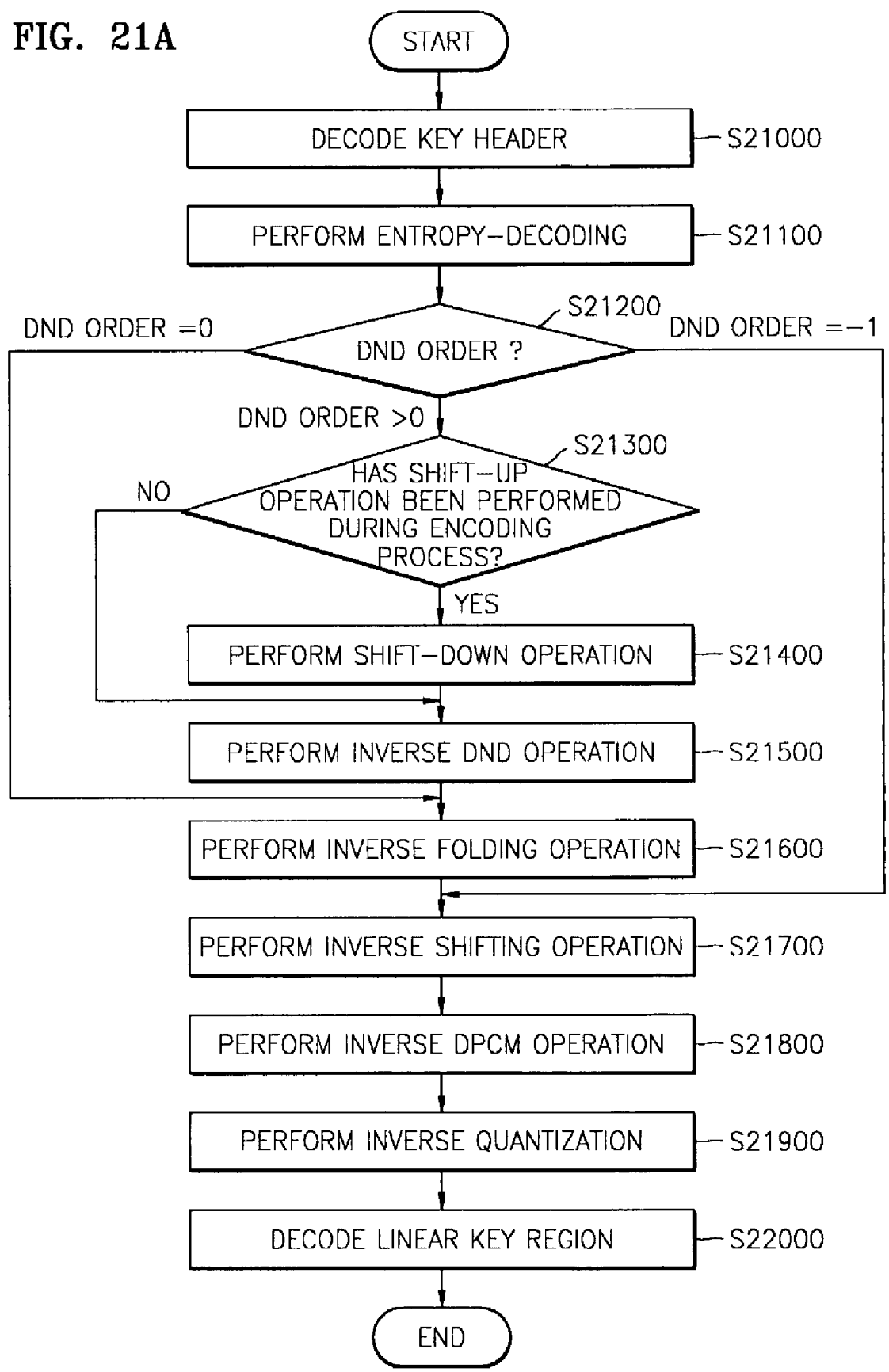
FIGS. 21A and 21B are flowcharts of a method of decoding key data according to a preferred embodiment of the present embodiment.

FIG. 21A is a flowchart of a method for decoding key data according to a preferred embodiment of the present embodiment.

A bitstream is input into the header decoder 1910 and the entropy decoder 2060.

The header decoder 1910 decodes pieces of information required for each step of decoding and provides them to their corresponding steps of decoding in step S21000. The information decoded by the header decoder 1910 will be described with each decoding step.

The entropy decoder 2060 receives the number of differential data to be decoded and the number of bits that have been used for encoding, i.e., the number of bits to be used for decoding, from the header decoder 1910 and decodes the input bitstream in step S21100. The number of differential data is equal to the result of subtracting the number of intra key data obtained by performing DPCM from the number of key data.

The entropy decoder 2060 identifies if the differential data to be decoded have negative values or positive values based on predetermined information included in the bitstream, for example, bSignedAACFlag in the present embodiment. If the encoded differential data have negative values, the entropy decoder 2060 decodes them using function decodeSignedAAC( ). On the other hand, if the encoded differential data have only positive values, the entropy decoder 2060 decodes them using function decodeUnsignedAAC( ). Thereafter, the decoded differential data are transmitted to the inverse DND processor 2050.

The inverse DND processor 2050 receives the order of DND and a maximum value nKeyMax in each cycle of DND from the header decoder 1910.

If the order of DND is −1, this means that the encoded differential data being decoded have been entropy-decoded going through a DPCM operation and a shifting operation instead of going through DND, and the method directly moves onto a step of performing an inverse shifting operation. If the order of DND is 0, this means that the encoded differential data being decoded have been entropy-decoded going through a folding operation instead of going through DND, and thus the method directly moves onto a step of performing an inverse folding operation. If the order of DND is greater than 0, an inverse DND operation is performed in step S21200.

The inverse DND processor 2050 determines whether or not the encoded differential data being decoded have been encoded going through a shift-up operation in step S21300. In a preferred embodiment of the present embodiment, it is determined whether or not the encoded differential data being decoded have been encoded going through a shift-up operation by checking whether or not nKeyInvertDown included in a bitstream is greater than 0.

If the encoded differential data being decoded have not been through a shift-up operation, the method moves onto a step of performing an inverse DND. On the other hand, if the encoded differential data being decoded have been through a shift-up operation, the differential data that have been transferred from a positive number region to a negative number region by performing a shift-up operation are moved back to the negative number region in step S21400. In a preferred embodiment of the present embodiment, the differential data having been through a shift-up operation are restored by performing a shift-down operation (an invert-down operation) which is expressed by the following equation.

$$\text{invert} - \text{down}(v) = v (\text{if } v \leq nKeyInvertDown) \qquad (22)$$

$$= nKeyInvertDown - v (\text{if } v > nKeyInvertDown)$$

Here, nKeyInvertDown has the same value as the maximum value nKeyMax used in the shift-up operation. As a result of the shift-down operation, the differential data having a value over nKeyInvertDown are converted into negative values below −1.

An inverse divide-down operation or an inverse divide-up operation is selectively performed on the differential data having been through the shift-down operation depending on the maximum value nKeyMax in each cycle of DND.

Figure 21B:
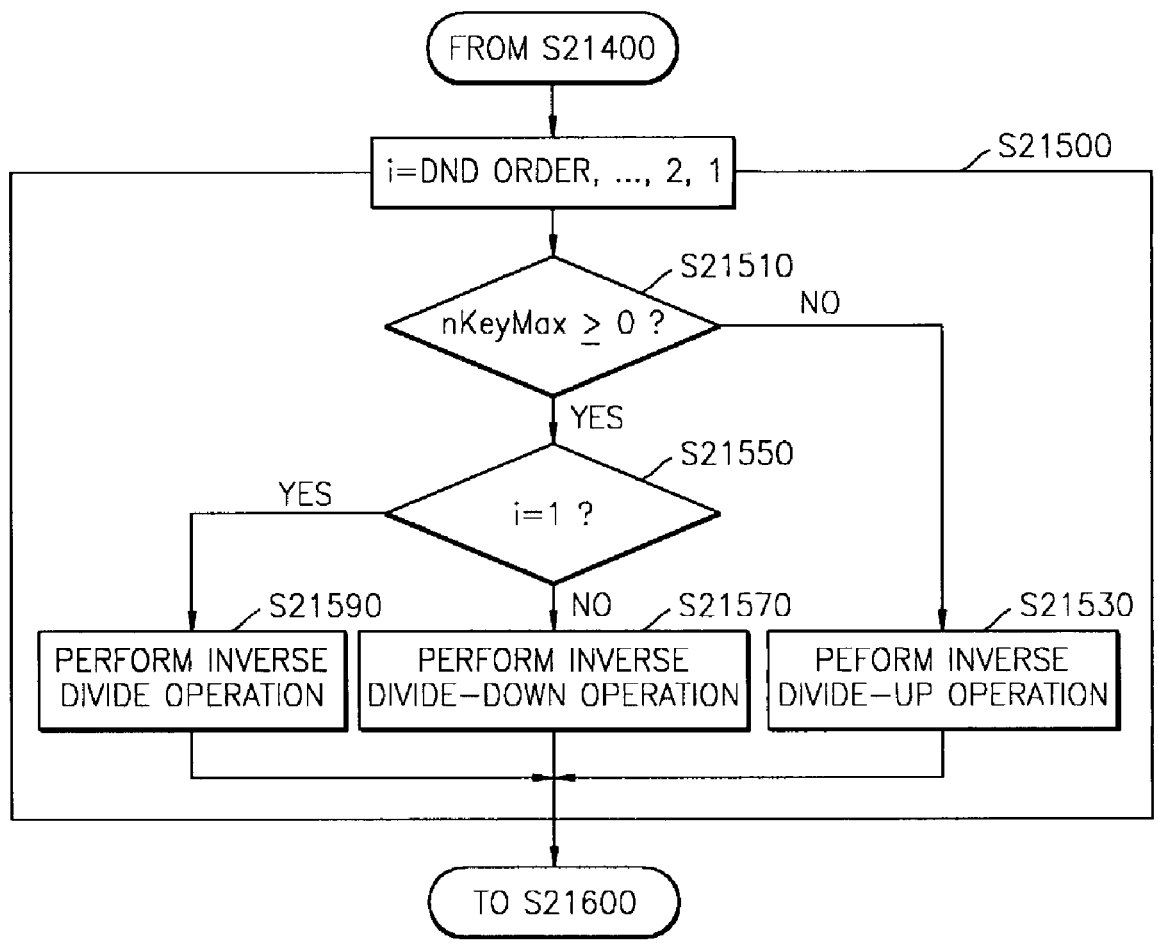

Referring to FIG. 21B, the inverse DND processor 2050 performs an inverse DND operation as many times as the differential data have been through a DND operation during encoding. In other words, the inverse DND processor 2050 sets up an initial value of the order of inverse DND to be equal to the order of DND. Next, the inverse DND processor 2050 subtracts 1 from the initial value of the order of inverse DND every time it performs an inverse DND operation and keeps performing the inverse DND operation until the order of inverse DND becomes 1. The inverse DND processor 2050 searches for nKeyMax in each cycle of DND and checks whether or not each nKeyMax is not smaller than 0 in step S21510.

If nKeyMax is smaller than 0, it means that a divide-up operation has been performed in the process of encoding, and thus the inverse DND processor 2050 extends the range of the differential data being decoded to a negative number region by performing an inverse divide-up operation, in step S21530. In a preferred embodiment of the present embodiment, an inverse divide-up operation which is defined by Equation (23) may be used.

$$\text{inverse} - \text{divide} - \text{up}(v) = v (\text{if } v \geq 0) \quad (23)$$
$$= (nKey\text{Max}_i - 1) - \frac{v-1}{2} (\text{if } v < 0, v\bmod 2 \neq 0)$$
$$= \frac{v}{2} (\text{if } v < 0, v\bmod 2 = 0)$$

However, if nKeyMax is not smaller than 0, the inverse DND processor 2050 checks if the order of inverse DND is 1. If the order of inverse DND is not 1, it means that a divide-down operation has been performed on the differential data being decoded in the process of encoding, and thus the inverse DND processor 2050 extends the range of the differential data to a positive number region by performing an inverse divide-down operation, in step S21570.

In a preferred embodiment of the present embodiment, an inverse divide-down operation which is defined by the following equation may be used.

$$\text{inverse} - \text{divide} - \text{down}(v) = v(\text{if } v \geq 0) \quad (24)$$
$$= (nKey\text{Max}_i + 1) + \frac{v-1}{2} (\text{if } v < 0, v\bmod 2 \neq 0)$$
$$= \frac{v}{2} (\text{if } v < 0, v\bmod 2 = 0)$$

If nKeyMax is not smaller than 0 and the order of inverse DND is 1, the inverse DND processor 2050 completes an entire inverse DND operation after performing an inverse divide operation in step S21590. In a preferred embodiment of the present embodiment, an inverse divide operation which is defined by Equation (25) may be used.

$$\text{inverse} - \text{divide}(v) = v(\text{if } v \geq 0) \quad (25)$$
$$= v + (nKey\text{Max}_0 + 1)(\text{if } v < 0)$$

The differential data of key data which have been through the inverse DND operation are input into the inverse folding processor 2040, and the inverse folding processor 2040 performs an inverse folding operation on the differential data so that the differential data which used to be only in a positive number region are divided into positive values and negative values in step S21600. In a preferred embodiment of the present embodiment, an inverse folding operation which is defined by Equation (26) may be used.

$$\text{inverse} - \text{fold}(v) = -\frac{(v+1)}{2} (\text{if } v\bmod 2 \neq 0) \quad (26)$$
$$= \frac{v}{2} (\text{if } v\bmod 2 = 0)$$
$$= 0 (\text{if } v = 0)$$

The differential data which have been through the inverse folding operation are output to the inverse shifter 2030, and the inverse shifter 2030 adds a mode nKeyShift, which has been used in the process of encoding and is input from the header decoder 1910, to the differential data, in step S21700. This operation is expressed by the following equation.

$$\text{inverse-shift}(v) = v + n\text{KeyShift} \quad (27)$$

The inverse DPCM processor 2020 restores the differential data input from the inverse shifter 2030 into quantized key data using the order of DPCM input from the header decoder 1910, in step S21800. The inverse shifter 2030 performs an inverse DPCM operation as many times as the order of DPCM following Equation (28).

$$v(i+1) = v(i) + \text{delta}(i) \quad (28)$$

Here, i indicates an index of differential data and key data, v indicates an array of integers, and delta(i) indicates differential data.

The quantized key data having been through the inverse DPCM operation are input into the inverse quantizer 2010. Then, the inverse quantizer 2010 receives information on whether or not the size nKeyQBit of quantization bits and maximum and minimum values used for inverse quantization are encoded by the floating-point number converter 905 from the header decoder 1910 and converts the quantized key data into inverse-quantized key data in step S21900 using the following equation.

$$\text{inverse} - \text{quantize}(v) = \quad (29)$$
$$fKey\text{Min} + \frac{v}{2^{nKeyQBit} - 1} \times (fKey\text{Max} - fKey\text{Min})$$

If maximum and minimum values used for quantization have not been converted by the floating-point number converter 905 in the process of encoding key data, fKeyMin and fKeyMax shown in Equation (29) are set to 0 and 1, respectively. However, if the maximum and minimum values used for quantization have been converted by the floating-point number converter 905, maximum and minimum values which are inversely converted by a floating-point number inverse converter 2005 are used as the maximum and minimum values, respectively, for inverse quantization.

The decoded key data output from the inverse quantizer 2010 are added to the key data decoded in the linear key decoder 2000, thus constituting decoded key data.

Hereinafter, a linear key decoding process will be described in the following.

The header decoder 1910 decodes key header information from a bitstream. If information on a linear key data region exists in the bitstream, the header decoder 1910 outputs information required for decoding the beginning and ending keys of the linear key data region to the floating-point number inverse converter 2005 and outputs the number of keys, which are encoded as linear keys, to the linear key decoder 2000.

The floating-point number inverse converter 2005 inversely converts the beginning and ending keys of the linear key data region, which are expressed by decimal numbers, into binary numbers and outputs the binary numbers to the linear key decoder 2000.

Supposing two floating-point numbers to be decoded are referred to as fKeyMin and fKeyMax, a process of decoding fKeyMin is as follows.

The header decoder 1910 reads the number of digits of fKeyMin from a bitstream. If the digit number of fKeyMin is 0, fKeyMin is set to 0, and the number of digits of fKeyMax is read from the bitstream in order to decode fKeyMax. If the digit number of fKeyMax is not smaller than 8, it means that fKeyMax has been encoded following the IEEE Standard 754. Thus, the floating-point number fKeyMax is decoded after 32 bits of it are read.

However, if the digit number of fKeyMax is between 1 and 7, the header decoder 1910 reads a sign bit from the bitstream. In a preferred embodiment of the present embodiment, if the sign bit is 1, MinKeyMantissaSign is set to −1. On the other hand, if the sign bit is 0, MinKeyMantissaSign is set to 1. Thereafter, the number of bits required for decoding is obtained referring to Table 3 which shows the relationship between the digit number of a mantissa and the number of bits required for encoding. Next, as many bits of the bitstream as the number of bits required for encoding are read and are stored in nMinKeyMantissa. Then, next one bit of the bitstream is read and is stored in MinKeyExponentSign in the same way as the sign of the mantissa is stored in MinKeyMantissaSign. Next six bits of the bitstream, which correspond to an exponent value, are read and are stored in nMinKeyExponent.

The floating-point number inverse converter 2005 restores fKeyMin by substituting the value input from the header decoder 1910 into Equation (30).

$$fKeyMin = \frac{MinKeyMantissaSign * nMinKeyMantissa}{10^{MinKeyExponentSign*nMinKeyExponent}} \quad (30)$$

A process of restoring fKeyMax is the same as the process of restoring fKeyMin. In particular, it is determined whether or not the same value as the exponent of fKeyMin is used as the exponent of fKeyMax before reading the exponent of fKeyMax from the bitstream. If the same value as the exponent of fKeyMin is not used as the exponent of fKeyMin, the exponent of fKeyMax is read from the bitstream in the same way the exponent of fKeyMin is read from the bitstream.

The linear key decoder 2000 receives the beginning and ending keys of the linear key data region from the floating-point number inverse converter 2005 and decodes the linear key data region following Equation (31).

$$Key_i = fKeyMin + \frac{(fKeyMax - fKeyMin) * i}{(nNumberOfLinearKey - 1)} \quad (31)$$

$$(i = 0, ..., nNumberOfLinearKey - 1)$$

Here, fKeyMin and fKeyMax indicate the beginning and ending key data, respectively, of the linear key data region.

Key data in the linear key data region decoded using the aforementioned method are added to the key data output from the inverse quantizer 2010, and then the results of the adding are output as final key data.

Hereinafter, the structure and operation of the key value data decoder 1950 according to a preferred embodiment of the present embodiment will be described with reference to FIGS. 22A and 23E.

Figure 22A:
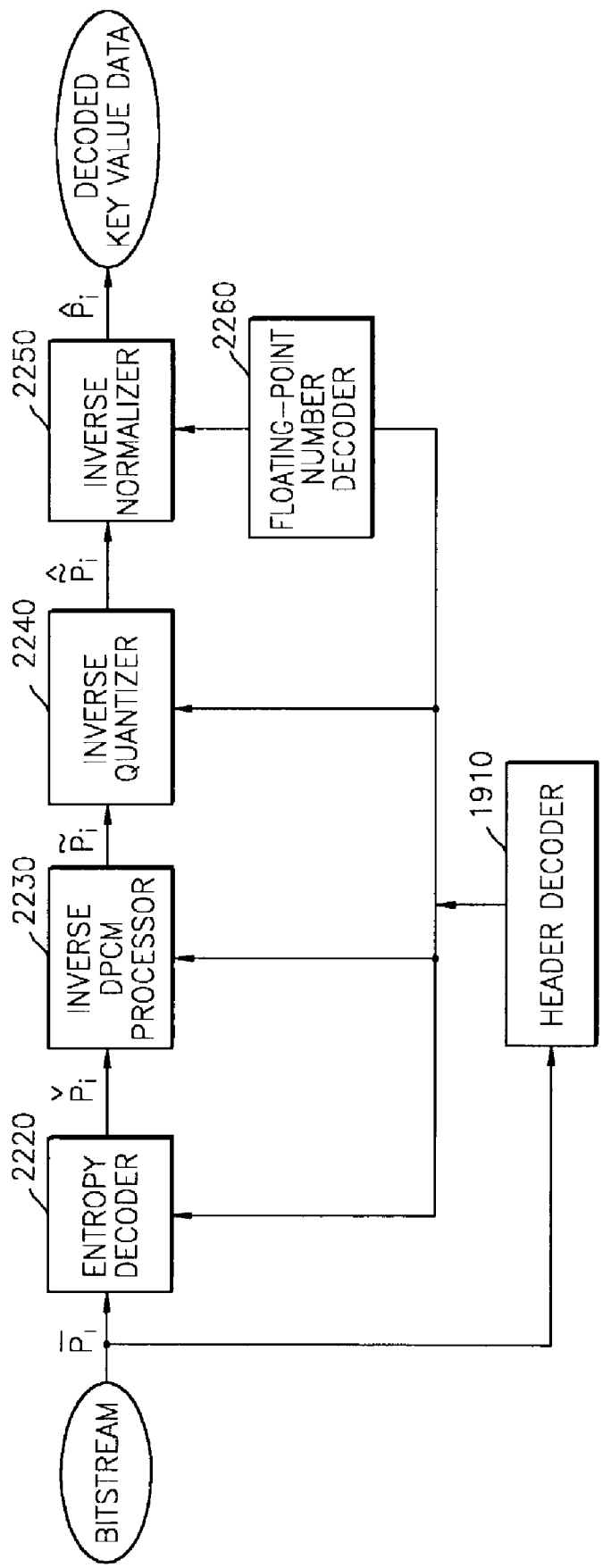
FIG. 22A is a block diagram of a key value data decoder according to a preferred embodiment of the present embodiment.
Figure 22B:
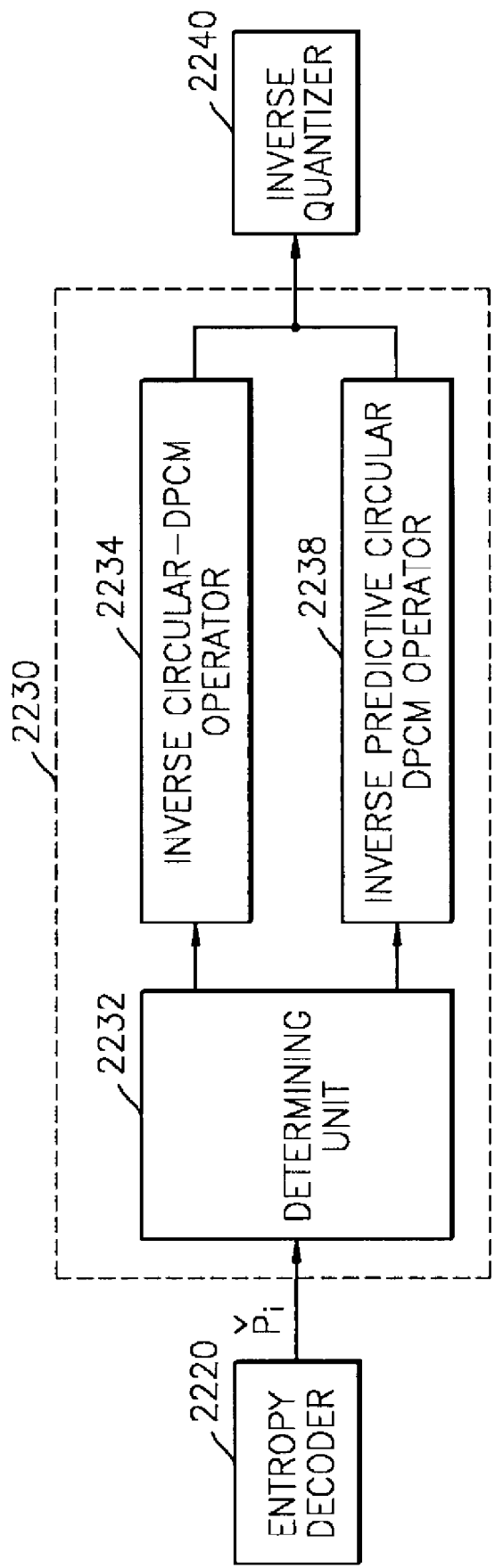
FIG. 22B is a block diagram of an inverse DPCM processor shown in FIG. 22A.

Referring to FIG. 22A, the key value data decoder 1950 includes an entropy decoder 2220, which entropy-decodes the bitstream input thereinto and thus outputs differential data, an inverse DPCM processor 2230, which performs an inverse circular DPCM operation or an inverse predictive-circular DPCM operation on the differential data input from the entropy decoder 2220 and thus outputs quantized key value data, an inverse quantizer 2240, which inverse-quantizes the quantized key value data input from the inverse DPCM processor 2230 and thus outputs normalized key value data, a floating-point number decoder 2260, which receives minimum and maximum values from the header decoder 1910, converts minimum values among the key value data of each of the x, y, and z components and a maximum value of a component having a maximum range into binary numbers, and outputs the binary numbers to the inverse quantizer 2240, and an inverse normalizer 2250, which receives the minimum values among the key value data of each of the x, y, and z components and the maximum value of the component having the maximum range from the floating-point number decoder 2260, calculates the maximum range from the minimum values and the maximum value from the floating-point number decoder 1160 and then inversely normalizes the key value data input from the inverse quantizer 2250.

Figure 23A:
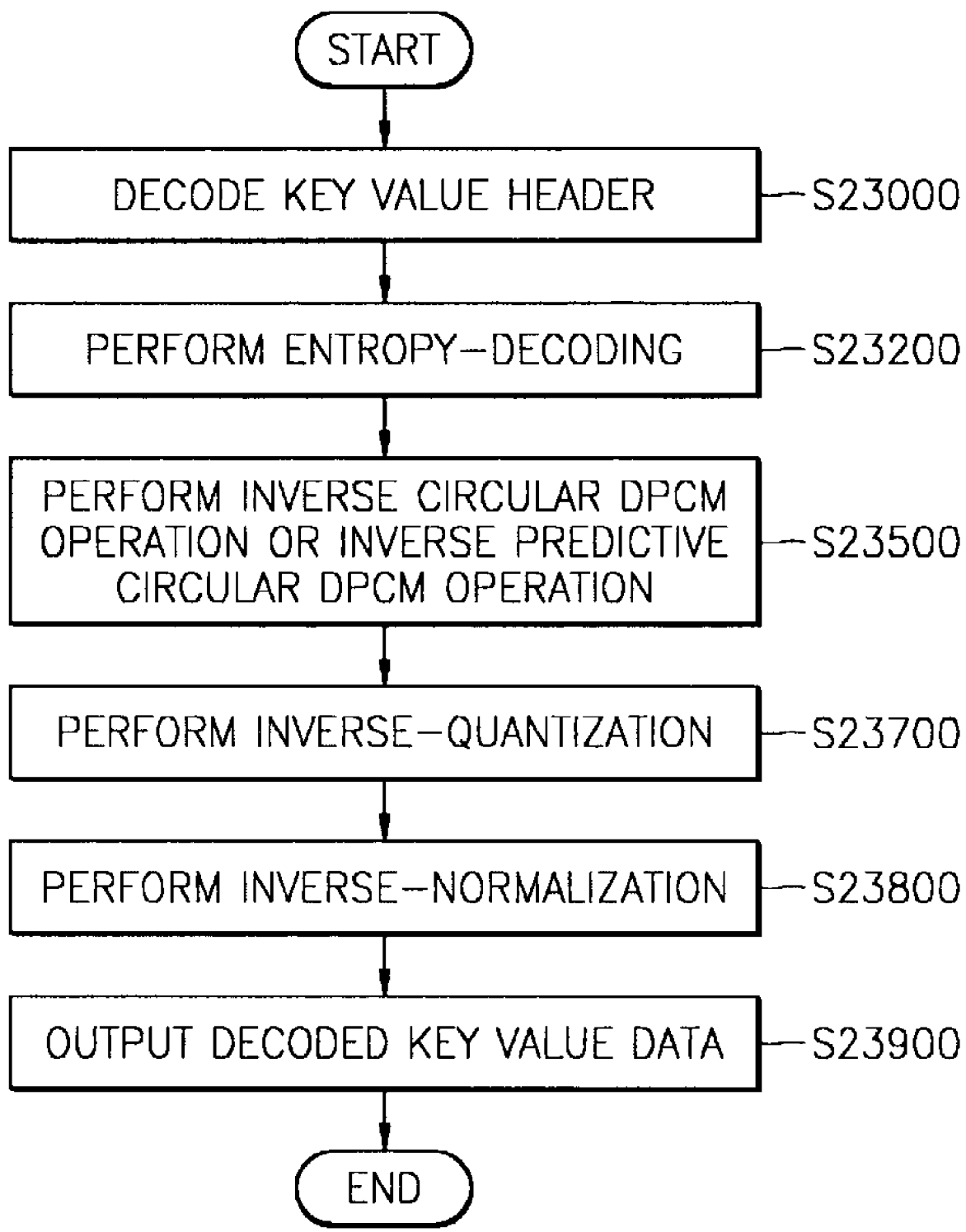
FIGS. 23A through 23E are flowcharts of a method of decoding key value data according to a preferred embodiment of the present embodiment.

Hereinafter, a method for decoding key value data according to a preferred embodiment of the present embodiment will be described with reference to FIG. 23A. Referring to FIG. 23A, a bitstream of encoded key value data is input into the entropy decoder 1120 and the header decoder 1910. Then, the header decoder 1910 decodes header information required for decoding from the bitstream and outputs the decoded header information to the entropy decoder 2220, the inverse DPCM processor 2230, and the inverse quantizer 2240 in step S23000.

The entropy decoder 2220 entropy-decodes the bitstream and then outputs differential data to the inverse DPCM processor 2230 in step S23200.

FIG. 23A is a detailed flowchart of an entropy-decoding process. Referring to FIG. 23A, a bitstream $\overline{P}_i$ is input into the entropy decoder 2220 in step S23200.

The entropy decoder 2220 checks if key value data of a component, for example, x, have the same quantized value, in step S23220. If the key value data of the component have the same quantized value, all symbols of the component are decoded setting them as a minimum value input from the header decoder 1910, for example, fMin_X, in step S23230.

If the key value data of the component do not have the same quantized value, the entropy decoder 2220 checks if the key value data have been encoded using an unary AAC function, in step S23240. If the key value data have been encoded using an unary AAC function, they are decoded using the unary AAC function in step S23250.

The unary AAC function reads 0s from the bitstream until a bit "1" appears, converts the number of 0s into an absolute value, reads a bit next to the bit "1" as a sign of value if the bit is "0", the sign of value is positive, if the bit is "1", the sign of value is negative, and outputs a decoded value.

If the key value data of the component have not been encoded using the unary AAC function, the entropy decoder 2220 decodes the bitstream, into which the key value data of the component are encoded, in step S23300, using an SQ AAC function, which will be described in the following paragraphs.

The entropy decoder 2220 decodes the signs of all the symbols from the bitstream, decodes the maximum value nMax, and initializes the decoding range of all the symbols (ranging from 0 to nMax) and the flag $P_{i\text{-}found}$ as 'false' in step S23310.

Thereafter, the entropy decoder 2220 determines a key value datum to be decoded first (i=nStartIndex) and sets bDone as 'true' in step S23320.

The entropy decoder 2220 performs steps S23330 through S23430 again to decode the symbols.

In particular, the entropy decoder 2220 checks if the maximum value $P_{i\text{-}max}$ and the minimum value $P_{i\text{-}min}$ in the decoding range are the same in step S23330.

If $P_{i\text{-}max}$ and $P_{i\text{-}min}$ are the same, the symbol to be encoded is determined as a maximum value (or a minimum value) in the decoding range in step S23340, and if not, the entropy decoder 2220 sets bDone as 'false' and renews a middle value nMid in the decoding range following Equation (32) in step S23350.

$$nMid = \frac{\check{P}_{imax} + \check{P}_{imin}}{2} + \check{P}_{imin} + 1 \quad (32)$$

The entropy decoder 2220 checks if the context flag $P_{i\text{-}found}$ is true in order to determine a probability model for decoding, in step S23360. If the context flag $P_{i\text{-}found}$ is true, the entropy decoder 2220 decodes the bitstream using FoundContext in step S23370, and if not, the entropy decoder 2220 decodes the bitstream using notFoundContext in step S23380.

The entropy decoder 2220, which has decoded one bit from the bitstream, checks if the bit read from the bitstream is 1 in step S23390, and if not, the entropy decoder 2220 replaces the maximum value $P_{i\text{-}max}$ in the decoding range with the middle value nMid in step S23400. If the bit decoded from the bitstream is 1, the entropy decoder 2220 replaces the minimum value $P_{i\text{-}min}$ in the decoding range with the middle value nMid and sets the context flag $P_{i\text{-}found}$ as 'true' in step S23410.

The entropy decoder 2220 increases the decoding index i by 1 in step S23420, checks if all the key value data of the component are completely decoded in the current stage in step S23430, and performs steps S23330 through S23420 if there are symbols left to be decoded.

If all the key value data in the current stage have been decoded, the entropy decoder 2220 checks if additional stage is needed to decode key value data of the current components in step S22440 and if so, performs steps S23320 through S23430 again. The entropy decoder checks if all key value data of the current component have been decoded, the entropy decoder starts to decode the key value data of the next component.

Figure 23B:
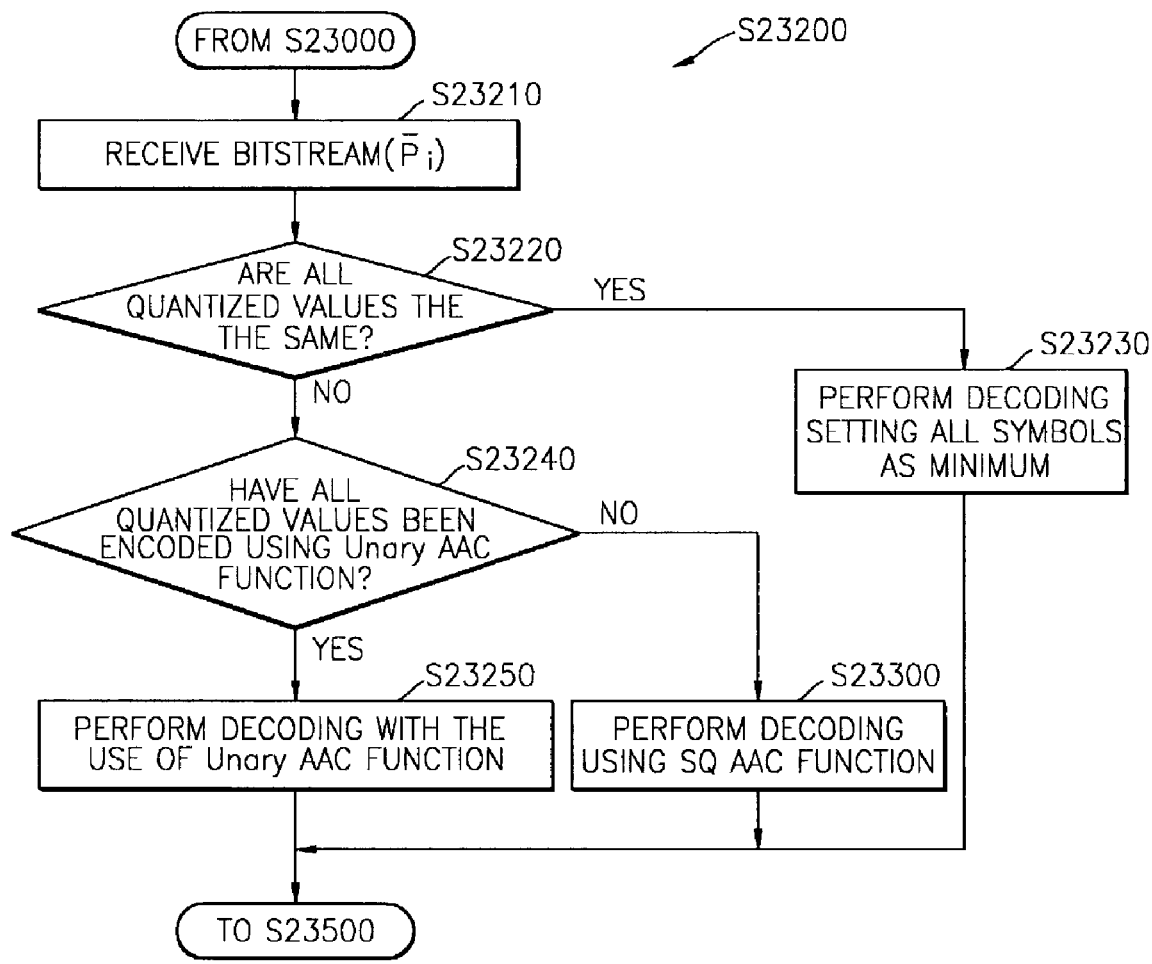
Figure 23C:
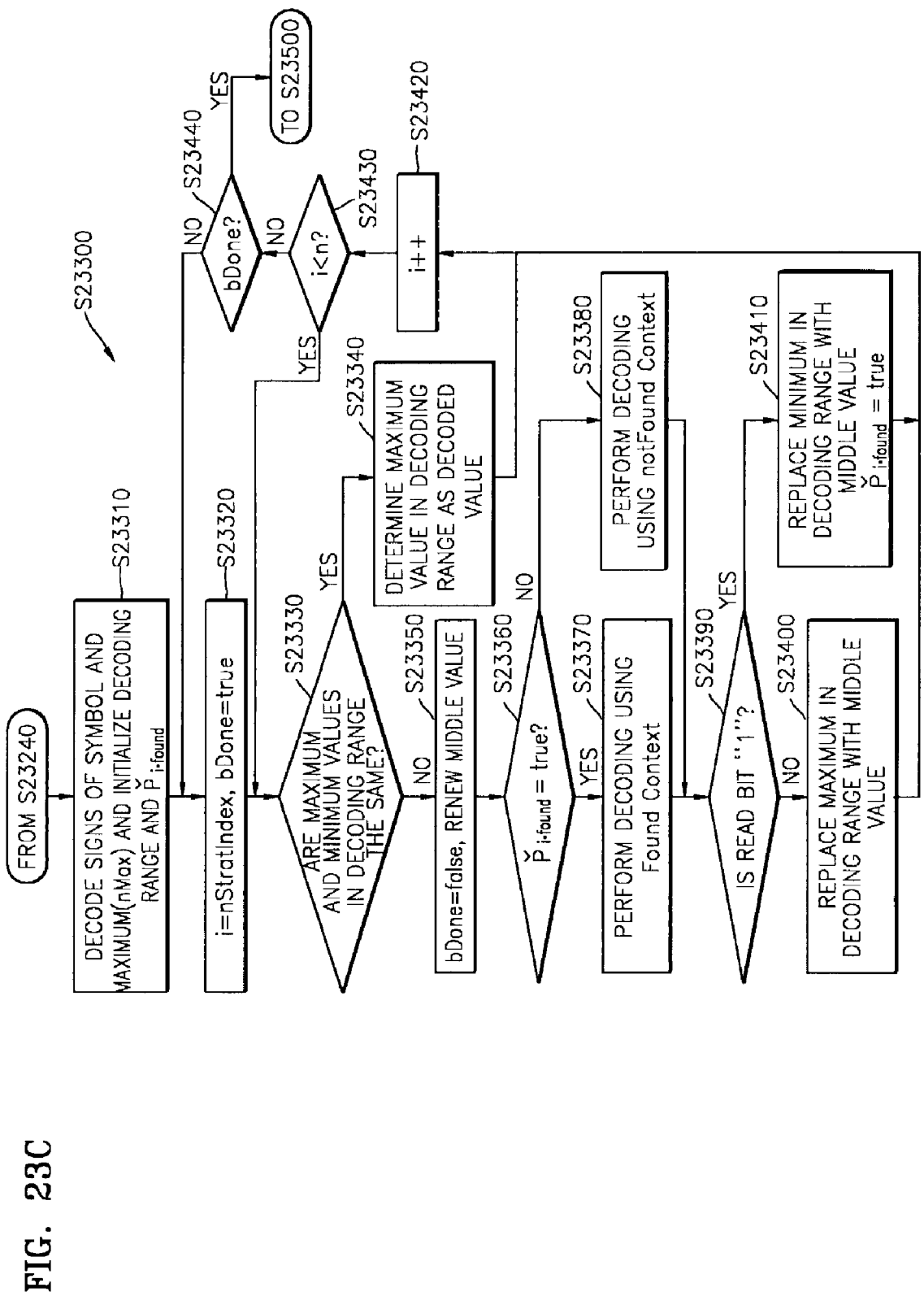

Referring to FIGS. 22A and 23B, differential data of the key value data decoded by the entropy decoder 2220 are input into the inverse DPCM processor 2230, and then the inverse DPCM processor 2230 performs an inverse circular DPCM operation or an inverse predictive-circular DPCM operation on the input differential data depending on the type of DPCM performed on the input differential data.

Figure 23D:
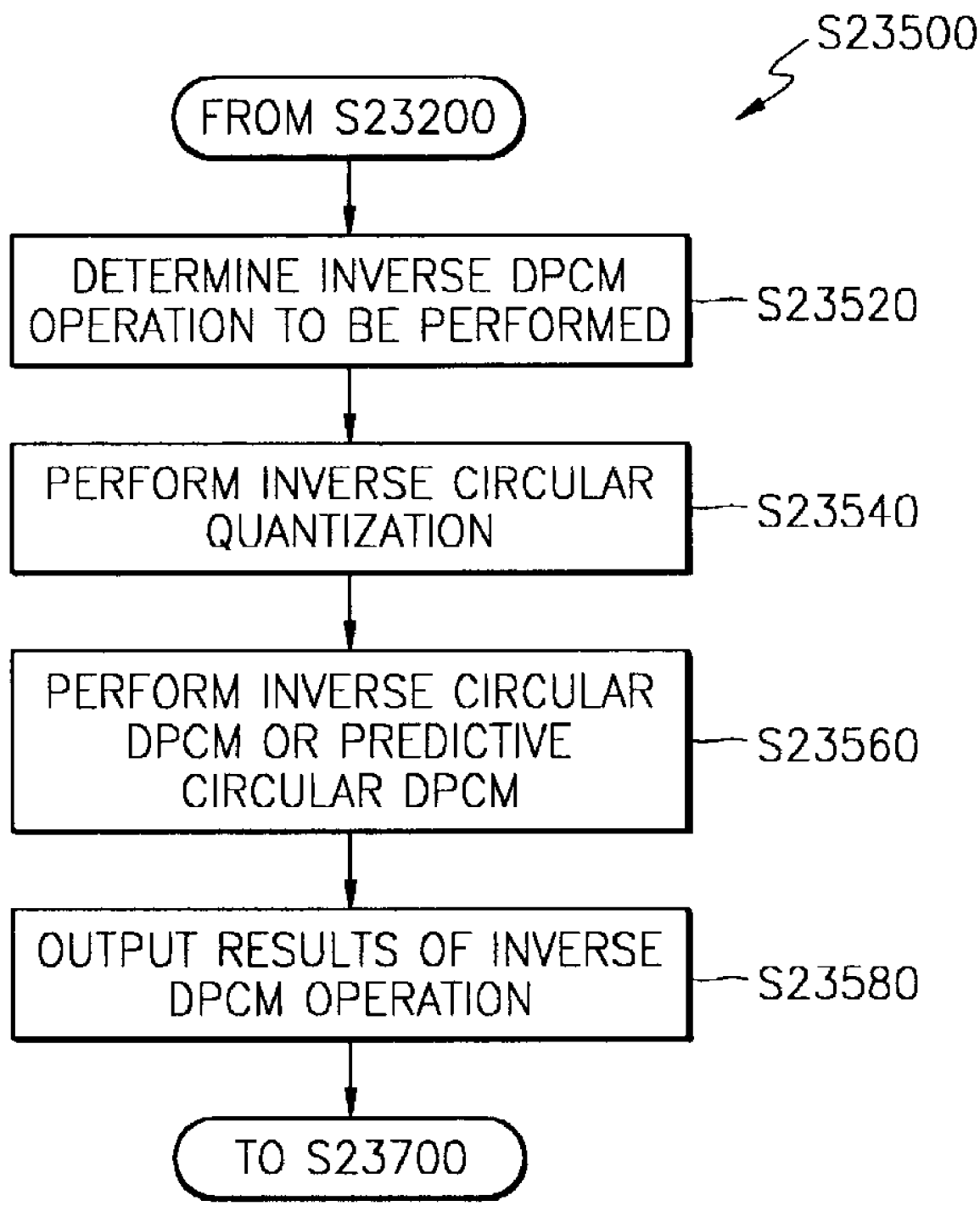
Figure 23E:
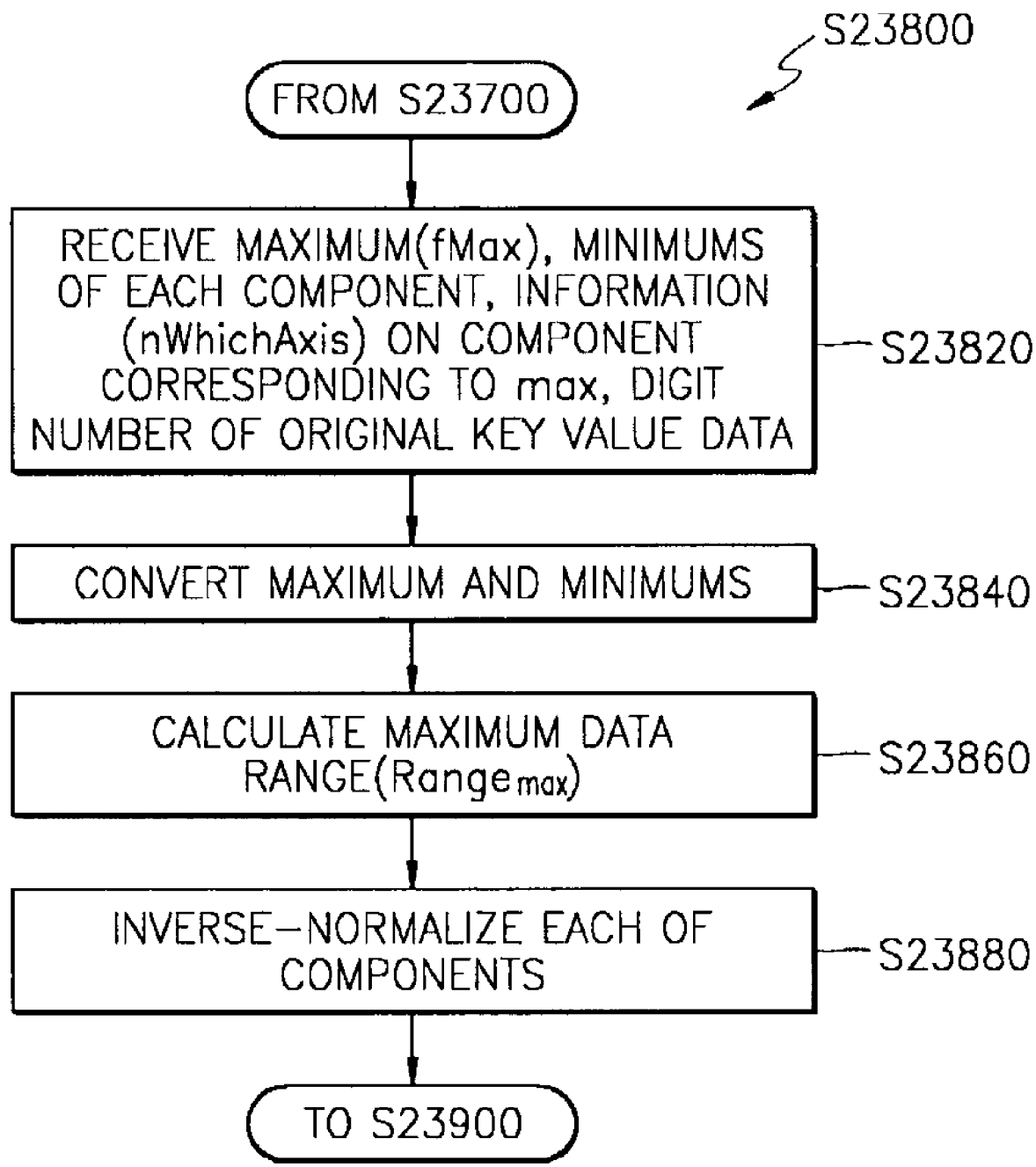

The inverse DPCM operation in step S23500 will be described with reference to FIG. 23D. Referring to FIG. 23D, differential data subjected to an inverse DPCM operation are input into the determining unit 1132. Then the determining unit 1132 identifies what kind of DPCM has been performed on the input differential data, determines what kind of inverse DPCM will be performed on the input differential data based on the result, and outputs the differential data to either the inverse circular DPCM operator 2234 or the inverse predictive-circular DPCM operator 2238 in step S23520.

If the differential data are input into the inverse circular DPCM operator 2234 and nMax is a maximum value in a quantization range of the input differential data, the inverse circular DPCM operator 2234 obtains inversely circular-quantized differential data $P'_i$ in step S23540 by performing inverse circular quantization on the input differential data $P_i$, which is shown in the following equation.

$$\check{P}'_i = \check{P}_i - (n\text{Max}+1)\left(\text{if }\check{P}_i \geq 0\right) \quad (33)$$
$$\check{P}'_i = \check{P}_i + (n\text{Max}+1)\left(\text{if }\check{P}_i < 0\right)$$

Thereafter, the inverse circular DPCM operator 2234 obtains a value A of an inverse-DPCMed differential datum and a value B of an inverse-DPCMed differential datum by substituting input differential data $P_i$ and inversely circular-quantized differential data $P'_i$, respectively, into Equation (34).

$$A = \check{P}_i + \tilde{P}_{i-1}$$
$$B = \check{P}'_i + \tilde{P}_{i-1} \quad (34)$$

In Equation (34), n represents the number of data, and i represents an integer between 1 and n−1.

If A is not smaller than 0 and not greater than nMax, the inverse circular DPCM operator 2234 outputs A as inverse circular-DPCMed data $\tilde{P}_i$. If A is smaller than 0 or greater than nMax, the inverse circular DPCM operator 2234 outputs B in step S23580.

The inverse predictive-circular DPCM operator 2238 obtains the inversely circular-quantized predicted differential data $P'_i$ in step S23540 by performing inverse predictive-circular quantization on the predicted differential data $P_i$ using Equation (33).

In step S23560, if $P = 2 \times \tilde{P}_{i-1} + \tilde{P}_{i-2}$ where P represents predicted data used for decoding, the inverse predictive-circular DPCM operator 2338 calculates A by substituting $P_i$ into Equation (35) and calculates B by substituting $P'_i$ into Equation (36).

$$A = nMax - \breve{P}_i \text{ (if } P > nMax) \quad (35)$$

$$A = \breve{P}_i \text{ (if } P < 0)$$

$$A = \breve{P}_i + P \text{ (otherwise)}$$

$$B = nMax - \breve{P}'_i \text{ (if } P > nMax) \quad (36)$$

$$B = \breve{P}'_i \text{ (if } P < 0)$$

$$B = \breve{P}'_i + P \text{ (otherwise)}$$

In Equations (35) and (36), n represents the number of data and i is an integer between 1 and n−1.

If A is not smaller than 0 and not greater than nMax, the inverse predictive-circular DPCM operator 2238 outputs A as the inversely predicted-circular-DPCMed data $\tilde{P}_i$. If A is smaller than 0 or greater than nMax, the inverse predictive-circular DPCM operator 2238 outputs B as $\tilde{P}_i$ in step S23580.

The inverse DPCM processor 2230 outputs quantized key value data $\tilde{P}_{i,j}$ generated by an inverse DPCM operation to the inverse quantizer 2240, and then the inverse quantizer 2240 inverse-quantizes $\tilde{P}_{i,j}$ using the quantization bits nKeyValueQBits input from the header decoder 1910 in step S23700. When n represents the number of key value data input from the header decoder 1910, the inverse quantization performed in the inverse quantizer 2240 can be expressed by the following equation.

$$\hat{P}_{ij} = \frac{\tilde{P}_{ij}}{(2^{nKeyValueQBits} - 1)} (i = nStartIndex, \ldots, n; j = x, y, z) \quad (37)$$

The inverse quantizer 2240 generates normalized data by performing inverse quantization on the key value data of each of the x, y, and z components and outputs the normalized key value data of each of the x, y, and z components to the inverse normalizer 2250.

The inverse normalizer 2250 inversely normalizes normalized key value data using information input from the floating-point number decoder 2260 in step S23800. The inverse normalization performed in the inverse normalizer 2250 will be described more fully with reference to FIG. 23E.

The floating-point number decoder 2260 receives, from the header decoder 1910, the maximum value fMax to be used for inverse normalization, the minimum values fMin_X, fMin_Y, and fMin_Z of the x, y, and z components, respectively, the information nWhichAxis on which component axis has a maximum value, and the information bUse32Float on the type of encoding in step S23820.

The floating-point number decoder 2260 converts fMax, fMin_X, fMin_Y, and fMin_Z represented by decimal numbers into binary numbers and outputs the binary numbers to the inverse normalizer 2250 in step S23840.

The inverse normalizer 2250 identifies based on bUse32Float whether or not fMax, fMin_X, fMin_Y, and fMin_Z are encoded with an IEEE Standard 754 floating-point number format, and if they are not encoded with the IEEE Standard 754 floating-point number format, the inverse normalizer 2250 calculates a maximum value $Range_{max}$ in a maximum data range using the following equations. If fMax, fMin_X, fMin_Y, and fMin_Z are encoded with the IEEE Standard 754 floating-point number format, the inverse normalizer 2250 determines fMax as $Range_{max}$ in step S23860.

$$Range_{max} = fMax - fMin\_X \text{ (if } nWhichAxis = 0) \quad (38)$$

$$Range_{max} = fMax - fMin\_Y \text{ (if } nWhichAxis = 1)$$

$$Range_{max} = fMax - fMin\_Z \text{ (if } nWhichAxis = 2)$$

If $Range_{max}$ is determined, the inverse normalizer 2250 inversely normalizes the data of each of the x, y, and z components based on $Range_{max}$ using the following equations in step S23880.

$$\hat{P}_{i,x} = \tilde{P}_{i,x} \times Range_{max} + fMin\_X$$

$$\hat{P}_{i,y} = \tilde{P}_{i,y} \times Range_{max} + fMin\_Y$$

$$\hat{P}_{i,z} = \tilde{P}_{i,z} \times Range_{max} + fMin\_Z \text{ (i=0,1 \ldots, n)} \quad (39)$$

In Equation (39), n represents the number of data.

The inverse normalizer 2250 outputs inversely normalized key value data to the position interpolator synthesizer 1980 in step S23900.

Hereinafter, the position interpolator synthesizer 1980, which synthesizes decoded key data and decoded key value data, will be described.

Figure 24:
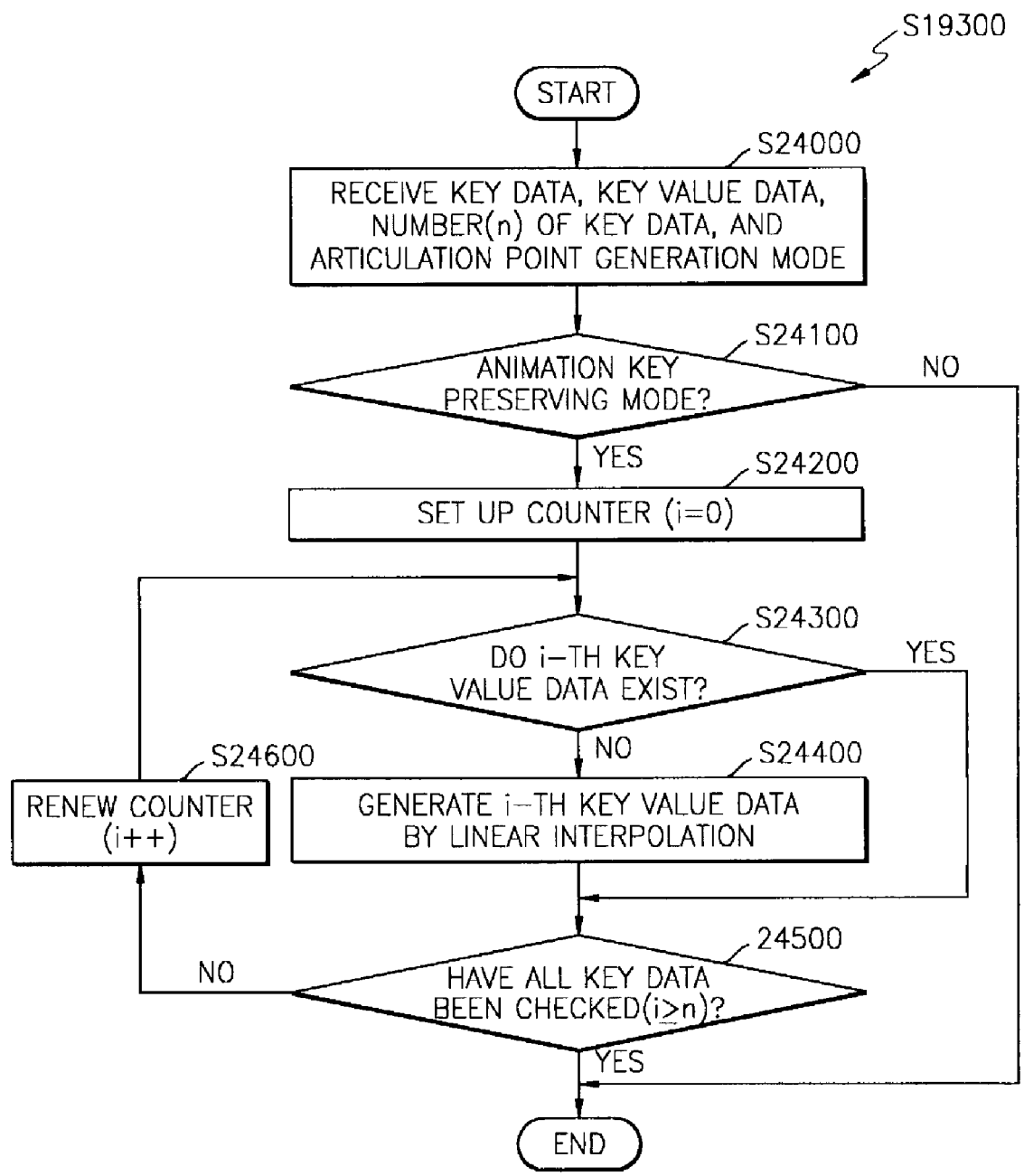
FIG. 24 is a flowchart of a method of synthesizing key data and key value data of a position interpolator according to a preferred embodiment of the present embodiment.

FIG. 24 is a flowchart of the operation of the position interpolator synthesizer 1980.

The position interpolator synthesizer 1980 receives decoded key data and decoded key value data and receives the number of key data, a break point generation mode and the key selection flags from the header decoder 1910 in step S24000.

The position interpolator synthesizer 1980 outputs the decoded key data and the decoded key value data in step S24100 when the break point generation mode is an animation path-preserving mode. In a case where break points have been extracted in an animation-path preserving mode, key data correspond to key value data, and thus there is no need to generate new key value data using interpolation. However, if the break points have been extracted in an animation key-preserving mode, it means only key value data corresponding to the break points have been encoded while all key data have been encoded and decoded. Accordingly, in this case, the key data do not correspond to the key value data, and thus it is necessary to interpolate key value data, which will be described in the following paragraphs.

When the break point generation mode is an animation key preserving mode, a counter, which indicates an index of the array of key selection flags, is set up so as to correspond to key data in step S24200, in order to figure out whether or not key value data corresponding to the key data exist.

The position interpolator synthesizer 1980 checks if key value data corresponding to the key data indicated by the counter exist. If key value data corresponding to the key data indicated by the counter exist, then the position interpolator synthesizer 1980 goes to step S24500 in step S24300.

If there is no key value data corresponding to the key data indicated by the counter, the position interpolator synthesizer 1980 generates key value data in step S24400 by linearly interpolating current key value data using key value data corresponding to key data indicated by two successive break points including one prior to the key data indicated by the counter and the other next to the key data indicated by the counter.

Thereafter, the position interpolator synthesizer 1980 checks if all the key data have their corresponding key value data and linear interpolation has been performed on all the key data not having their corresponding key value data in step S24500. If there still exists key data, which have not been checked, the position interpolator synthesizer 1980 renews the counter and performs steps 24300 through S24500 again in step S24600. If all the key data have been checked, the position interpolator synthesizer 1980 outputs key data and synthesized key value data as a position interpolator.

Hereinafter, a method of measuring an error between animation paths will be described with reference to FIGS. 25A through 27.

Figure 25A:
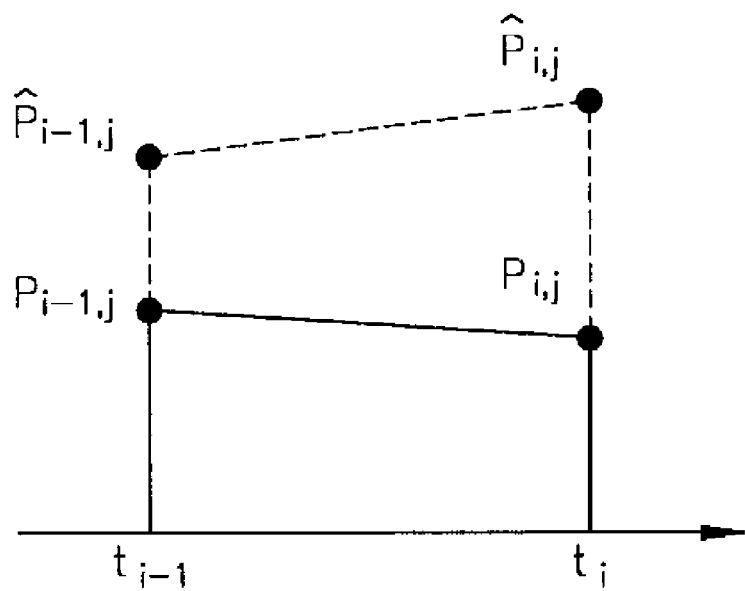
FIGS. 25A and 25B are diagrams illustrating a method of measuring an error between animation paths, which is performed in an analyzer shown in FIG. 3A.
Figure 25B:
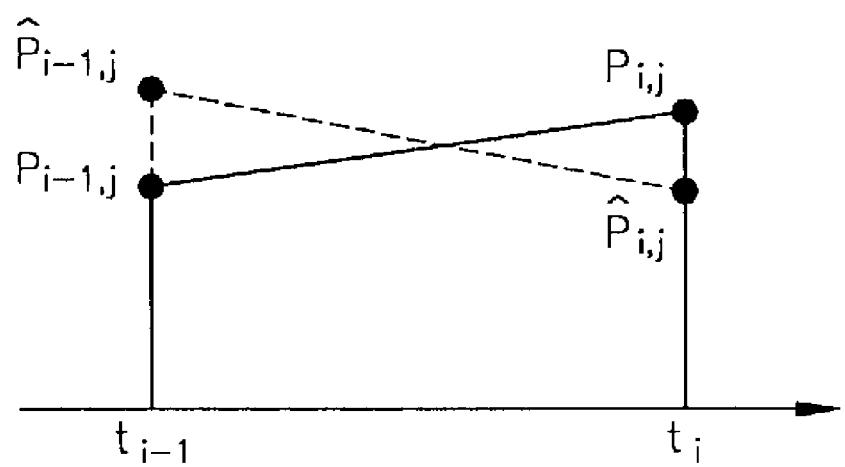

FIGS. 25A and 25B are diagrams illustrating a method of measuring an error between animation paths, which is performed in the analyzer 40 of any of the first through third embodiments of the present embodiment.

An error between animation paths is calculated using an area between the animation paths, as shown in FIGS. 25A and 25B.

In FIG. 25, a path point of an original position interpolator and a position interpolator generated by interpolating the path points extracted from the error calculator 154 of the analyzer 40 are referred to as $P_{i,j}$ and $\hat{P}_{i,j}$, respectively. In addition, in FIG. 25, an original animation path and an animation path generated using an interpolated position interpolator are marked by a solid line and a dotted line, respectively. Here, i and j represent components of key value data of a position interpolator.

As shown in FIGS. 25A and 25B, an error between an original animation path and an animation path generated using an interpolated position interpolator can be represented by two different shapes of trapezoids including a regular trapezoid and a twisted trapezoid. The error calculator 154 of the analyzer 40 generates a final error between the two animation paths by dividing the two animation paths of each of components into a predetermined number of sections in consideration of key data constituting each of the animation paths, calculating an error between the two animation paths in each of the sections, and adding all the errors.

Specifically, the error calculator 154 generates two animation paths by arranging an original position interpolator and an interpolated position interpolator input thereinto on a temporal axis. Thereafter, the error calculator 154 divides each of the two animation paths into a predetermined number of sections.

The error calculator 154 checks if an error between the two animation paths in each of the sections forms a trapezoid or a twisted trapezoid. If an error between the two animation paths in a section forms a trapezoid, the error calculator 154 calculates the area of the trapezoid using Equation (40). If the error between the two animation paths in the section forms a twisted trapezoid, the error calculator 154 calculates the area of the twisted trapezoid using Equation (41).

$$e_{i,j} = \frac{1}{2}(|\hat{P}_{i-1,j} - P_{i-1,j}| + |\hat{P}_{i,j} - P_{i,j}|) \times (|t_{i,j} - t_{i-1,j}|) \quad (40)$$

$$e_{i,j} = \frac{(\hat{P}_{i-1,j} - P_{i-1,j})^2 + (\hat{P}_{i,j} - P_{i,j})^2}{2(|\hat{P}_{i-1,j} - P_{i-1,j}| + |\hat{P}_{i,j} - P_{i,j}|)} \times (|t_{i,j} - t_{i-1,j}|) \quad (41)$$

The sum of the errors between the two animation paths in all the sections of one component is calculated following Equation (42).

$$e_j = \sum_{i=0}^{n-1} e_{i,j}(j = x, y, z) \quad (42)$$

The error calculator 154 outputs the sum of the errors, obtained from Equation (42), to the determining unit 156, and the determining unit 156 determines break points after comparing the sum of the errors input from the error calculator 154 and an allowable error limit.

In addition, it is possible to calculate an error between the two animation paths in all the sections by adding errors between the two animation paths for each of the x, y, and z components of key value data and normalizing the errors with respect to space, which is shown in Equation (43).

$$\text{Max}_j = \text{Max}_{i=0}^{n-1}(\overline{P}_{i,j}) \quad (43)$$
$$\text{Min}_j = \text{Min}_{i=0}^{n-1}(\overline{P}_{i,j})$$
$$\text{Range}_{max} = \text{Max}(\text{Max}_x - \text{Min}_x, \text{Max}_y - \text{Min}_y, \text{Max}_z - \text{Max}_z)$$
$$e_{i,j} = \frac{e_x + e_y + e_z}{3 \times \text{Range}_{max}}(i = 0, \ldots, n-1, j = x, y, z)$$

The method of measuring an error between two animation paths according to the present embodiment may be used to calculate an error between a first animation path generated using a position interpolator input into an apparatus for encoding a position interpolator and a second animation path generated using a decoded position interpolator.

Figure 26A:
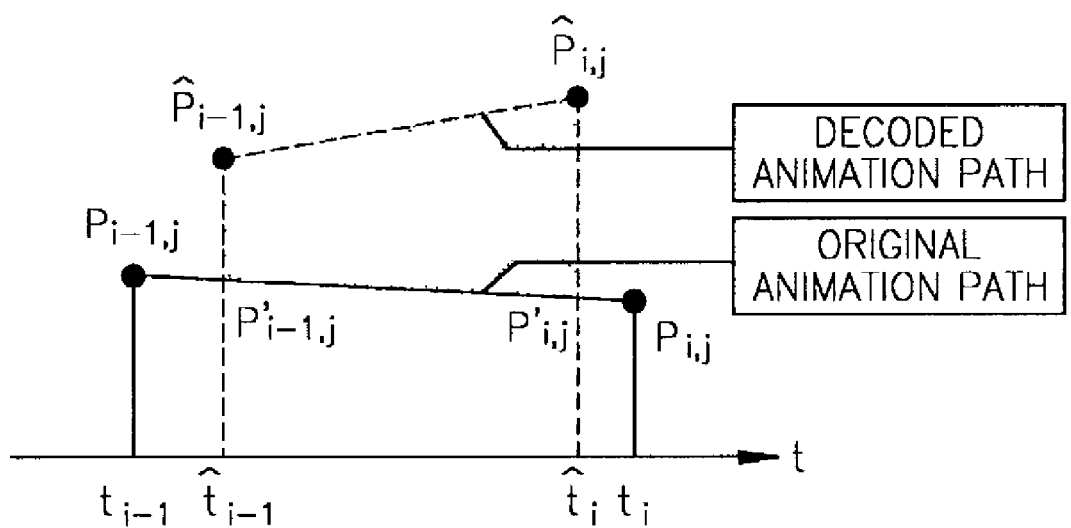
FIGS. 26A through 26C are diagrams illustrating a method of measuring an error between a position interpolator to be encoded and a decoded position interpolator.
Figure 26B:
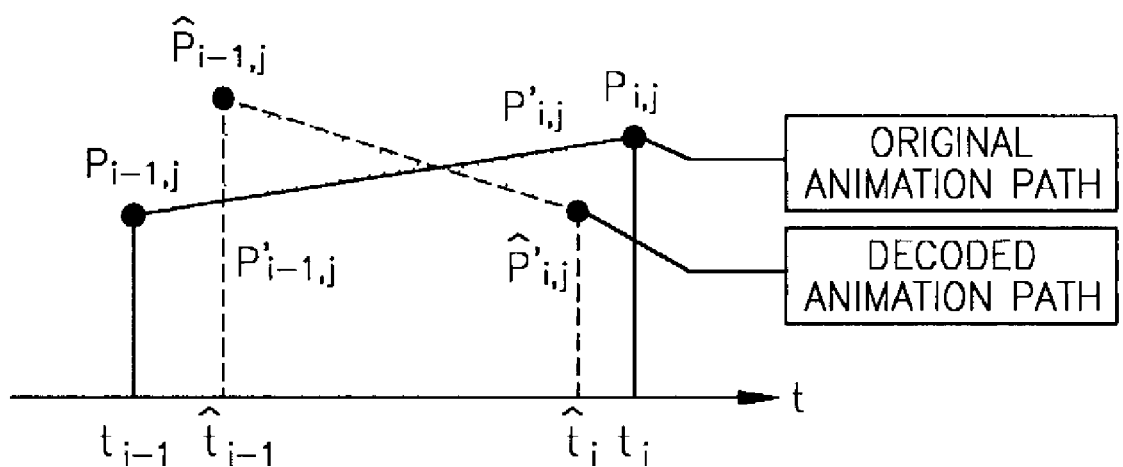
Figure 26C:
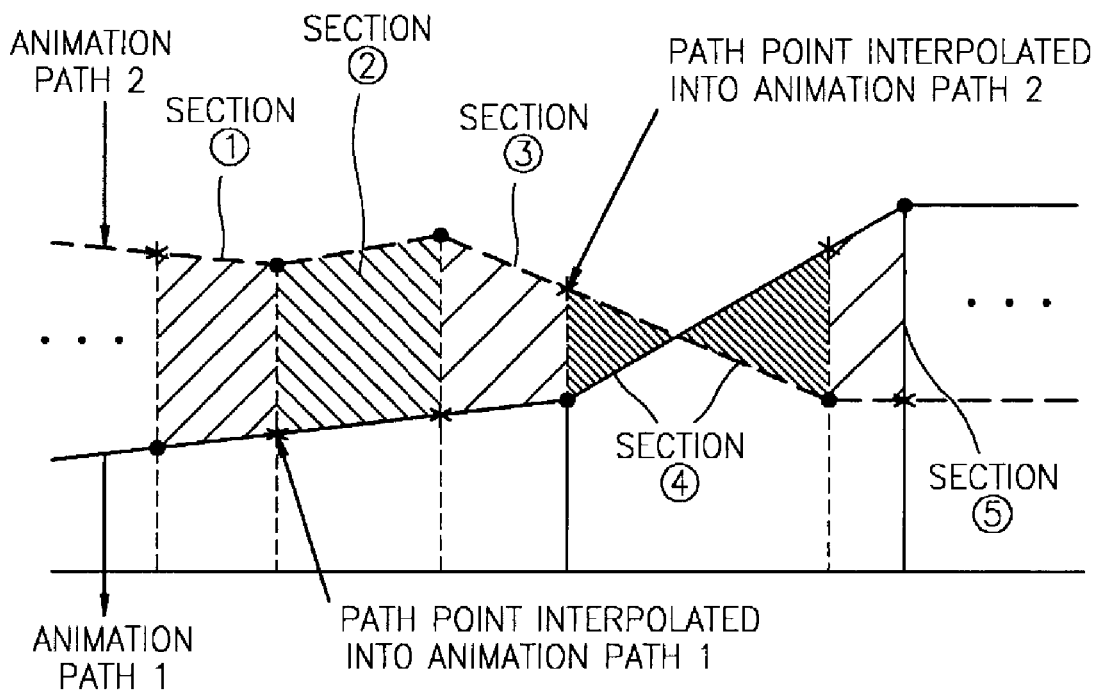
Figure 27:
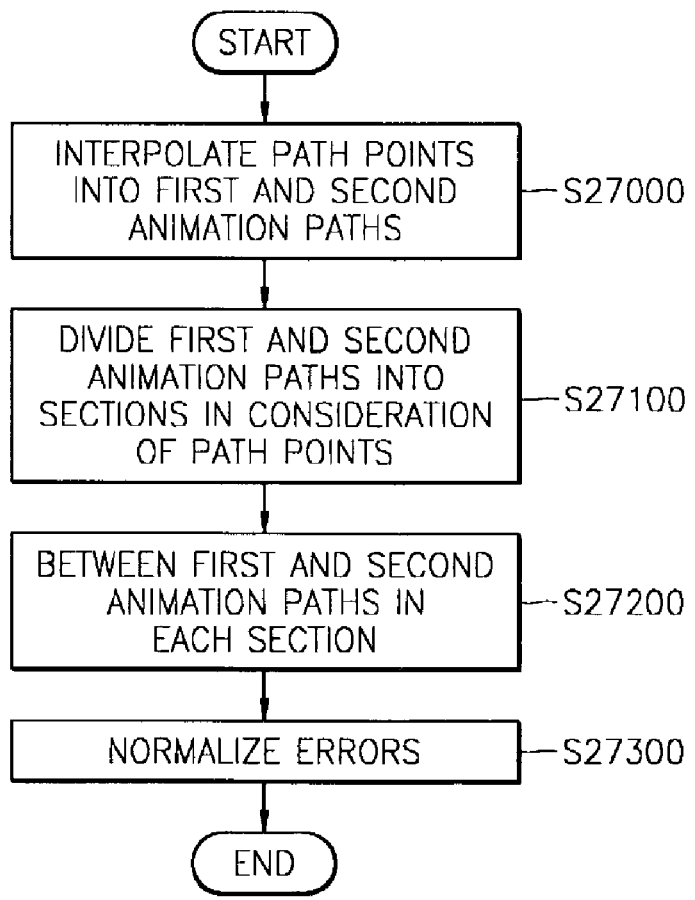
FIG. 27 is a flowchart of a method of measuring an error between a position interpolator to be encoded and a decoded position interpolator.

FIGS. 26A through 26C are diagrams illustrating a process of calculating an error between first and second animation paths, and FIG. 27 is a flowchart of the process of calculating an error between first and second animation paths.

Hereinafter, the method of calculating an error between the first and second animation paths will be described with reference to FIGS. 26A through 26C and 27.

Since key data and key value data of a decoded position interpolator have been through adding, subtraction, interpolation, and quantization during an encoding process, the decoded position interpolator is not the same as the original position interpolator. In particular, it is necessary to compensate for the locations of key data because the key data vary, unlike in the process of calculating an error between two animation paths performed in the analyzer 40.

FIG. 26A is a diagram illustrating a regular trapezoid formed between a first animation path and a second animation path, and FIG. 26B is a diagram illustrating a twisted trapezoid formed between a first animation path and a second animation path. As described above, it is necessary to make key data constituting a first animation path correspond to key data constituting a second animation path in order to measure an error between the first and second animation paths by dividing the first and second animation paths into sections, which is shown in Equations (40) through (42).

Referring to FIGS. 26C and 27, path points corresponding to key data, which exist not on the first animation path but on the second animation path, are inserted into the first animation path, and path points corresponding to key data, which exist not on the second animation path but on the first animation path, are inserted into the second animation path in step S27000.

Thereafter, the first and second animation paths are divided into a plurality of sections based on the existing path points and the interpolated path points in step S27100.

It is verified first if an error between the first and second animation paths in each of the sections forms a trapezoid or a twisted trapezoid, and then the error between the first and second animation paths is calculated using Equations (40) and (41) in step S27200.

Thereafter, an error between the first animation path generated using the original position interpolator and the second animation path generated using the decoded position interpolator is calculated in step S27300 by adding and temporally and spatially normalizing the errors between the first and second animation paths in all the sections. The normalization of the errors between the first and second animation paths can be defined by the following equation.

$$e_{i,j} = \frac{e_x + e_y + e_z}{2(t_{Max} - t_{Min})\text{Range}_{max}} (i = 0, \ldots, n-1, j = x, y, z) \quad (44)$$

In equation (44), $t_{Max}$ and $t_{Min}$ represent beginning key data and ending key data of an animation path, respectively, and $\text{Range}_{max}$ is a value obtained from Equation (43).

FIG. 28A is a diagram illustrating a class CompressedPositionInterpolator. CompressedPositionInterpolator is a top class used for reading an encoded bitstream of an orientation interpolator. CompressedPositionInterpolator includes subclasses KeyHeader, PosIKeyValueHeader, KeySelectionFlag, Key, and PosIKeyValue. KeyHeader and PosIKeyValueHEader include header information used to decode Key and PosIKeyValue. KeySelectionFlag has a series of flags indicating each key data when key value data corresponding to the key data are included in PosIKeyValue. Key and PosIKeyValue are classes for reading key data and key value data, respectively, from a bitstream.

FIG. 28B is a diagram illustrating a class for decoding a key header, which is information required for a decoding process.

The key header class includes the number of key data, quantization bits, intra key data, a DND header and the number of bits actually used for decoding. nKeyQBit represents quantization bits used in inverse quantization to retrieve floating-point key values. nNumKeyCodingBit indicates a bit size of nNumberOfKey representing the number of key data. nKeyDigit indicates a number of most significant digits of original key data and is used to round off decoded values.

When information on linear key sub-regions is included in a key header, a flag bIsLinearKeySubRegion is set to 1. In this case, keys included in specific linear key sub-regions within an entire key region can be calculated using decoded header information following a flag bIsLinearKeySubRegion. bRangeFlag indicates whether or not key data ranges from 0 to 1. If key data does not range from 0 to 1, minimum and maximum values within the key data range are decoded from a class KeyMinMax. KeyMinMax retrieves the minimum and maximum values required for inverse quantization. Each of the aforementioned values can be divided into their respective mantissas and exponents.

nBitSize is a bit size of nQIntraKey, and nKeyShift is an initial bit size of nKeyMax. nQIntraKey indicates the magnitude of first quantized intra data and is combined with nQIntraKeySign indicating a sign of nQIntraKey. nQIntraKey is used as a base required for retrieving other quanitzed key data. In all sign bits used in interpolator compression, a value '0' denotes a positive sign, and a value '1' denotes a negative sign. nKDPCMOrder indicates a value, which is the order of DPCM minus 1. The order of DPCM may be 1, 2, or 3. The number of quantized intra data is the same as the order of DPCM.

nKeyShift, together with a sign bit nKeyShiftSign, is an integer indicating the amount of shift in a key data decoder. nKeyShift and nKeyShiftSign are decoded if bShiftFlag is set as 'true'. nDNDOrder is the order of divide-and-divide (DND) operation. The DND operation has been described above with a key data decoder. If the value of nDNDOrder is 7, then bNoDND is decoded. bNoDND indicates whether or not an inverse DND operation will be performed. nKeyMax is a maximum value or a minimum value used during successive cycles of an inverse DND operation. nKeyCodingBit indicates bits used for encoding key data. bSignedAACFlag indicates a decoding process to be performed during AAC decoding. If bSigneAACFlag is set to 0, an unsigned AAC decoding process will be performed. Otherwise, a signed AAC decoding process will be performed. bKeyInvertDownFlag is a Boolean value indicating whether or not nKeyInvertDown will be used. nKeyInvertDown is an integer used to convert all quantized key data of greater than itself into negative values of no greater than −1. If nKeyInvertDown is set to −1, then a shift-down operation will not be performed.

FIG. 28C is a diagram illustrating a class LinearKey. In FIG. 28C, nNumLinearKeyCodingBit is a value indicating the number of bits necessary to encode a predetermined number of linearly predictable keys. nNumberOfLinearKey is a value indicating the number of linearly predictable keys.

FIG. 28D is a diagram illustrating a class KeyMinMax. In FIG. 28D, bMinKeyDigitSame is a flag indicating if the number (nKeyDigit) of most significant digits of all keys and the number of most significant digits of a minimum value among the keys are the same. nMinKeyDigit is a value indicating the number of most significant digits of the minimum value among the keys. nMinKeyMantissaSign is a value indicating a sign of nMinKeyMantissa.

nMinKeyMantissa is a value indicating the mantissa of the minimum value among the keys. nMinKeyExponentSign is a value indicating a sign of nMinKeyExponent.

nMinKeyExponent is a value indicating the exponent of the minimum value among the keys. fKeyMin is a value indicating the minimum value among the keys. bMaxKeyDigitSame is a flag indicating if the number nKeyDigit of most significant digits of all the keys and the number of most significant digits of a maximum value among the keys are the same. nMaxKeyDigit is a value indicating the number of most significant digits of the maximum value among the keys. nMaxKeyMantissaSign is a value indicating a sign of nMaxKeyMantissa. nMaxKeyMantissa is a value indicating the mantissa of the maximum value among the keys.

bSameExponent is a flag indicating if the exponent of the maximum value among the keys is the same as nMinKeyExponent. nMaxKeyExponentSign is a value indicating a sign of nMaxKeyExponent. nMaxKeyExponent is a value indicating the exponent of the maximum value among the keys. FKeyMax is a value indicating the maximum value among the keys.

FIG. 28E is a diagram illustrating a class PosIKeyValueHeader. In FIG. 28E, bPreserveKey indicates whether or not a current decoding mode is an animation key preserving mode, and nKVQBit indicates a quantization bit size of key value data.

x_keyvalue_flag, y_keyvalue_flag, and z_keyvalue_flag represent the three x, y, and z components, respectively, and nKVDigit represents a maximum number of most significant digits of each of the key value data. NKVDPCMOrder_X, nKVDPCMOrder_Y, and nKVDPCMOrder_Z correspond to the order of DPCM used for the key value data of each of the x, y, and z components, respectively. If DPCM has been performed, a flag is set to 0, and if predictive DPCM has been performed, the flag is set to 1.

bIsUnaryAAC_X, bIsUnaryAAC_Y, and bIsUnaryAAC_Z each indicate that an unary AAC function has been used during entropy-encoding. nKVCodingBit_X, nKVCodingBit_Y, and nKVCodingBit_Z indicate quantization bits for the x, y, and z components, respectively. nStartIndex_X, nStartIndex_Y, and nStartIndex_Z represent the start index of each component axis. firstKV_X, firstKV_Y, and firstKV_Z represent a key value datum of each of the x, y, and z components, respectively, which has been quantized first.

FIG. 28F is a diagram illustrating a class KeyValueMinMax. Referring to FIG. 28F, a class KeyValueMin retrieves the maximum and minimum values that have been used for normalization of key value data. bUse32float indicates whether or not a 32-bit floating-point number has been used to store the maximum and minimum values. If bUse32Float is 0, a floating-point number in the decimal system has been used to store the maximum and minimum values.

nWhichAxis represents a component having a maximum data range among the x, y, and z components. In the present embodiment, if nWhichAxis is 0, the X-axis has a maximum data range, if nWhichAxis is 1, the Y-axis has a maximum data range, and if nWhichAxis is 2, the Z-axis has a maximum data range.

bAllSameMantissaDigitFlag indicates whether or not the mantissas of minimum values among the key value data of each of the x, y, and z components have the same digit number, and bSameKVDigitFlag represents the digit number of the mantissas of the minimum values is the same as nKVDigit. nMantissaDigit_X, nMantissaDigit_Y, and nMantissaDigit_Z represent the digit number of the mantissas of the minimum values among the key value data of each of the x, y, and z components.

bMaxDigitFlag indicates whether or not the mantissa of a maximum value has the same digit number as a minimum value. If the digit number of the mantissa of the maximum value is different from the digit number of the mantissa of the minimum value, the digit number of the mantissa of the maximum value is read from the bitstream.

nMantissaDigit_M represents the digit number of the mantissa of the maximum value, and nExponentBits represents the number of bits required for encoding the exponent of the maximum value. bAllSameExponentSign indicates whether or not the signs of the x, y, and z components are the same, and nExponentSign represents the sign of an exponent when bAllSameExponentSign is true.

fpnMin_X, fpnMin_Y, fpnMin_Z, and fpnMax represent floating-point numbers in the decimal system which are decoded. A method of decoding fpnMin_X, fpnMin_Y, fpnMin_Z, and fpnMax will be described later with FloatingPointNumber. fMin_X, fMin_Y, and fMin_Z represent a minimum value among the key value of each of the x, y, and z components, and fMax represents a maximum value among the key value data of the component having the maximum range.

FIG. 28G is a diagram illustrating a class FloatingPointNumber. A class FloatingPointNumber expresses floating-point numbers using the decimal system. nMantissa represents the mantissa of a floating-point number in the decimal system, and nExponent represents the exponent of the floating-point number.

nSign represents the sign of a floating-point number in the decimal system, and nExponentSign represents the sign of the exponent of the floating-point number in the decimal system.

FIG. 28H is a diagram illustrating a class KeySelectionFlag. In FIG. 28H, keyFlag indicates whether or not key value data of i-th key data have been encoded, and nNumOfKeyValue is an integer representing the number of key value data to be decoded.

FIG. 28I is a diagram illustrating a class Key. In FIG. 28I, nQKey is an array of quantized key data to be decoded from a bitstream. KeyContext is a context for reading the magnitude of nQKey, and KeySignContext is a context for reading a sign of nQKey.

decodeUnsignedAAC is a function used to perform an unsigned decoding process on adaptive-arithmetic-coded data, and decodeSignedAAC is a function used to perform a signed decoding process on adaptive-arithmetic-coded data.

FIG. 28J is a diagram illustrating a class PosIKeyValue. Referring to FIG. 28J, among variables stored in class PosIKeyValue, keyValue_X, keyValue_Y, and keyValue_Z represent an array of the key value data of each of the x, y, and z components, respectively, in a position interpolator. If nStartIndex_X is set to 0, keyValue_X[0] is decoded from a bitstream using an arithmetic decoder. In the same manner, keyValue_Y[0] and keyValue_Z[0] are determined. When arithmetically decoding keyValue_X[0], keyValue_Y[0], and keyValue_Z[0] from the bitstream, a decodeUnaryAAC or decodeSQAAC function is used.

Context models kVXSignContext, kVYSignContext, and kVZSignContext are used to decode the signs of keyValue_X, keyValue_Y, and keyValue_Z, respectively. The context models kVXSignContext, kVYSignContext, and kVZSignContext are transmitted to the decodeUnaryAAC or decodeSQAAC function.

MaxValueContext, FoundContext, and NotFoundContext are used to entropy-decode the absolute values of key values. For example, kVXMaxValueContext, kVXFoundContext, and kVXNotFoundContext are used to decode keyValue_X. MaxValueContext, FoundContext, and NotFoundContext are transmitted to the decodeUnaryAAC or decodeSQAAC function.

Context models kVXUContext, kVYUContext, and kVZUContext are used to decode keyValue_X, keyValue_Y, and keyValue_Z and are transmitted to the decodeUnaryAAC function.

The present invention can be realized as computer-readable codes written on a computer-readable recording medium. Here, the computer readable recording medium includes any kind of recording medium which can be read by a computer system. For example, the computer-readable recording medium includes a ROM, a RAM, a CD-ROM, a magnetic tape, a floppy disk, and an optical data storage. The computer-readable recording medium can be decentralized to computer systems connected over network, and a computer can read the recording medium in a decentralized way.

According to the method and the apparatus for encoding a position interpolator of the present embodiment, it is possible to encode and decode key data and key value data with a higher efficiency while maintaining high quality animation. In addition, it is possible to maintain high quality animation data by using a method of measuring an error between animation paths. Moreover, it is possible to considerably reduce the amount of key data and key value data to be encoded by using a resampling method and a break point extraction method of the present embodiment.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for encoding a position interpolator, which includes key data indicating the locations of keyframes on a temporal axis and key value data indicating the location of an object, the apparatus comprising:
- a break point extractor which extracts, from a first animation path constituted by a position interpolator input thereinto, a minimum number of break points that can bring about an error of no greater than a predetermined allowable error limit between the first animation path and a second animation path to be generated by the extracted break points and outputs key data and key value data corresponding to the second animation path;
- a key data encoder which encodes key data input from the break point extractor; and
- a key value data encoder which encodes key value data input from the break point extractor.

2. The apparatus of claim 1, wherein the break point extractor comprises:
- a linear interpolator which extracts a beginning path point and an ending path point of an input animation path, selects path points between the beginning and ending path points, and interpolates other path points, which still have not yet been selected, using the selected path point and extracted path points;
- an error calculator which calculates an error between the input animation path and an interpolated animation path generated by the linear interpolator using interpolation; and
- a determining unit which extracts break points, by which an error between the input animation path and the interpolated animation path can be minimized, and outputs the extracted break points if the corresponding error is not greater than a predetermined allowable error limit.

3. The apparatus of claim 2, wherein if the error corresponding to the extracted break points is greater than the predetermined allowable error limit, the determining unit outputs the extracted break points to the linear interpolator, and then the linear interpolator performs interpolation by selecting path points other than the extracted break points input from the determining unit.

4. The apparatus of claim 2, wherein the error calculator divides the input animation path and the interpolated animation path into a predetermined number of sections based on one reference component constituting path points of the two animation paths and calculates an error between the input animation path and the interpolated animation path in each of the sections by measuring an area between the input animation path and the interpolated animation path in each of the sections.

5. The apparatus of claim 2, wherein the error calculator measures an area between the input animation path and the interpolated animation path in consideration of a distance between key data indicated by path points and a distance between key value data respectively corresponding to the key data.

6. The apparatus of claim 1 further comprising:
- a resampler which samples the first animation path into a predetermined number of sections having an interval of a predetermined amount of time and outputs a position interpolator including resampled key data and resampled key value data; and
- a selector which outputs a position interpolator input thereinto to the resampler or the break point extractor depending on an external input signal.

7. The apparatus of claim 6, wherein the break point extractor comprises:
- a linear interpolator which extracts a beginning path point and an ending path point of an input animation path, selects path points between the beginning and ending path points, and interpolates other path points, which still have not yet been selected, using the selected path point and extracted path points;
- an error calculator which calculates an error between the input animation path and an interpolated animation path generated by the linear interpolator using interpolation; and
- a determining unit which extracts break points, by which an error between the input animation path and the interpolated animation path can be minimized, outputs the extracted break points if the corresponding error is not greater than a predetermined allowable error limit.

8. The apparatus of claim 6, wherein the resampler divides an animation path constituted by key data and key value data of a position interpolator into a predetermined number of sections having an interval of a predetermined amount of time, outputs end points of each of the sections as key data to be encoded, and outputs key value data existing on the animation path in each of the sections as key value data to be encoded.

9. The apparatus of claim 1 further comprising a resampler which samples the first animation path into a predetermined number of sections having an interval of a predetermined amount of time and outputs a position interpolator including resampled key data and resampled key value data,
wherein the break point extractor extracts break points from an animation path constituted by a position interpolator input from the resampler.

10. The apparatus of claim 9, wherein the break point extractor comprises:
- a linear interpolator which extracts a beginning path point and an ending path point of an input animation path, selects path points between the beginning and ending path points, and interpolates other path points, which still have not yet been selected, using the selected path point and extracted path points;
- an error calculator which calculates an error between the input animation path and an interpolated animation path generated by the linear interpolator using interpolation; and
- a determining unit which extracts break points, by which an error between the input animation path and the interpolated animation path can be minimized, and outputs the extracted break points if the corresponding error is not greater than a predetermined allowable error limit.

11. The apparatus of claim 9, wherein the resampler divides an animation path constituted by key data and key value data of a position interpolator into a predetermined number of sections having an interval of a predetermined amount of time, outputs end points of each of the sections as key data to be encoded, and outputs key value data existing on the animation path in each of the sections as key value data to be encoded.

12. The apparatus of claim 1 further comprising a resampler which samples an animation path constituted by a position interpolator extracted from the break point extractor into a predetermined number of sections having an interval of a predetermined amount of time and outputs a position interpolator including resampled key data and resampled key value data to the key data encoder and the key value data encoder.

13. The apparatus of claim 12, wherein the break point extractor comprises:
- a linear interpolator which extracts a beginning path point and an ending path point of an input animation path, selects path points between the beginning and ending path points, and interpolates other path points, which still have not yet been selected, using the selected path point and extracted path points;
- an error calculator which calculates an error between the input animation path and an interpolated animation path generated by the linear interpolator using interpolation; and
- a determining unit which extracts break points, by which an error between the input animation path and the interpolated animation path can be minimized, checks if the corresponding error is not greater than a predetermined allowable error limit, and outputs the extracted break points.

14. The apparatus of claim 13, wherein the resampler divides an animation path constituted by key data and key value data of a position interpolator into a predetermined number of sections having an interval of a predetermined amount of time, outputs end points of each of the sections as key data to be encoded, and outputs key value data existing on the animation path in each of the sections as key value data to be encoded.

15. The apparatus of claim 1, wherein the key data encoder comprises:
- a quantizer which quantizes input differential data with quantization bits;
- a DPCM processor which generates differential data of the quantized key data;
- a shifter which obtains a differential datum (mode) having the highest frequency among the differential data and subtracts the mode from each of the differential data;
- a folding processor which converts the differential data into a positive number region or a negative number region;
- a DND processor which in consideration of the relationship between the converted differential data and maximum and minimum values among them, performs a DND operation on the converted differential data so as to reduce their range, selects one out of the differential data input from the shifter, the differential data input from the folding processor, and the differential data having been through the DND operation, and outputs the selected differential data; and
- an entropy encoder which entropy-encodes the differential data input from the DND processor.

16. The apparatus of claim 1, wherein the key value data encoder comprises:
- a quantizer which quantizes data input thereinto, with predetermined quantization bits;
- a DPCM processor which obtains differential data and predicted differential data of the quantized data and performs a circular quantization operation on the differential data so as to output differential data having a reduced size; and
- an entropy encoder which entropy-encodes the differential data input from the DPCM processor.

17. An apparatus for encoding a position interpolator, which includes key data indicating the locations of keyframes on a temporal axis and key value data indicating the location of an object, the apparatus comprising:
- a resampler which samples an animation path constituted by key data and key value data into a predetermined number of sections having an interval of a predetermined amount of time and outputs a position interpolator including resampled key data and resampled key value data;
- a key data encoder which encodes key data input from the resampler; and
- a key value data encoder which encodes key value data input from the resampler, wherein the key value data encoder comprises:
- a quantizer which quantizes data input thereinto, with predetermined quantization bits;
- a DPCM processor which obtains differential data and predicted differential data of the quantized data and performs a circular quantization operation on the differential data so as to output differential data having a reduced size; and
- an entropy encoder which entropy-encodes the differential data input from the DPCM processor.

18. The apparatus of claim 17, wherein the resampler divides an animation path constituted by key data and key value data of a position interpolator into a predetermined number of sections having an interval of a predetermined amount of time, outputs end points of each of the sections as key data to be encoded, and outputs key value data existing on the animation path in each of the sections as key value data to be encoded.

19. An apparatus for decoding a bitstream, into which a position interpolator, including key data indicating the locations of keyframes on a temporal axis and key value data indicating the location of an object, is encoded, the apparatus comprising:
- a key data decoder which decodes key data from an input bitstream;
- a key value data decoder which decodes key value data from the input bitstream; and
- a position interpolator synthesizer which generates a position interpolator by synthesizing decoded key value data and key value data linearly interpolated using the decoded key value data.

20. The apparatus of claim 19, wherein if there is no decoded key value data corresponding to key data currently being subjected to position interpolator synthesization, the position interpolator synthesizer interpolates key value data corresponding to the key data currently being subjected to position interpolator synthesization using decoded key value data corresponding to previously synthesized key data and decoded key value data corresponding to key data to be synthesized next.

21. The apparatus of claim 19, wherein the key data decoder comprises:
- an entropy decoder which generates differential data by entropy-decoding the input bitstream;
- an inverse DPCM processor which generates quantized key data by performing a predetermined inverse DPCM operation on the differential data; and
- an inverse quantizer which generates retrieved key data by inverse-quantizing the quantized key data.

22. The apparatus of claim 19, wherein the key value data decoder comprises:
- an entropy decoder which generates differential data by entropy-decoding the input bitstream;
- an inverse DPCM processor which generates quantized key data by performing a predetermined inverse DPCM operation on the differential data; and
- an inverse quantizer which generates retrieved key value data by inverse-quantizing the quantized key value data.

23. A method for encoding a position interpolator, which includes key data indicating the locations of keyframes on a temporal axis and key value data indicating the location of an object, the method comprising:

(b) generating key data and key value data, using a processor, to be encoded by extracting, from a first animation path constituted by the position interpolator, a minimum number of break points, which can bring about an error of no greater than a predetermined allowable error limit between the first animation path and a second animation to be generated by the extracted break points;

(d) encoding the key data generated in step (b); and
(e) encoding the key value data generated in step (b).

24. The method of claim 23, wherein step (b) comprises:
(b1) extracting a beginning path point and an ending path point of the first animation path;
(b2) selecting path points between the beginning and ending path points and interpolating other path points, which still have not yet been extracted, using the selected path point and extracted path points;
(b3) calculating an error between the first animation path and a second animation path generated by interpolation in step (b2); and
(b4) extracting break points, by which an error between the first animation path and the second animation path can be minimized, and determining key data and key value data to be encoded if the corresponding error is not greater than a predetermined allowable error limit.

25. The method of claim 24, wherein in step (b3), the first animation path and the second animation path are each divided into a predetermined number of sections based on one reference component constituting path points of the first and second animation paths, and an error between the first animation path and the second animation path in each of the sections is calculated by measuring an area between the first animation path and the second animation path in each of the sections.

26. The method of claim 25, wherein in step (b3), the area between the first animation path and the second animation path is measured in consideration of a distance between key data indicated by path points and a distance between key value data respectively corresponding to the key data.

27. The method of claim 25, wherein in step (b4), if the error corresponding to the extracted break points is greater than the predetermined allowable error limit, steps (b2) through (b4) are performed again.

28. The method of claim 23 further comprising (a) generating a position interpolator including resampled key data and resampled key value data by sampling the first animation path into a predetermined number of sections having an interval of a predetermined amount of time, before step (b),
wherein in step (b), break points are extracted from an animation path constituted by the position interpolator generated in step (a).

29. The method of claim 28, wherein in step (a), the first animation path is divided into a predetermined number of sections having an interval of a predetermined amount of time, end points of each of the sections are set up as the sampled key data, and key value data existing on the first animation path in each of the sections are set up as the sampled key value data.

30. The method of claim 23 further comprising (c) generating key data and key value data to be encoded by sampling the second animation path constituted using the extracted break points into a predetermined number of sections having an interval of a predetermined number of time after step (b).

31. The method of claim 30, wherein in step (c), the second animation path is divided into a predetermined number of sections having an interval of a predetermined amount of time, end points of each of the sections are set up as the key data to be encoded, and key value data existing on the first animation path in each of the sections are set up as the key value data to be encoded.

32. The method of claim 23, wherein step (d) comprises:
quantizing the key data with a predetermined number of quantization bits;
generating differential data by performing a predetermined DPCM operation on quantized data; and
entropy-encoding the differential data.

33. The method of claim 23, wherein step (e) comprises:
quantizing the key value data with a predetermined number of quantization bits;
generating differential data by performing a predetermined DPCM operation on quantized key value data; and
entropy-encoding the differential data.

34. A method for encoding a position interpolator, which includes key data indicating the locations of keyframes on a temporal axis and key value data indicating the location of an object, the method comprising:

(b) sampling an animation path constituted by the position interpolator into a predetermined number of sections having an interval of a predetermined amount of time and thus generating a position interpolator including resampled key data and resampled key value data;
(d) encoding the key data generated in step (b); and
(e) encoding the key value data generated in step (b),
wherein step (e) comprises:
quantizing the key value data generated in step (b), using predetermined quantization bits;
obtaining differential data and predicted differential data of quantized data and generating differential data having a reduced size by performing a circular quantization operation on the differential data; and
entropy-encoding the differential data having a reduced size.

35. The method of claim 34, wherein in step (b), the animation path is divided into a predetermined number of sections having an interval of a predetermined amount of time, end points of each of the sections are set up as the sampled key data, and key value data existing on the first animation path in each of the sections are set up as the sampled key value data.

36. A computer-readable recording medium where computer-readable program codes, by which the method of claim 23 is realized, are recorded.

37. A computer-readable recording medium where computer-readable program codes, by which the method of claim 24 is realized, are recorded.

38. A computer-readable recording medium where computer-readable program codes, by which the method of claim 28 is realized, are recorded.

39. A computer-readable recording medium where computer-readable program codes, by which the method of claim 30 is realized, are recorded.

40. A computer-readable recording medium where computer-readable program codes, by which the method of claim 34 is realized, are recorded.

41. A method for decoding a bitstream, into which a position interpolator, including key data indicating the locations of keyframes on a temporal axis and key value data indicating the location of an object, is encoded, the method comprising:
(a) decoding key data from an input bitstream;
(b) decoding key value data from the input bitstream; and
(c) generating a position interpolator by synthesizing decoded key value data and key value data linearly interpolated using the decoded key value data with decoded key data.

42. The method of claim 41, wherein in step (c), if there is no decoded key value data corresponding to key data currently being subjected to position interpolator synthesization, key value data corresponding to the key data currently being subjected to position interpolator synthesization are interpolated using decoded key value data corresponding to previously synthesized key data and decoded key value data corresponding to key data to be synthesized next.

43. The method of claim 41, wherein step (a) comprises:
generating differential data by entropy-decoding the input bitstream;
generating quantized key data by performing a predetermined DPCM operation and an inverse DND operation on the differential data; and
generating retrieved key data by inverse-quantizing the quantized key data.

44. The method of claim 41, wherein step (b) comprises:
generating differential data by entropy-decoding the input bitstream;
generating quantized key value data by performing a predetermined inverse DPCM operation on the differential data; and
generating retrieved key value data by inverse-quantizing the quantized key value data.

45. A computer-readable recording medium where computer-readable program codes, by which the method of claim 41 is realized, are recorded.

46. A computer-readable recording medium where computer-readable program codes, by which the method of claim 42 is realized, are recorded.

47. A computer-readable recording medium where computer-readable program codes, by which the method of claim 43 is realized, are recorded.

48. A computer-readable recording medium where computer-readable program codes, by which the method of claim 44 is realized, are recorded.

49. A method of calculating an error between a first path constituted by a plurality of first path points each consisting of a plurality of data components and a second path constituted by a plurality of second path points each consisting of a plurality of data components, the method comprising:
(a) interpolating path points, using a processor, into the first and second animation paths so that the first and second animation paths have the same path points in terms of reference data component included in each of the path points;
(b) dividing each of the first and second paths into a predetermined number of sections in consideration of the reference data component so that the predetermined number of sections respectively correspond to the path points;
(c) calculating an error between the first and second animation paths in each of the sections; and
(d) checking if step (c) has been performed on all the predetermined number of sections and then normalizing the errors obtained in step (c).

50. The method of claim 49, wherein the reference component data are key data included in a position interpolator node, and in step (c), an error between the first and second animation paths in each of the sections is calculated using an area of a trapezoid formed by setting up the distance between the key data as a height of the trapezoid and setting up the distance between the other component data as an upper side and a lower side of the trapezoid.

51. The method of claim 49, wherein in step (d), extreme values of the reference component data of the path points are obtained, and then the errors obtained in step (c) are normalized using the extreme values.

52. A computer-readable recording medium where computer-readable program codes, by which the method of claim 49 is realized, are recorded.

53. A method of extracting break points from a path constituted by path points including a plurality of component data by using linear approximation, the method comprising:
(a) extracting a beginning point and an ending point of an original path;
(b) selecting one out of non-extracted path points and linearly interpolating the other non-selected path points using the selected path point and extracted path points;
(c) calculating an error, using a processor, between the original path and an interpolated animation path generated using the interpolated path points;
(d) performing steps (b) and (c) on all the non-selected path points and extracting a path point leading to a minimum error between the original animation path and the interpolated path; and
(e) comparing an error between the original path and a path generated using all the extracted path points including the path points extracted in step (d) with a predetermined allowable error limit, and then repeatedly performing steps (b) through (d).

54. The method of claim 53, wherein the path points correspond to a position interpolator representing three-dimensional animation, the reference component data correspond to key data included in a position interpolator node, and in step (c), an error between the original animation path and the interpolated animation path in each of the sections is calculated using an area of a trapezoid formed by setting up the distance between the key data as a height of the trapezoid and setting up the distance between the other component data as an upper side and a lower side of the trapezoid, respectively.

55. The method of claim 53, wherein the path points correspond to a position interpolator representing three-dimensional animation, the reference component data correspond to key data indicating the locations of keyframes on a temporal axis, and the other component data correspond to key value data indicating the location of an object in animation.

56. A computer-readable recording medium where computer-readable program codes, by which the method of claim 53 is realized, are recorded.

57. A computer-readable recording medium where computer-readable program codes, by which the method of claim 54 is realized, are recorded.

58. A method of extracting break points from an animation path constituted by path points including the locations of a plurality of keyframes on a temporal axis and the location of an object in each of the keyframes by using linear approximation, the method comprising:
(a) extracting a keyframe corresponding to a beginning point and an ending point of an original animation path;
(b) selecting one out of non-extracted keyframes and linearly interpolating other keyframes using the selected keyframe and extracted keyframes;
(c) calculating an error, using a processor, between the original animation path and an interpolated animation path generated using the interpolated keyframes;
(d) performing steps (b) and (c) on all the non-selected keyframes and then extracting a keyframe leading to a minimum error between the original animation path and the interpolated animation path; and
(e) comparing an error between the original animation path and an animation path generated using path points corresponding to the keyframes selected in step (d) with a predetermined allowable error limit and then repeatedly performing steps (b) through (d).

59. The method of claim 58, wherein step (c) comprises:
(c1) dividing the original animation path and the interpolated animation path into a predetermined number of sections so that the predetermined number of sections respectively correspond to the keyframes; and
(c2) calculating an error between the original animation path and the interpolated animation path using an interval between the keyframes dividing each of the animation paths and a difference between pieces of information on the location of the object in keyframes.

60. The method of claim 59, wherein in step (c2), an error between the original animation path and the interpolated animation path in each of the sections is calculated by setting up the interval between the keyframes dividing each of the animation paths as a height of a trapezoid and setting up a difference between pieces of information on the location of the object in keyframes as an upper side and a lower side of a trapezoid, respectively.

61. A bitstream embodied in a tangible computer readable media, into which a position interpolator, including key data indicating the locations of keyframes on a temporal axis and key value data indicating the location of an object, is encoded, the bitstream comprising:
key data encoding/decoding information necessary to encode/decode key data; and
key value data encoding/decoding information necessary to encode/decode key value data,
wherein the key data encoding/decoding information comprises:
inverse DND operation information comprising the order of inverse DND indicating a predetermined number of cycles of inverse DND to be performed on differential data generated by entropy-decoding the bitstream in order to extend the range of the differential data and maximum and minimum values among differential data used in each cycle of inverse DND operation;
first inverse DPCM operation information comprising the order of inverse DPCM operation to be performed on the inverse-DNDed differential data so as to convert the inverse-DNDed differential data into quantized key data and intra key data which are used for each cycle of inverse DPCM operation; and
first inverse quantization information used in inverse quantization to generate retrieved key data by inverse-quantizing the quantized key data, and
the key value data encoding/decoding information comprises:
entropy-decoding information comprising a flag indicating an entropy-decoding operation to be performed to generate second differential data by entropy-decoding key value data from the bitstream;
second inverse DPCM operation information comprising information on an inverse DPCM operation to be performed on the differential data so as to convert the second differential data into quantized key value data and intra key value data in each cycle of inverse DPCM operation;
second inverse quantization information comprising a predetermined number of inverse quantization bits used to retrieve original key value data by inverse-quantizing the quantized key value data; and
inverse normalization information used to inversely normalize the retrieved key value data which are retrieved by inverse quantization using the inverse quantization bits, the inverse normalization information comprising a flag indicating a component having a maximum key value data range, a maximum value in the maximum key value data range, and minimum values among the key value data of each of the components.

62. The bitstream of claim 61, wherein the inverse DND operation information further comprises a flag indicating whether or not a shift-down operation will be performed on differential data to be subjected to inverse DND operation.

63. The bitstream of claim 61, wherein the first quantization information comprises a size of inverse quantization bits used to inverse-quantize the quantized key data and maximum and minimum values among the quantized key data.

64. The bitstream of claim 63, wherein the maximum and minimum values among the quantized key data are used to minimize a quantization error of the quantized key data.

65. The bitstream of claim 61, wherein the key data encoding/decoding information further comprises linear key decoding information used to decode a linear key region where key data linearly increase in the bitstream, and the linear key decoding information comprises a flag indicating whether or not the linear key region exists in an entire key data range, the number of key data included in the linear key region, and beginning and ending key data of the linear key region.

66. The bitstream of claim 61, wherein the key value data encoding/decoding information further comprises the number of encoded key value data included in the bitstream and a maximum number of digits of key value data.

67. The bitstream of claim 61, wherein the second inverse quantization information comprises minimum values among the key value data of each of the components, which are used to minimize a quantization error of the quantized key value data.

68. A method of decoding a bitstream into which a position interpolator is encoded, the position interpolator comprising a key header containing information regarding key data, a key value header containing information regarding key value data, a plurality of key selection flags indicating whether corresponding respective keyframes are chosen, key data indicating the locations of the keyframes on a temporal axis, and key value data indicating the location of an object on each of the keyframes, the method comprising:
reading the key header and the key value header and decoding a number of key selection flags keyFlag corresponding to a number indicated by key data number information nNumberOfKey included in the key header if a preserve key bit bPreserveKey included in the key value header is set to 1;
decoding the key data with reference to the key header; and
reading the key value data and decoding the key value data with reference to the key selection flag and the key value header, the key value header comprising information specifying the orders of inverse normalization, inverse quantization, and inverse circular differential pulse code modulation (DPCM), and entropy decoder type information specifying the type of an entropy decoder needed to be used decode the key value data.

69. The method of claim 68, wherein the key header comprises:
quantization bit size information nKeyQBit;
the key data number information nNumberOfKey specifying a number of key data to be decoded;
key data digit number information nKeyDigit indicating a number of digits of the key data;
a linear key flag bIsLinearKeySubRegion indicating whether a linear key sub-region region where key data linearly increases exits;

beginning key data and ending key data IKey indicating the beginning and ending, respectively, of the linear key sub-region when the linear key flag IsLinearKeySubRegion is set to 1 and thus indicates that the linear key sub-region exists;

a quantization error adjustment flag bRangeFlag indicating whether a maximum and minimum of the key data has been adjusted to minimize a quantization error;

adjusted maximum and minimum key data keyMinMax adjusted to be able to be used in inverse quantization if the quantization error adjustment flag bRangeFlag is set to 1;

DPCM order information nKDCPMOrder specifying the order of a DPCM operation;

reference key data number information nQIntraKey indicating a number of reference key data which is referenced in a DPCM operation and corresponds to the DPCM order information nKDPCMOrder;

sign bit number information nQIntraKeySign indicating a number of bits representing the sign of the reference key data number information nQIntraKey;

a shift flag bShiftFlag used to indicate whether the entire key data has been shifted as a result of a DPCM operation, with reference to the key datum appearing most frequently;

a shift value nKeyShift indicating the degree to which the key data has been shifted;

sign bit number information nKeyShiftSign indicating a number of bits representing the sign of the shift value nKeyShift;

divide-and-divide (DND) order information nDNDOrder specifying the order of a DND operation for adjusting a range of DPCMed results;

maximum/minimum key data number information nKeyMax specifying a maximum/minimum number of key data used in a DND operation which corresponds to a number indicated by the DND order information nDNDOrder;

sign bit number information nKeyMaxSign indicating a number of bits representing the sign of the maximum or minimum key data number information nKeyMax;

an invert-down flag bKeyInvertDownFlag indicating whether DNDed results have been inverted down;

a invert-down value nKeyInvertDown indicating the degree to which the DNDed results have been inverted down; and a flag bSignedAACFlag indicating whether a signed AAC operation or an unsigned AAC operation has been performed in an entropy encoding operation.

70. The method of claim 68, wherein the decoding of the key data comprises:

performing an entropy decoding operation by performing an inverse signed AAC operation, if the flag bSignedAACFlag indicates that a signed AAC operation has been performed in the process of performing an entropy encoding operation, and performing an inverse unsigned AAC operation, if the flag bSignedAACFlag indicates that an unsigned AAC operation has been performed in the process of performing the entropy encoding operation;

adding reference key data IntraKey to entropy-decoded results;

performing an inverse DND operation if the DND order information nDNDOrder is set to 1 or greater;

performing an inverse shifting operation on inverse-DNDed results by as many bits as the shift value nKeyShift;

performing an inverse DPCM operation on the inverse-shifted results as many times as a number indicated by the DPCM order information nKDPCMOrder;

performing an inverse quantization operation on the inverse-DPCMed results according to the quantization bit size information nKeyQBit, wherein, if there are maximum and minimum key data adjusted to be capable of minimizing a quantization error included in the key header, the inverse quantization operation is performed on the inverse-DPCMed results using the maximum and minimum key data; and if the linear key sub-region exists, decoding linear key data using the beginning and ending key data IKey included in the key header and adding the decoded results to the inverse-quantized results.

71. The method of claim 70, wherein the performing of the inverse DND operation comprises:

deciding not to perform an invert-down operation if the DND order information nDNDOrder is set to 1 or greater and the invert-down value nKeyInvertDown is set to −1 and deciding to perform the invert-down operation otherwise, the invert-down operation being an inverse operation of a shift-up operation;

performing an inverse DND operation as many times as a number indicated by the DND order information nDNDOrder, wherein if the DND order maximum/minimum information nKeyMax is set to a positive value, performing an inverse divide-down operation, and if the DND order maximum/minimum information nKeyMax is set to a negative value, performing an inverse divide-up operation, and for the final iteration of the DND operation, performing an inverse divide operation; and performing an inverse folding operation unless the DND order information nDNDOrder is set to −1.

72. The method of claim 68, wherein the decoding of the key value data comprises decoding a plurality of key values each represented as x, y, and z coordinates in such a manner that the x, y, and z coordinates of each of the key values can be decoded separately from one another.

73. The method of claim 68, wherein the key value header comprises:

quantization bit number information nKVQBit specifying a number of quantization bits;

first, second, and third key value flags x_keyvalue_flag, y_keyvalue_flag, and z_keyvalue_flag indicating whether the x, y, and z coordinates, respectively, of each of the key values have been decoded;

digit information nKVDigit indicating a number of digits required for reading maximum and minimum key values KeyValueMinMax required for inverse quantization;

a bit indicating whether the first key value has been entropy-decoded;

the first key value; and maximum and minimum values KeyValueMinMax required for inverse quantization.

74. The method of claim 73, wherein the reading of the key value header comprises reading maximum and minimum key values for inverse normalization and inverse quantization, wherein the reading of the maximum and minimum key values for inverse normalization and inverse quantization comprises:

reading a bit indicating whether the maximum and minimum key values for inverse normalization and inverse quantization are represented as floating point numbers; and if the maximum and minimum key values for inverse normalization and inverse quantization are not represented as floating-point numbers, reading the mantissa and exponent of a minimum of the x coordinates of the key values, the mantissa and exponent of a minimum of the z coordinate of the key values, and the mantissa and exponent of a maximum among offsets between the minimum x coordinate and a maximum of the x coordinates of the key values, between the minimum y coordinate and a maximum of the y coordinates of the key values, and between the minimum z coordinate and a maximum of the z coordinates of the key values according to the digit information nKVDigit.

75. The method of claim 73, wherein the decoding of the key value data comprises: performing an entropy decoding operation on each of the x, y, and z coordinates of each of the key values using an entropy decoder chosen with reference to the entropy decoder type information if the first, second, and third key value flags x_keyvalue_flag, y_keyvalue_flag, and z_keyvalue_flag indicate that the key values are yet to be decoded; and generating a decoded value for each of the x, y, and z coordinates of the respective key values according to the minimums for inverse quantization that correspond to the x, y, and z coordinates, respectively.

76. The method of claim 75, wherein the performing of the entropy encoding operation comprises:

performing an entropy decoding operation on each of the x, y, and z coordinates of each of the key values using either a unary AAC or SQAAC entropy decoder according to the entropy decoder type information;

performing a first-order inverse circular DPCM operation or a second-order inverse circular DPCM operation on entropy-decoded results according to DPCM order information; and performing an inverse quantization operation and an inverse normalization operation on the inverse-DPCMed results using the maximum of the offsets between the minimum x coordinate and the maximum x coordinate, between the minimum y coordinate and the maximum y coordinate, and between the minimum z coordinate and the maximum z coordinate.

77. The method of claim 68, wherein the decoding of the key value data further comprises retrieving a current keyframe through interpolation based on a previous keyframe and a subsequent keyframe.

78. A method of encoding a position interpolator into a bitstream, the position interpolator comprising a key header containing information regarding key data, a key value header containing information regarding key value data, a plurality of key selection flags indicating whether corresponding respective keyframes are chosen, key data indicating the locations of the keyframes on a temporal axis, and key value data indicating the location of an object on each of the keyframes, the method comprising:

generating a key header, using a processor, comprising a preserve key bit and keyframe number information numberOfkey indicating a total number of keyframes;

generating a key value header;

generating a key selection flag with reference to the preserve key bit and the keyframe number information numberOfkey included in the key header;

generating key data with reference to the key header and encoding the key data; and generating key value data with reference to the key selection flag and the key value header and encoding the key value data with reference to the key value header, the key value header comprising information specifying the orders of normalization, quantization, and DPCM and entropy encoder type information specifying the type of an entropy encoder used to encode the key value data.

* * * * *

UNITED STATES PATENT AND TRADEMARK OFFICE
CERTIFICATE OF CORRECTION

PATENT NO. : 7,733,345 B2  Page 1 of 1
APPLICATION NO. : 10/305164
DATED : June 8, 2010
INVENTOR(S) : Do-kyoon Kim et al.

It is certified that error appears in the above-identified patent and that said Letters Patent is hereby corrected as shown below:

Column 56, Line 24 delete "limit," and insert --limit--, therefor.

Column 58, Line 57 after "used" insert --to--.

Signed and Sealed this

Ninth Day of November, 2010

David J. Kappos
*Director of the United States Patent and Trademark Office*